US009350957B2

(12) United States Patent
Nishiyama

(10) Patent No.: US 9,350,957 B2
(45) Date of Patent: May 24, 2016

(54) PHOTOELECTRIC CONVERSION DEVICE AND IMAGE PICK-UP DEVICE

(71) Applicant: Rohm Co., Ltd., Kyoto (JP)

(72) Inventor: Hiroshi Nishiyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/549,666

(22) Filed: Nov. 21, 2014

(65) Prior Publication Data

US 2015/0097966 A1  Apr. 9, 2015

Related U.S. Application Data

(63) Continuation of application No. 13/262,853, filed as application No. PCT/JP2010/056173 on Apr. 5, 2010, now Pat. No. 8,901,541.

(30) Foreign Application Priority Data

| Apr. 7, 2009 | (JP) | 2009093139 |
| Apr. 7, 2009 | (JP) | 2009093143 |
| Apr. 20, 2009 | (JP) | 2009102254 |
| Apr. 20, 2009 | (JP) | 2009102255 |
| Apr. 20, 2009 | (JP) | 2009102256 |
| Apr. 20, 2009 | (JP) | 2009102257 |
| Apr. 20, 2009 | (JP) | 2009102258 |
| Jun. 30, 2009 | (JP) | 2009154493 |
| Nov. 6, 2009 | (JP) | 2009254775 |

(51) Int. Cl.
*H01L 29/49* (2006.01)
*H04N 9/04* (2006.01)
(Continued)

(52) U.S. Cl.
CPC .......... *H04N 9/045* (2013.01); *H01L 27/14609* (2013.01); *H01L 27/14621* (2013.01);
(Continued)

(58) Field of Classification Search
CPC ............ H01L 27/14609; H01L 27/14621; H01L 27/14632; H01L 27/14658
See application file for complete search history.

(56) References Cited

U.S. PATENT DOCUMENTS

| 5,528,043 A | 6/1996 | Spivey et al. |
| 5,724,152 A * | 3/1998 | Hayashi ................ G07D 7/12 347/241 |

(Continued)

FOREIGN PATENT DOCUMENTS

| EP | 2124256 | 11/2009 |
| JP | 06-151806 | 5/1994 |

(Continued)

OTHER PUBLICATIONS

Do et al., "Three-Dimensional Visualization of Ice Crystals in Frozen Materials by Near-Infrared Imaging Spectroscopy," Trans. of the JSRAE 22(2):185-191 (2005), (pp. 91-97) (2004).

(Continued)

*Primary Examiner* — Michael Shingleton
(74) *Attorney, Agent, or Firm* — Fish & Richardson P.C.

(57) ABSTRACT

A photoelectric conversion device includes a semiconductor substrate, an insulating layer provided on the semiconductor substrate, an electrode provided on the insulating layer, a photoelectric conversion film provided on the electrode for converting received light to charges, a line connected between the electrode and the semiconductor substrate, a first planar electrode provided in the insulating layer and connected to the electrode, and a second planar electrode provided in the insulating layer between the first planar electrode and the semiconductor substrate.

18 Claims, 58 Drawing Sheets

(51) Int. Cl.
*H04N 5/33* (2006.01)
*H04N 5/378* (2011.01)
*H04N 9/64* (2006.01)
*H01L 27/146* (2006.01)
*H01L 31/032* (2006.01)

(52) U.S. Cl.
CPC .... *H01L27/14623* (2013.01); *H01L 27/14632* (2013.01); *H01L 27/14658* (2013.01); *H04N 5/33* (2013.01); *H04N 5/378* (2013.01); *H04N 9/646* (2013.01); *H01L 27/14603* (2013.01); *H01L 27/14627* (2013.01); *H01L 27/14643* (2013.01); *H01L 27/14696* (2013.01); *H01L 31/0322* (2013.01)

(56) References Cited

U.S. PATENT DOCUMENTS

| | | | |
|---|---|---|---|
| 6,534,704 | B2 | 3/2003 | Hashimoto |
| 6,960,751 | B2 | 11/2005 | Hiyama et al. |
| 7,382,030 | B1 | 6/2008 | Ivanov et al. |
| 7,507,990 | B2 | 3/2009 | Suh et al. |
| 7,671,270 | B2 | 3/2010 | Fang |
| 8,173,475 | B2 | 5/2012 | Kawano |
| 8,225,742 | B2 | 7/2012 | Basol |
| 2001/0035911 | A1 | 11/2001 | Sato et al. |
| 2002/0134943 | A1 | 9/2002 | Izumi |
| 2004/0094721 | A1 | 5/2004 | Tokuda et al. |
| 2006/0158542 | A1 | 7/2006 | Mizuno et al. |
| 2010/0149569 | A1* | 6/2010 | Yoshida ............. G06K 9/00442 358/1.11 |
| 2010/0246994 | A1* | 9/2010 | Sawada ................. H04N 9/045 382/275 |

FOREIGN PATENT DOCUMENTS

| | | |
|---|---|---|
| JP | 2000-513443 | 10/2000 |
| JP | 2001-313384 | 11/2001 |
| JP | 2002-236054 | 8/2002 |
| JP | 2004-140309 | 5/2004 |
| JP | 2004-172377 | 6/2004 |
| JP | 2005-295336 | 10/2005 |
| JP | 2006-211630 | 8/2006 |
| JP | 2007-123721 | 5/2007 |
| JP | 2008-042714 | 2/2008 |
| WO | 2008/093834 | 8/2008 |

OTHER PUBLICATIONS

Takeda et al., "Measurement of Hemoglobin Concentration using the Noninvasive Peripheral Blood Vessel Monitoring Device with the Near-infrared Spectroscope Imaging Method," Annual Reports of School Health Sciences, Faculty of Medicine, Kyoto University, Health Science 2:9-13 (2005).
"Image Sensor Spectral Characteristics Table," ROHM Co., Ltd. (2009).
Astrim Su, "Venous Oxygenation Index (VOI) Measurement Principles".

* cited by examiner

FIG.13
(a)
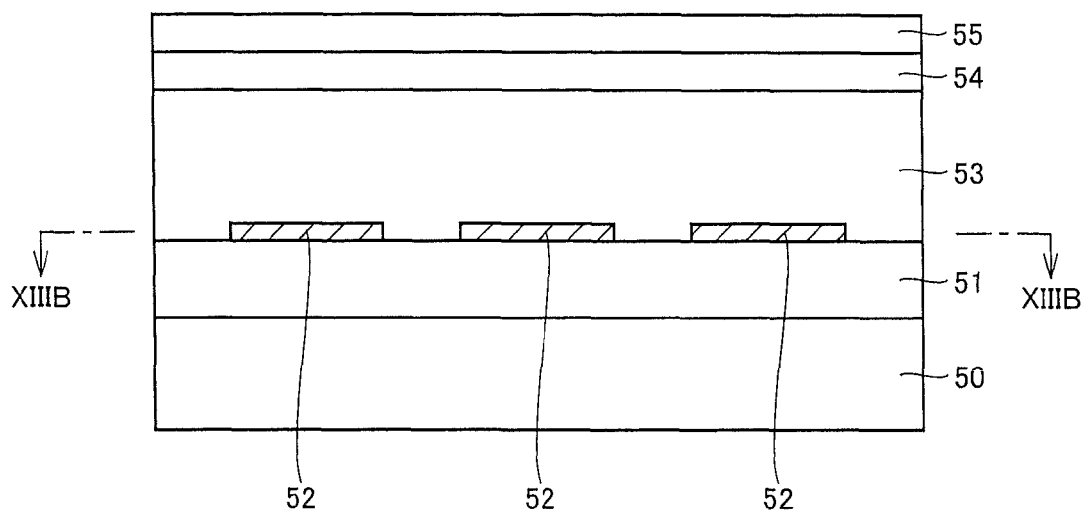
(b)
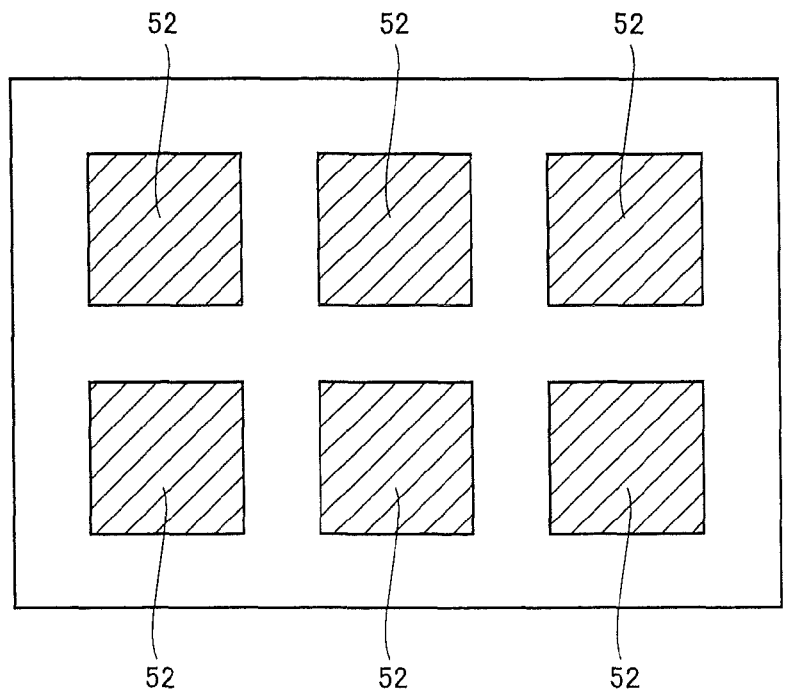

FIG.31
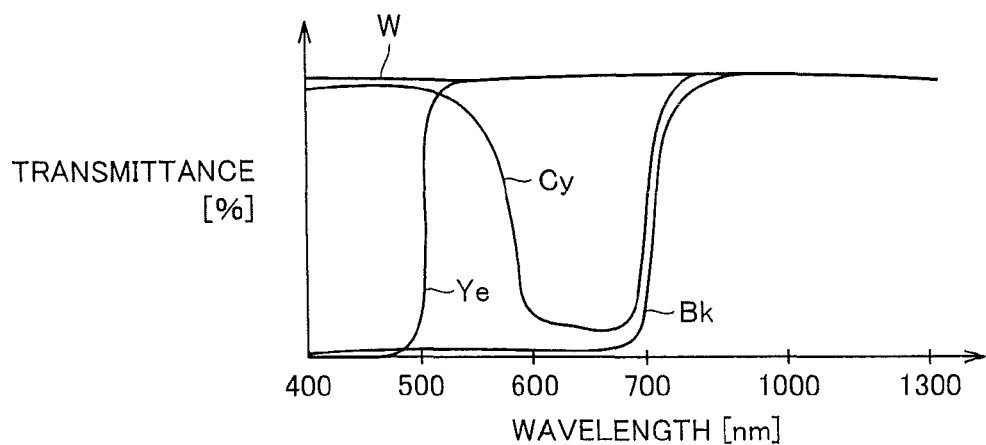
FIG.32
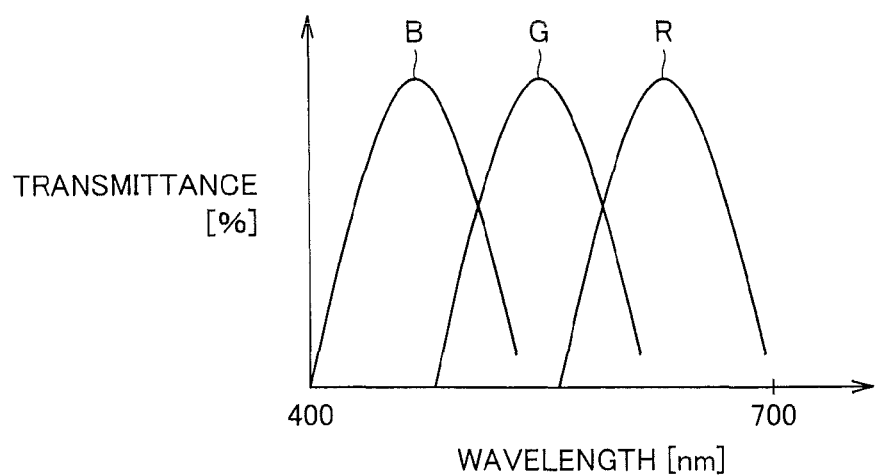
FIG.33

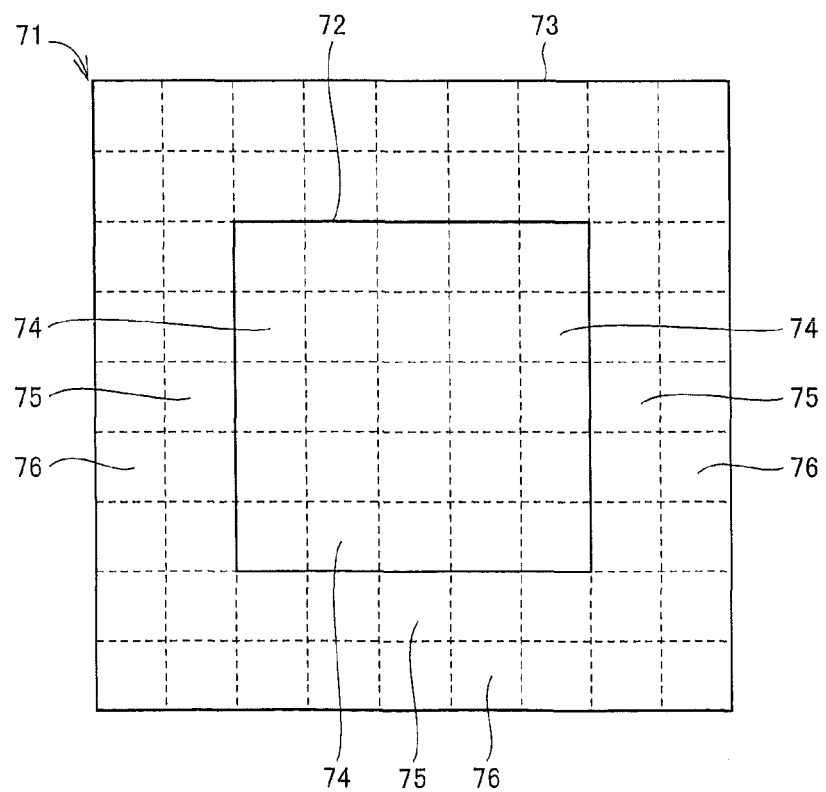

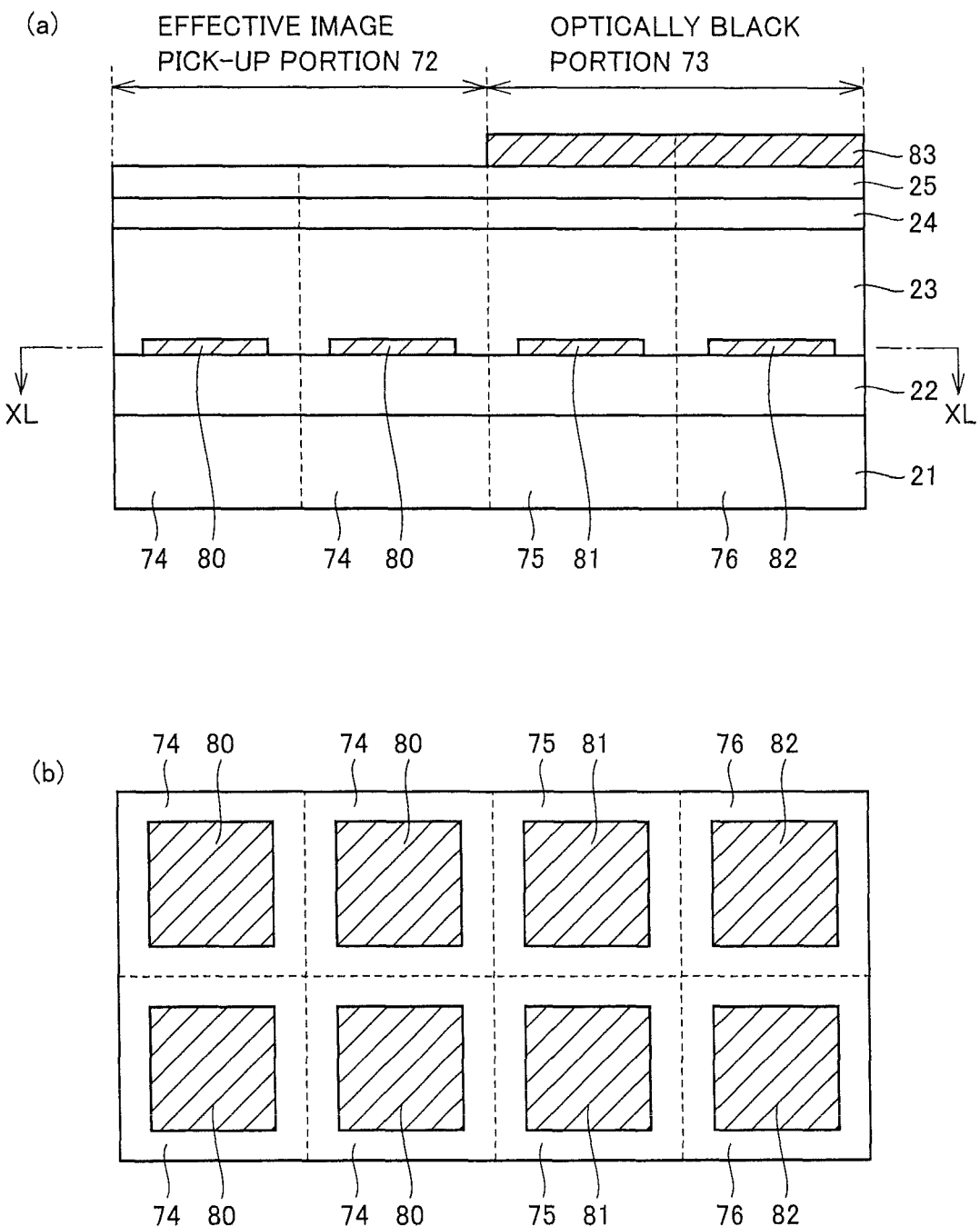

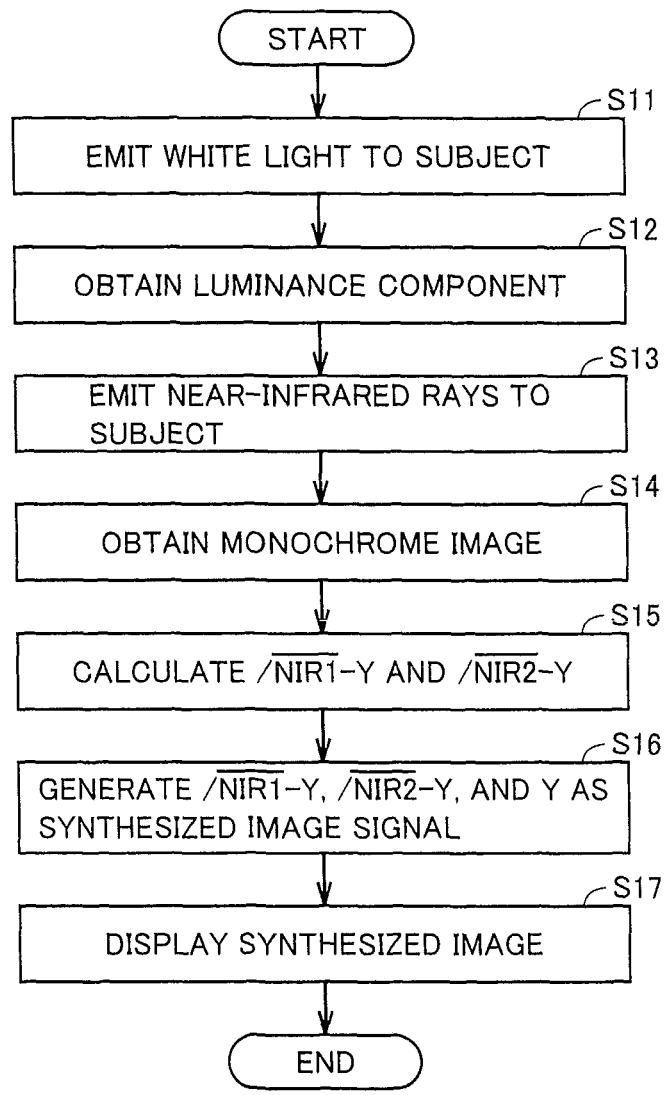

PHOTOELECTRIC CONVERSION DEVICE AND IMAGE PICK-UP DEVICE

TECHNICAL FIELD

The present invention relates to a photoelectric conversion device and an image pick-up device, and particularly to a photoelectric conversion device and an image pick-up device including a photoelectric conversion film.

BACKGROUND ART

In a solid-state image sensing element employed in a CMOS (Complementary Metal Oxide Semiconductor) image sensor or the like, for example, a photoelectric conversion portion is provided on a silicon substrate and light should pass through as far as a substrate surface. When light is incident on a transistor provided around the photoelectric conversion portion on the silicon substrate, however, an unnecessary current is generated and image quality may deteriorate.

As a technique for preventing disadvantages caused by incident light, for example, Japanese Patent Laying-Open No. 2004-140309 (PTL 1) discloses the following solid-state image sensing element. Namely, a photoelectric conversion element generating and storing charges at least in accordance with incident light and a charge transfer portion transferring signal charges generated and stored by the photoelectric conversion element are provided on a semiconductor substrate. Then, on the semiconductor substrate, a transfer electrode for the charge transfer portion and a light cut-off film including an opening corresponding to a light reception region of the photoelectric conversion element are provided, at least with a gate insulating film being interposed. In addition, a transparent insulating film is provided in a region on the gate insulating film corresponding to the light reception region of the photoelectric conversion element. The light cut-off film is embedded such that an inner circumferential shape of the opening thereof extends along an outer circumferential shape of the transparent insulating film and such that a bottom surface portion of the opening is in direct contact with the gate insulating film.

In addition, a plurality of pixel circuits arranged in a plurality of rows and a plurality of columns have conventionally been provided in an image sensor. Each pixel circuit includes a photoelectric conversion element outputting a current having a value in accordance with a quantity of incident light, a capacitor, a transfer transistor connected between the photoelectric conversion element and the capacitor, and an amplifier transistor generating a pixel signal at a level in accordance with a voltage across terminals of the capacitor.

A scheme for reading a pixel signal includes an XY address reading scheme for successively reading a plurality of pixel signals generated by a plurality of pixel circuits for each row while all pixel circuits are exposed to light and a global shutter scheme for successively reading a plurality of pixel signals generated by a plurality of pixel circuits for each row after all pixels circuits are collectively exposed to light for a prescribed period of time (see, for example, Japanese Patent Laying-Open No. 2008-42714 (PTL 2)).

Further, for example, Japanese Patent Laying-Open No. 2006-211630 (PTL 3) discloses the following configuration as a solid-state image sensing element employed for a CMOS image sensor. Namely, a pixel array portion in which pixels are diagonally aligned and an odd-numbered-row vertical signal line group is wired for each column of pixels in an odd-numbered row in the pixel alignment and an even-numbered-row vertical signal line group is wired for each column of pixels in an even-numbered row, row selection means for separately selecting an odd-numbered row in the pixel alignment above and selecting an even-numbered row therein, an odd-numbered-row column processing circuit group connected to the odd-numbered-row vertical signal line group and adding signals of pixels between columns, an even-numbered-row column processing circuit group connected to the even-numbered-row vertical signal line group and adding signals of pixels between columns, and column selection means for selecting each column processing circuit in the odd-numbered-row column processing circuit group and each column processing circuit in the even-numbered-row column processing circuit group are included.

Furthermore, an effective image pick-up portion and an optically black portion have conventionally been provided in an image sensor. A plurality of pixels are provided in the effective image pick-up portion, and each pixel includes a photodiode and a read circuit reading a photocurrent generated in the photodiode. The optically black portion is identical in configuration to the effective image pick-up portion and provided with a pixel covered with a light cut-off layer. A read circuit for the pixel in the optically black portion reads a dark current generated in the photodiode when there is no incident light. The photocurrent read from the pixel in the effective image pick-up portion is corrected based on the dark current read from the pixel in the optically black portion.

In order to eliminate difference in level between the dark current generated in the pixel in the effective image pick-up portion not covered with the light cut-off layer and the dark current generated in the pixel in the optically black portion covered with the light cut-off layer, a method of making characteristics of the photodiode in the effective image pick-up portion different from characteristics of the photodiode in the optically black portion is available (see, for example, Japanese Patent Laying-Open No. 6-151806 (PTL 4)).

In addition, an image sensor including a compound semiconductor such as $Cu(In_xGa_{(1-x)})Se_2$ ($0 \leq x \leq 1$) (hereinafter denoted as CIGS) has been developed in recent years. In a conventional first image sensor, a transparent electrode is formed on a surface of a CIGS thin film and a plurality of pixel electrodes are formed on a back surface of the CIGS thin film. When the CIGS thin film is irradiated with light, electron-hole pairs in an amount in accordance with a quantity of light are produced. Holes, that is, positive charges, of the electron-hole pairs produced in the CIGS thin film flow to the read circuit through the pixel electrode.

In a conventional second image sensor, a CIGS thin film is etched and separated into a plurality of CIGS layers. A transparent electrode is formed on a surface of each CIGS layer and a pixel electrode is formed on a back surface of each CIGS layer (see, for example, Japanese Patent Laying-Open No. 2007-123721 (PTL 5)).

Moreover, NPL 1, NPL 2 and NPL 4 disclose techniques for displaying various objects to be measured on a screen. NPL 3 discloses a spectral characteristics table of a CMOS image sensor and an image sensor including CIGS.

CITATION LIST

Patent Literature

PTL 1: Japanese Patent Laying-Open No. 2004-140309
PTL 2: Japanese Patent Laying-Open No. 2008-42714
PTL 3: Japanese Patent Laying-Open No. 2006-211630
PTL 4: Japanese Patent Laying-Open No. 6-151806
PTL 5: Japanese Patent Laying-Open No. 2007-123721

Non Patent Literature

NPL 1: "Three-Dimensional Visualization of Ice Crystals in Frozen Materials by Near-Infrared Imaging Spectroscopy," Trans. of the JSRAE, Vol. 22, No. 2 (2005), pp. 185-192, Nov. 30, 2004

NPL 2: "Measurement of Hemoglobin Concentration using the Noninvasive Peripheral Blood Vessel Monitoring Device with the Near-infrared Spectroscopic Imaging Method," Mayu Takeda et al., Annual Reports of School of Health Sciences, Faculty of Medicine, Kyoto University, Health Science, Vol. 2, 2005, pp. 9-13

NPL 3: "Image Sensor Spectral Characteristics Table," ROHM Co., Ltd., 2009

NPL 4: "Venous Oxygenation Index (VOI) Measurement Principles"

SUMMARY OF INVENTION

Technical Problem

In a stack-type solid-state image sensing element in which a photoelectric conversion film is provided on a silicon substrate with a line layer or the like being interposed as in the solid-state image sensing element including CIGS, when light that has not been absorbed by the photoelectric conversion film, the line layer and the like and light passing through a gap in the photoelectric conversion film, the line layer and the like enter a transistor provided on the silicon substrate, an unnecessary current is generated and image quality may deteriorate.

In addition, since charges obtained by photoelectric conversion are generally not much in the solid-state image sensing element, a capacitance for storing charges and extracting the stored charges as a voltage is required. This capacitance is obtained, for example, by providing a transistor on a silicon substrate. Therefore, in a conventional solid-state image sensing element, a space for providing a transistor on the silicon substrate is necessary and it is difficult to achieve reduction in size.

PTL 1, however, fails to disclose a configuration for solving such a problem.

In addition, with the XY address reading scheme disclosed in PTL 2, since the time to read a pixel signal from a pixel circuit is different for each row, an image is distorted when an object moving at high speed is shot.

Meanwhile, with the global shutter scheme, a current leaks from a photoelectric conversion element through a transfer transistor to a capacitor during a reading period and a level of a pixel signal disadvantageously varies.

Therefore, a primary object of the present invention is to provide a photoelectric conversion device and an image pick-up device capable of preventing deterioration of image quality by cutting off light incident on a semiconductor substrate and achieving reduction in size.

In addition, another object of the present invention is to provide a photoelectric conversion device capable of realizing a global shutter scheme.

Solution to Problem

A photoelectric conversion device according to the present invention includes a semiconductor substrate, an insulating layer provided on the semiconductor substrate, a first electrode provided on the insulating layer, a photoelectric conversion film provided on the first electrode, for converting received light to charges, a line connected between the first electrode and the semiconductor substrate, a first planar electrode provided in the insulating layer and connected to the first electrode, and a second planar electrode provided in the insulating layer between the first planar electrode and the semiconductor substrate.

In addition, another photoelectric conversion device according to the present invention includes a plurality of pixel circuits arranged in a plurality of rows and a plurality of columns and a row selection circuit for successively selecting one row of the plurality of rows during a first period one by one and successively selecting one row of the plurality of rows during a second period one by one. Each pixel circuit includes a photoelectric conversion element for outputting a current at a value in accordance with a quantity of incident light, a first capacitor connected between a first node and a line at a reference voltage, a second capacitor connected between a second node and the line at the reference voltage, a first reset circuit resetting the first node to a predetermined voltage when the first period starts and resetting the second node to the predetermined voltage when the second period starts, a switching circuit for connecting an output node of the photoelectric conversion element and the first node with each other during the first period and connecting the output node of the photoelectric conversion element and the second node with each other during the second period, and a signal generation circuit activated when the row selection circuit selects a corresponding row, for generating during the first period a first pixel signal at a level in accordance with a voltage of the second node charged with an output current from the photoelectric conversion element and generating during the second period a second pixel signal at a level in accordance with a voltage of the first node charged with an output current from the photoelectric conversion element. This photoelectric conversion device further includes a read circuit for reading the first and second pixel signals generated by the signal generation circuit in each pixel circuit.

Advantageous Effects of Invention

Since first and second planar electrodes forming a capacitor are provided in the insulating layer under the photoelectric conversion film in the photoelectric conversion device according to the present invention, deterioration of image quality can be prevented by cutting off light incident on a semiconductor substrate and reduction in size can be achieved.

In another photoelectric conversion device according to the present invention, a first pixel signal is generated during the first period based on a voltage of the second capacitor while an output current from the photoelectric conversion element is fed to the reset first capacitor and a second pixel signal is generated during the second period based on a voltage of the first capacitor while an output current from the photoelectric conversion element is fed to the reset second capacitor. Therefore, the global shutter scheme can be realized. In addition, flow of the output current from the photoelectric conversion element to the second capacitor during the first period or flow of the output current from the photoelectric conversion element to the first capacitor during the second period can be prevented, and thus variation in level of the pixel signal can be prevented.

BRIEF DESCRIPTION OF DRAWINGS

FIG. 13 is a diagram showing a main portion of a pixel array shown in FIG. 10.

FIG. 31 is a diagram showing color arrangement of color filters for one pixel in the pixel array shown in FIG. 30.

FIG. 32 is a diagram showing transmittance of a color filter of each of white, yellow and cyan.

FIG. 33 is a diagram showing transmittance of a color filter of each of red, green and blue.

FIG. 37 is a diagram showing another variation of color arrangement of color filters for one pixel in the image pick-up device according to Embodiment 4.

FIG. 38 is a diagram showing yet another variation of color arrangement of color filters for one pixel in the image pick-up device according to Embodiment 4.

FIG. 39 is a plan view showing a configuration of a pixel array of a photoelectric conversion device according to Embodiment 5 of the present invention.

FIG. 40 is a cross-sectional view showing a main portion of a pixel array shown in FIG. 39.

FIG. 84 is a flowchart defining an operation procedure when an image pick-up device according to a variation of Embodiment 10 shoots a subject.

DESCRIPTION OF EMBODIMENTS

Figure 1:
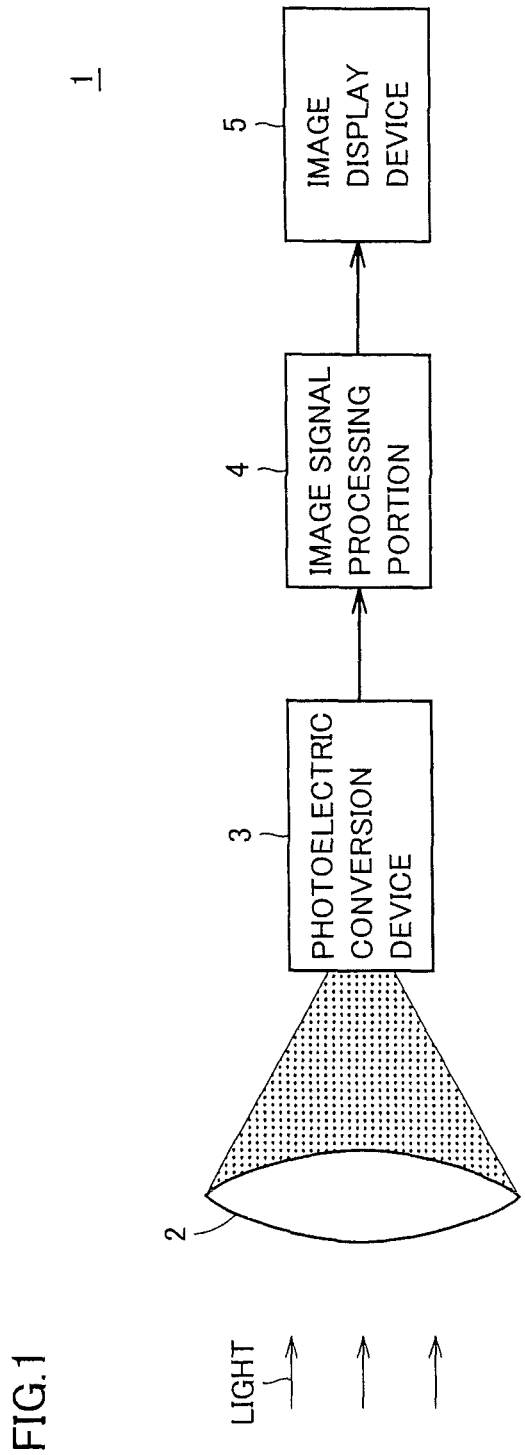
FIG. 1 is a block diagram showing a configuration of an image pick-up device according to Embodiment 1 of the present invention.

An embodiment of the present invention will be described hereinafter with reference to the drawings. It is noted that the same or corresponding elements in the drawings have the same reference characters allotted and description thereof will not be repeated.

Embodiment 1

FIG. 1 is a diagram showing a configuration of an image pick-up device 1 according to Embodiment 1 of the present invention.

Referring to FIG. 1, image pick-up device 1 includes a lens 2, a photoelectric conversion device 3, an image signal processing portion 4, and an image display device 5.

Image pick-up device 1 picks up an image of a subject and displays the picked-up image on a screen. More specifically, lens 2 condenses light from the subject on photoelectric conversion device 3. Photoelectric conversion device 3 converts light received from lens 2 to a pixel signal which is an electric signal and outputs the pixel signal to image signal processing portion 4. Image signal processing portion 4 generates an image signal by subjecting a pixel signal of each pixel received from photoelectric conversion device 3 to various types of signal processing such as interpolation processing, color processing and correction processing, and outputs the image signal to image display device 5. Image display device 5 displays an image based on the image signal received from image signal processing portion 4.

Figure 2:
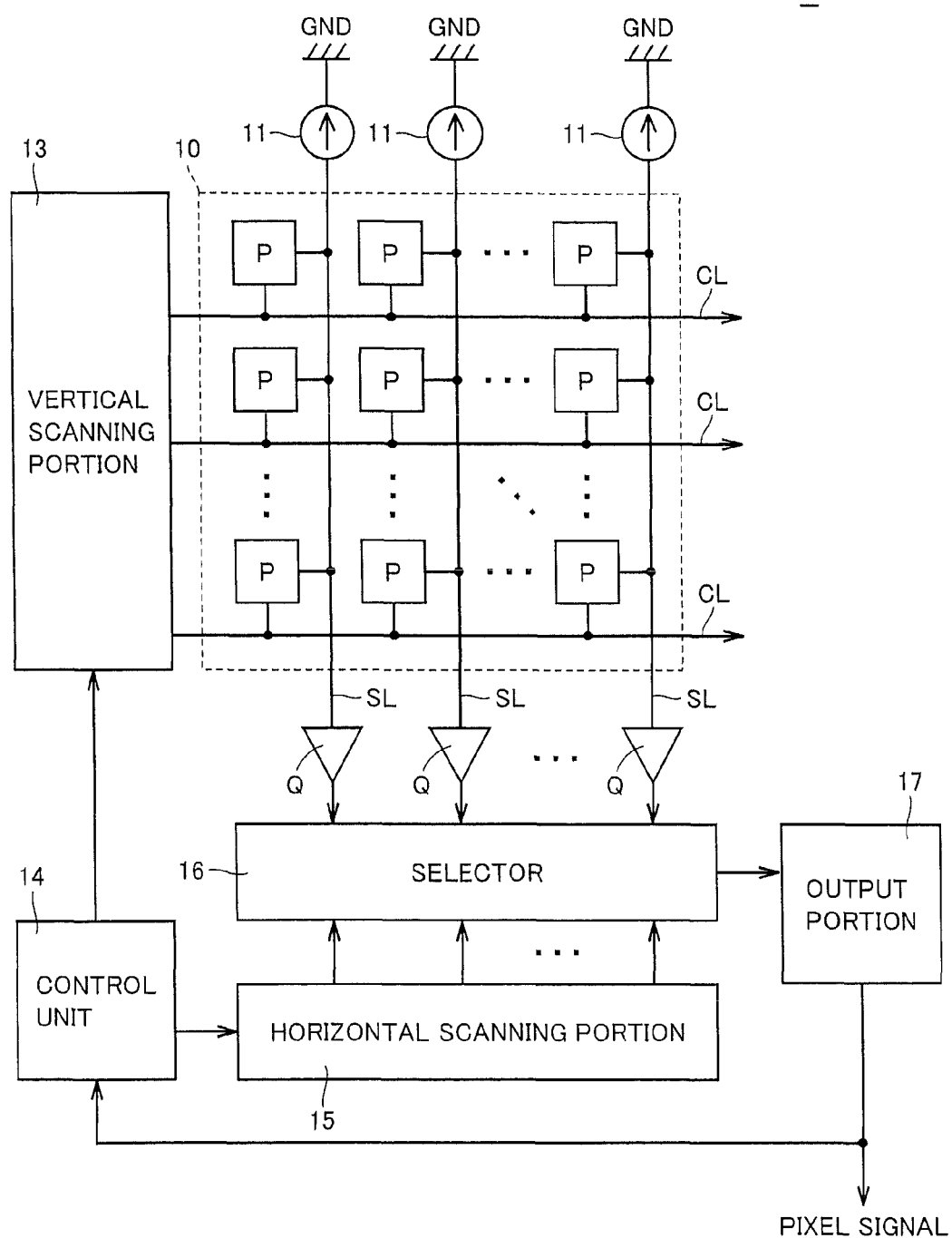
FIG. 2 is a block diagram showing a configuration of a photoelectric conversion device shown in FIG. 1.

FIG. 2 is a diagram showing a configuration of the photoelectric conversion device according to Embodiment 1 of the present invention.

Referring to FIG. 2, photoelectric conversion device 3 includes a pixel array 10, a plurality of load circuits 11, a plurality of amplifiers Q, a vertical scanning portion 13, a control unit 14, a horizontal scanning portion 15, a selector 16, and an output portion 17.

Pixel array 10 includes a plurality of pixels P aligned in a plurality of rows and a plurality of columns. A row and a column of the plurality of pixels P arranged in rows and columns are also hereinafter referred to as a pixel row and a pixel column, respectively.

Pixel array 10 further includes a control signal line CL provided in correspondence with each pixel row and a signal line SL provided in correspondence with each pixel column.

One end of each signal line SL is connected to a node for supplying a ground voltage GND through load circuit 11. Load circuit 11 has a prescribed resistance value. The other end of each signal line SL is connected to an input terminal of amplifier Q.

Figure 3:
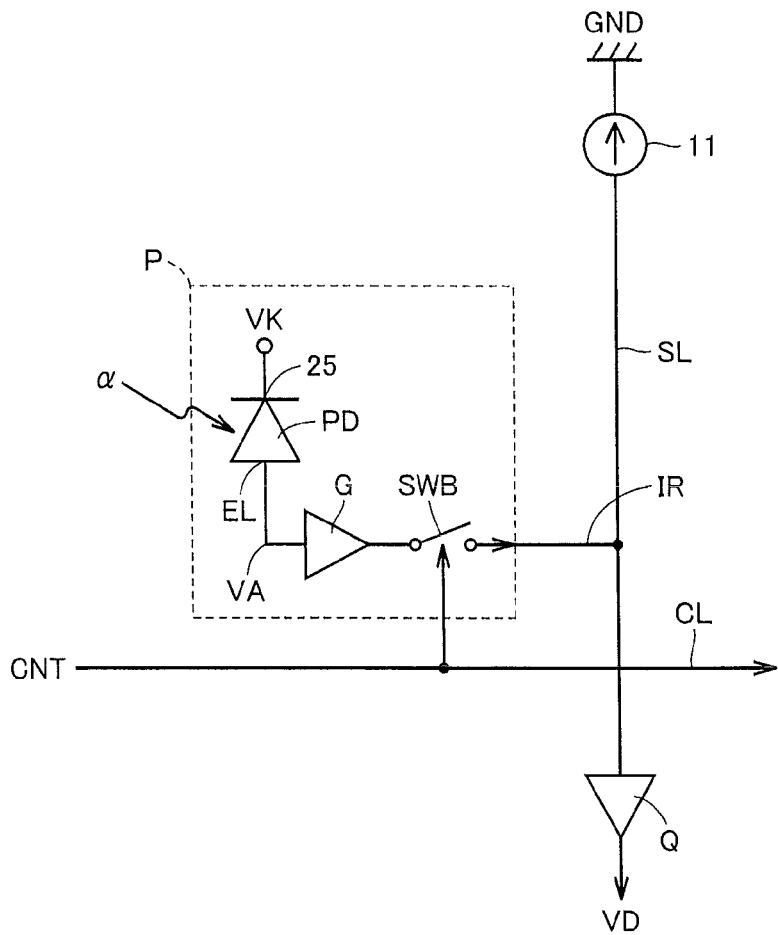
FIG. 3 is a diagram showing a configuration of a pixel shown in FIG. 2.

FIG. 3 is a diagram showing a configuration of pixel P according to Embodiment 1 of the present invention.

Referring to FIG. 3, pixel P includes a photodiode PD, a read circuit G, and a switch SWB. A cathode voltage VK is applied to a cathode of photodiode PD, and an anode voltage VA is applied to an anode of photodiode PD.

When light α from lens 2 is incident on photodiode PD, charges in an amount in accordance with the quantity of light flow to read circuit G. Read circuit G is implemented, for example, by an amplifier, and it outputs as a signal, a current IR at a level in accordance with the amount of charges that flowed in from photodiode PD, to corresponding signal line SL.

Switch SWB switches whether to output current IR from read circuit G to corresponding signal line SL or not, based on a control signal CNT received through corresponding control signal line CL.

Signal line SL transmits a signal from read circuit G. Namely, a voltage level of signal line SL is a product of current IR from read circuit G and a resistance value of load circuit 11.

Amplifier Q amplifies a voltage of corresponding signal line SL. Therefore, an output voltage VD from amplifier Q varies in accordance with a quantity of light α incident on photodiode PD.

Referring again to FIG. 2, vertical scanning portion 13 successively selects one of the plurality of pixel rows one by one based on a vertical scanning signal provided from control unit 14 and provides control signal CNT to each switch SWB in that pixel row through control signal line CL in the selected pixel row. Thus, a current at a level in accordance with the quantity of incident light is output from each pixel P in the selected pixel row to corresponding signal line SL and each signal line SL is charged to a voltage at a level in accordance with the quantity of incident light. A voltage of each signal line SL is amplified by amplifier Q and provided to selector 16.

Horizontal scanning portion 15 successively selects each pixel column one by one while vertical scanning portion 13 selects one pixel row, based on a horizontal scanning signal provided from control unit 14. Selector 16 selects output voltage VD from amplifier Q corresponding to the pixel column selected by horizontal scanning portion 15 and transmits the voltage to output portion 17.

Output portion 17 generates a pixel signal, that is, a signal indicating a quantity of light received by pixel P, based on output voltage VD from amplifier Q provided through selector 16 and outputs the signal to image signal processing portion 4 and control unit 14.

Figure 4:
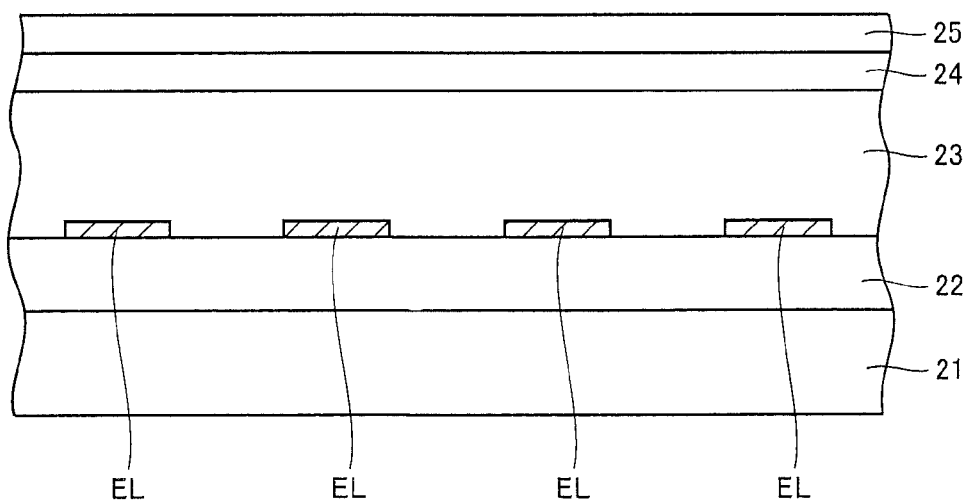
FIG. 4 is a diagram showing a cross-sectional structure of a main portion of a pixel array shown in FIG. 2.

FIG. 4 is a diagram showing a cross-sectional structure of a main portion of pixel array 10 according to Embodiment 1 of the present invention. Referring to FIG. 4, pixel array 10 includes a semiconductor substrate 21, a read circuit layer 22, a plurality of pixel electrodes EL, a CIGS thin film 23, a CdS (cadmium sulfide) layer 24, and a transparent electrode 25.

Read circuit layer 22 is formed on a surface of semiconductor substrate 21. Read circuit layer 22 is an insulating layer and it includes a MOS (Metal Oxide Semiconductor) transistor, a capacitor, a line, a via hole, and the like.

A plurality of rectangular pixel electrodes EL are arranged on a surface of read circuit layer 22 at prescribed intervals. The plurality of pixel electrodes EL are aligned in a plurality of rows and a plurality of columns. Each pixel electrode EL is formed, for example, of Mo (molybdenum).

CIGS thin film 23 is formed to cover the plurality of pixel electrodes EL and CdS layer 24 and transparent electrode 25 are stacked on a surface of CIGS thin film 23 in this order. CIGS thin film 23 is a p-type compound semiconductor thin film and it has a thickness, for example, of 1.7 μm. CdS layer 24 is a buffer layer and it has a thickness, for example, of 50 nm. Transparent electrode 25 is a low-resistance n-type ZnO film, and it has a thickness, for example, of 1 μm. Therefore, CIGS thin film 23 and transparent electrode 25 form a PN junction.

In other words, transparent electrode 25 is formed on a first main surface of CIGS thin film 23 serving as a photoelectric conversion film with CdS layer 24 serving as a buffer layer being interposed, and the plurality of pixel electrodes EL are formed on a second main surface of CIGS thin film 23. Each pixel electrode EL corresponds to pixel P.

Figure 5:
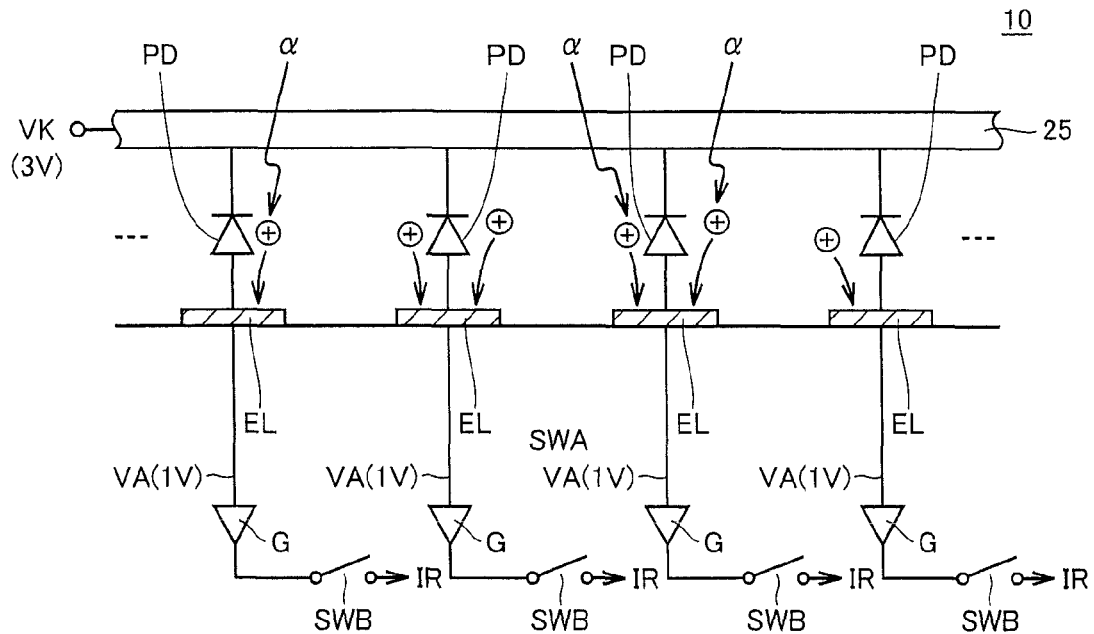
FIG. 5 is a diagram schematically showing a cross-sectional structure and an operation of the pixel array shown in FIG. 4.
Figure 6:
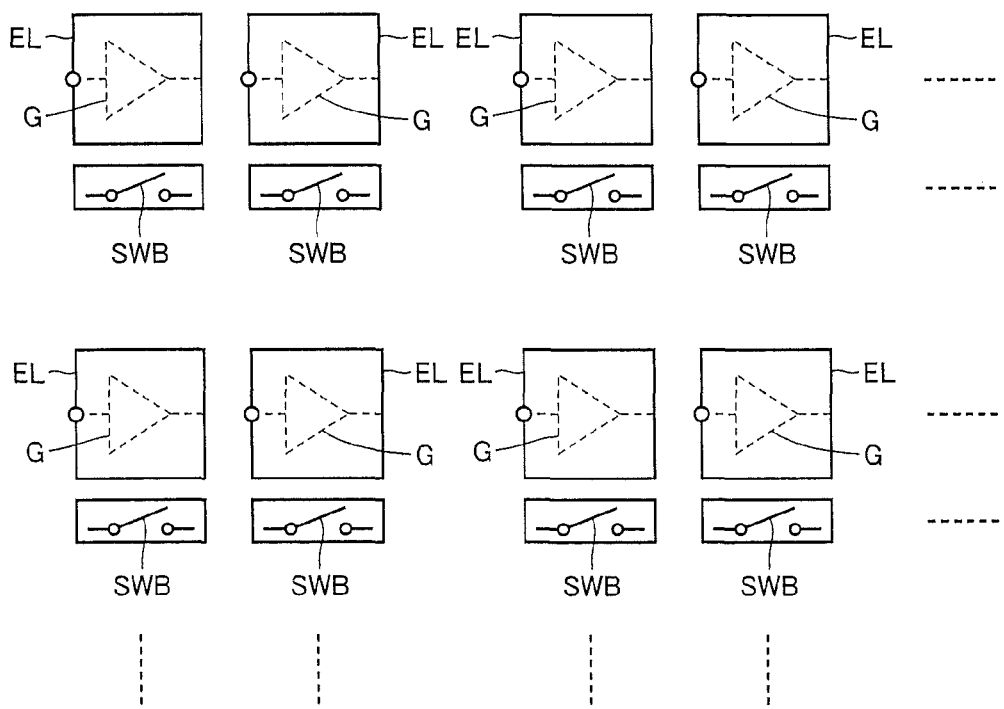
FIG. 6 is a diagram of the pixel array shown in FIG. 5 when viewed from above.

FIG. 5 is a diagram schematically showing a cross-sectional structure and an operation of the pixel array according to Embodiment 1 of the present invention. FIG. 6 is a diagram of the pixel array according to Embodiment 1 of the present invention when viewed from above.

Referring to FIGS. 5 and 6, pixel array 10 further includes a plurality of switches SWB.

Read circuit G is provided in correspondence with pixel electrode EL and formed under corresponding pixel electrode EL in read circuit layer 22 shown in FIG. 4. Namely, read circuit G is provided on a side of CIGS thin film 23 opposite to corresponding pixel electrode EL. Thus, photoelectric conversion device 3 can be made smaller.

During operation, read circuit G applies anode voltage VA, for example, of 1 V to corresponding pixel electrode EL. In addition, cathode voltage VK, for example, of 3 V, which is higher than anode voltage VA, is applied to transparent electrode 25. Thus, a depletion layer is formed between each pixel electrode EL and transparent electrode 25, and a region between each pixel electrode EL and transparent electrode 25 operates as photodiode PD. Pixel electrode EL serves as the anode of photodiode PD and transparent electrode 25 serves as the cathode of photodiode PD.

When light α is incident on CIGS thin film 23 from the outside through transparent electrode 25, electron-hole pairs in an amount in accordance with the quantity of light are produced in CIGS thin film 23. Since holes are majority carriers in CIGS thin film 23, holes, that is, positive charges, flow into pixel electrode EL in the vicinity. Read circuit G outputs current IR at a level in accordance with the amount of charges that flowed in corresponding pixel electrode EL.

Switch SWB is provided in read circuit layer 22 in correspondence with read circuit G, and it has a first terminal connected to an output terminal of corresponding read circuit G and a second terminal connected to corresponding signal line SL.

Figure 7:
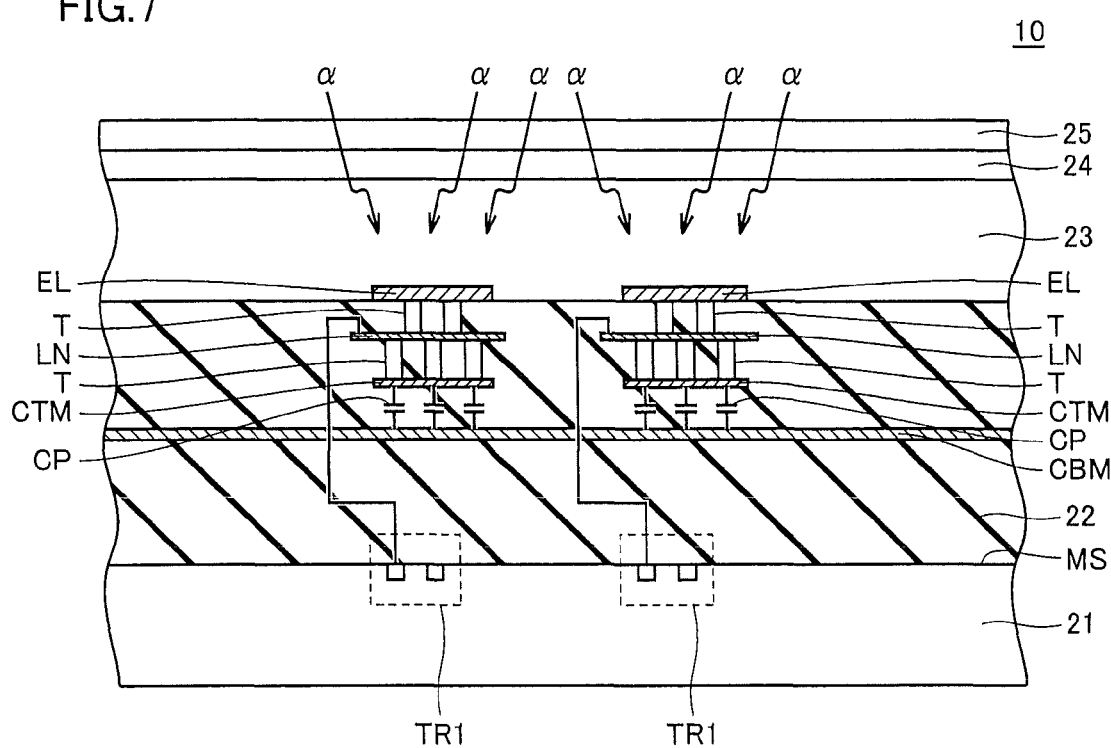
FIG. 7 is a diagram showing in detail a cross-sectional structure of a main portion of the pixel array shown in FIG. 4.
Figure 8:
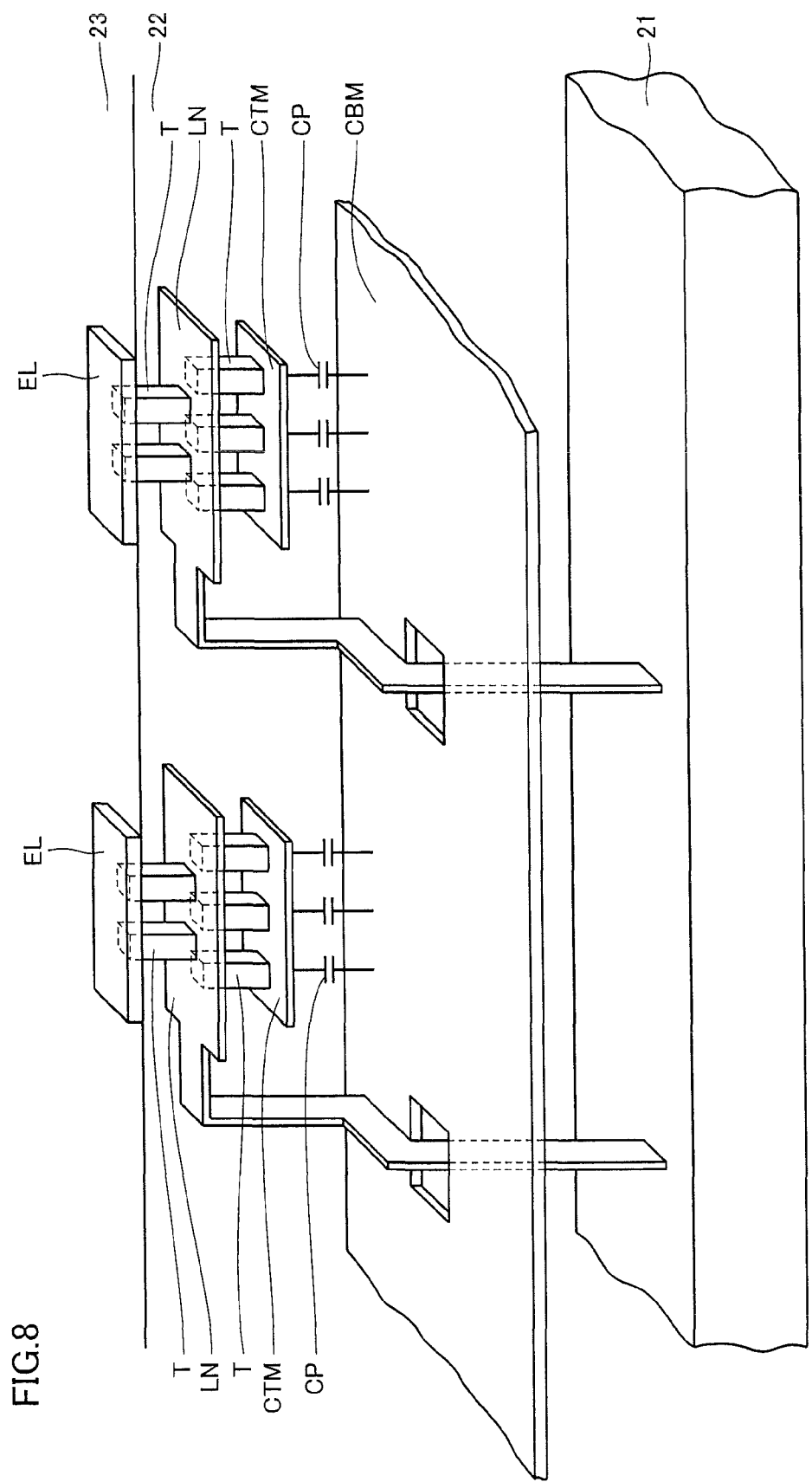
FIG. 8 is a perspective view of the main portion of the pixel array shown in FIG. 7.

FIG. 7 is a diagram showing in detail a cross-sectional structure of a main portion of pixel array 10 according to Embodiment 1 of the present invention. FIG. 8 is a perspective view of the main portion of pixel array 10 according to Embodiment 1 of the present invention.

Referring to FIGS. 7 and 8, pixel array 10 further includes a line LN, a planar electrode CTM, a planar electrode CBM, a via hole T, and a MOS transistor TR1.

Line LN, planar electrode CTM, and planar electrode CBM are formed, for example, of aluminum. Semiconductor substrate 21 has a main surface MS. Read circuit layer 22 is provided on main surface MS. CIGS thin film 23 is provided on main surface MS with read circuit layer 22 being interposed, and it converts received light to charges. Pixel electrode EL is provided on the surface of CIGS thin film 23 and it receives charges converted by CIGS thin film 23. Line LN is provided in read circuit layer 22 and it electrically connects pixel electrode EL and semiconductor substrate 21 with each other.

Planar electrode CTM is provided in read circuit layer 22 and electrically connected to pixel electrode EL. A plurality of lines LN and a plurality of planar electrodes CTM are provided in correspondence with pixel electrodes EL, respectively. Planar electrode CBM is provided in read circuit layer 22 as opposed to planar electrode CTM at a distance therefrom. A capacitance CP is formed between planar electrode CTM and planar electrode CBM. Capacitance CP is in proportion to an area of a region of planar electrode CTM and planar electrode CBM opposed to each other.

Planar electrode CBM is provided opposed to main surface MS of semiconductor substrate 21. For example, planar electrode CBM and main surface MS are provided substantially in parallel to each other. In addition, for example, planar electrode CTM and planar electrode CBM are provided substantially in parallel to each other.

Line LN is provided under corresponding pixel electrode EL and electrically connected to pixel electrode EL through via hole T.

Planar electrode CTM is provided under line LN and electrically connected to pixel electrode EL through via hole T and line LN.

Here, a plurality of via holes T are provided in parallel, between pixel electrode EL and line LN and between line LN and planar electrode CTM. According to such a configuration, line resistance caused by via hole T can be lowered.

MOS transistor TR1 is provided in a region under planar electrode CBM in semiconductor substrate 21 and read circuit layer 22.

Planar electrode CTM is separate for each pixel, whereas planar electrode CBM extends across a plurality of pixels. Namely, planar electrode CBM is provided in an integrated manner, as opposed to each planar electrode CTM at a distance therefrom. Therefore, an area of planar electrode CTM defines capacitance CP for storing charges.

Charges photoelectrically converted by CIGS thin film 23 are stored in capacitance CP and stored charges are provided to MOS transistor TR1 in semiconductor substrate 21 through line LN.

Figure 9:
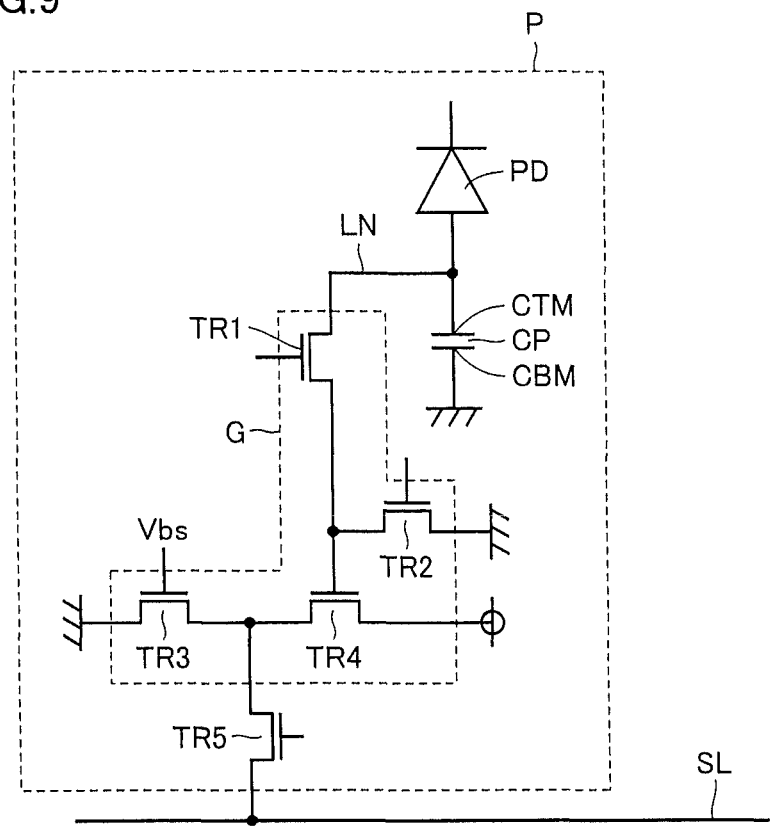
FIG. 9 is a diagram showing an example of a circuit for one pixel in the pixel array shown in FIG. 2.

FIG. 9 is a diagram showing an example of a circuit for one pixel in pixel array 10 according to Embodiment 1 of the present invention.

Referring to FIG. 9, pixel P includes photodiode PD, line LN, planar electrode CTM, planar electrode CBM, read circuit G, and a MOS transistor TR5. Read circuit G includes MOS transistors TR1 to TR4.

MOS transistor TR1 has a gate, a drain connected to line LN, and a source connected to a source of MOS transistor TR2 and a gate of MOS transistor TR4. MOS transistor TR2 has a gate, a drain connected to a node supplied with a prescribed voltage, for example, a ground voltage, and the source connected to the source of MOS transistor TR1. MOS transistor TR4 has the gate connected to the source of MOS transistor TR1, a drain connected to a node supplied with a supply voltage, and a source connected to a drain of MOS transistor TR3. MOS transistor TR3 has a gate supplied with a bias voltage Vbs, the drain connected to the source of MOS transistor TR4, and a source connected to a node supplied with a ground voltage. MOS transistor TR5 has a drain connected to the drain of MOS transistor TR3, a gate, and a source connected to signal line SL.

MOS transistors TR3 and TR4 constitute a source follower circuit. Bias voltage Vbs is provided to the gate of MOS transistor TR3, and thus MOS transistor TR3 operates as a resistor element. Here, MOS transistor TR3 corresponds to load circuit 11 described previously, and read circuit G shown in FIG. 9 outputs as a signal, a voltage at a level in accordance with the amount of charges that flowed in from photodiode PD, to corresponding signal line SL. In addition, MOS transistor TR5 corresponds to switch SWB described previously, and it switches whether to output a signal from read circuit G to signal line SL or not.

Control unit 14 provides a control signal to the gates of MOS transistors TR1, TR4, and TR5, for example, by controlling vertical scanning portion 13, and reads charges from pixel P.

More specifically, initially, control unit 14 reads a reset potential. Namely, MOS transistor TR5 is turned on. Then, as MOS transistor TR2 is turned on, charges stored in a gate capacitance of MOS transistor TR4 and a line capacitance connected to this gate are released. Here, by setting MOS transistor TR1 to off, charges stored in capacitance CP are blocked so as not to flow toward MOS transistor TR4.

Then, MOS transistor TR2 is turned off and MOS transistor TR1 is turned on. Thus, charges stored in capacitance CP flow to the gate of MOS transistor TR4 and a voltage corresponding to the charges stored in capacitance CP is output to signal line SL.

Then, MOS transistor TR5 is turned off. In addition, by turning on MOS transistor TR2, charges stored in the gate capacitance of MOS transistor TR4 and the line capacitance connected to this gate are released. Then, MOS transistor TR1 is turned off so that charges are again stored in capacitance CP and charges stored in capacitance CP are blocked so as not to flow toward MOS transistor TR4.

In general, in a solid-state image sensing element, a space for providing a transistor for storing charges obtained by photoelectric conversion is required in a silicon substrate, and it is difficult to achieve reduction in size. When light is incident on this transistor, an unnecessary current is generated and image quality may deteriorate. In addition, since light should be incident on a silicon substrate in the solid-state image sensing element employed in a CMOS image sensor or the like, it is not preferred to provide a capacitance in a line layer or the like on the silicon substrate.

In contrast, in a stacked configuration including a CIGS thin film and the like, it is not necessary to have light enter the silicon substrate, and therefore a capacitance can be provided not in the silicon substrate but in the insulating layer, that is, in the line layer, and thus this capacitance can be formed of a material the same as that for the line.

Then, the photoelectric conversion device according to Embodiment 1 of the present invention includes line LN provided in read circuit layer 22 and electrically connecting pixel electrode EL and semiconductor substrate 21 with each other, planar electrode CTM provided in read circuit layer 22 and electrically connected to pixel electrode EL, and planar electrode CBM provided in read circuit layer 22 as opposed to planar electrode CTM at a distance therefrom.

Namely, by providing a set of planar electrodes in the insulating layer and using capacitance CP between the planar electrodes as the capacitance for storing charges, the need for forming a capacitance on the semiconductor substrate is eliminated. As other circuits can be provided in a free space in the semiconductor substrate thus obtained, reduction in size can be achieved. In addition, by providing planar electrodes CTM and CBM in the insulating layer, light incident on the semiconductor substrate can be cut off.

It is noted that arrangement of line LN, planar electrode CTM and planar electrode CBM in pixel array 10 in Embodiment 1 of the present invention is not limited to that as shown in FIGS. 7 and 8. So long as planar electrode CTM and planar electrode CBM are opposed to each other, a capacitance can be formed and light incident on semiconductor substrate 21 can be cut off. Moreover, by providing any of planar electrode CTM and planar electrode CBM as opposed to semiconductor substrate 21, light incident on semiconductor substrate 21 can further be cut off.

Further, though planar electrode CBM is configured to extend across a plurality of pixels in the photoelectric conversion device according to Embodiment 1 of the present invention, the configuration is not limited as such. Planar electrode CBM may be configured to be separate for each pixel.

Furthermore, though pixel array 10 according to Embodiment 1 of the present invention is configured to include a CIGS thin film, the configuration is not limited as such. Any of a photoelectric conversion thin film and a photoelectric conversion thick film may be employed, and the configuration may include, for example, a compound semiconductor thin film, an organic semiconductor thin film, and the like other than the CIGS thin film. In addition, the present invention is also applicable to a photosensor, a line sensor and the like, without limited to the photoelectric conversion device.

Embodiment 2

Figure 10:
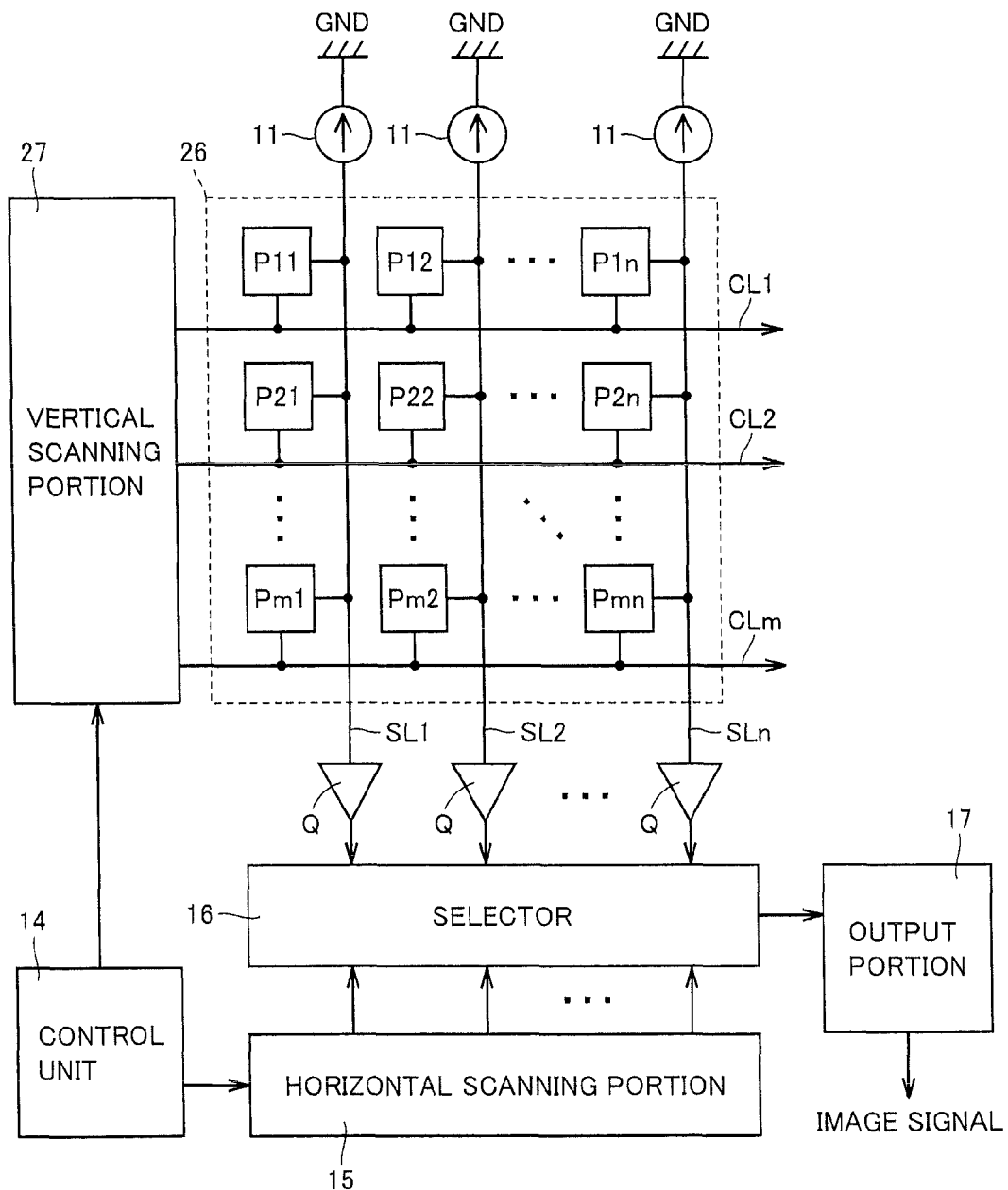
FIG. 10 is a block diagram showing an overall configuration of a photoelectric conversion device according to Embodiment 2 of the present invention.

A photoelectric conversion device according to Embodiment 2 of the present invention includes a pixel array 26 as shown in FIG. 10. Pixel array 26 includes m×n pixels P11 to Pmn aligned in m rows and n columns (each of m and n being an integer not smaller than 2), control signal line groups CL1 to CLm provided in correspondence with m rows respectively, and signal lines SL1 to SLn provided in correspondence with n columns respectively. Pixel P is controlled by a plurality of signals provided through corresponding control signal line group CL, and it successively outputs to corresponding signal line SL, a pixel current at a level in accordance with a quantity of incident light and a reference current corresponding to a pixel current in a case where a quantity of incident light is zero.

One end of each signal line SL is connected to a line of ground voltage GND through load circuit 11. Load circuit 11 has a prescribed resistance value. The other end of each signal line SL is connected to an input node of amplifier Q. Amplifier Q amplifies a voltage of corresponding signal line SL. Signal line SL attains to a voltage as high as a product of an output current from pixel P in a selected row and in a corresponding column and a resistance value of load circuit 11. A voltage of signal line SL is amplified by amplifier Q.

In addition, the photoelectric conversion device includes a vertical scanning portion 27, control unit 14, horizontal scanning portion 15, selector 16, and output portion 17. Vertical scanning portion 27 operates in accordance with a vertical scanning signal provided from control unit 14, successively selects one row of m rows in pixel array 26 one by one, and provides a plurality of signals to each pixel P in that row through control signal line group CL in the selected row. Thus, a current is output to corresponding signal line SL from each pixel P in the selected row and each signal line SL is charged to a voltage as high as a product of the output current from pixel P and a resistance value of load circuit 11. The voltage of each signal line SL is amplified by amplifier Q and provided to selector 16.

Horizontal scanning portion 15 operates in accordance with a horizontal scanning signal provided from control unit 14 and successively selects one of n columns one by one while vertical scanning portion 27 selects one row. Selector 16 transmits an output voltage from amplifier Q corresponding to the column selected by horizontal scanning portion 15 to output portion 17. Output portion 17 generates an image signal based on the output voltage from amplifier Q provided through selector 16. The image signal is provided to the image display device. An image of a subject for the photoelectric conversion device is displayed on a screen of the image display device.

Figure 11:
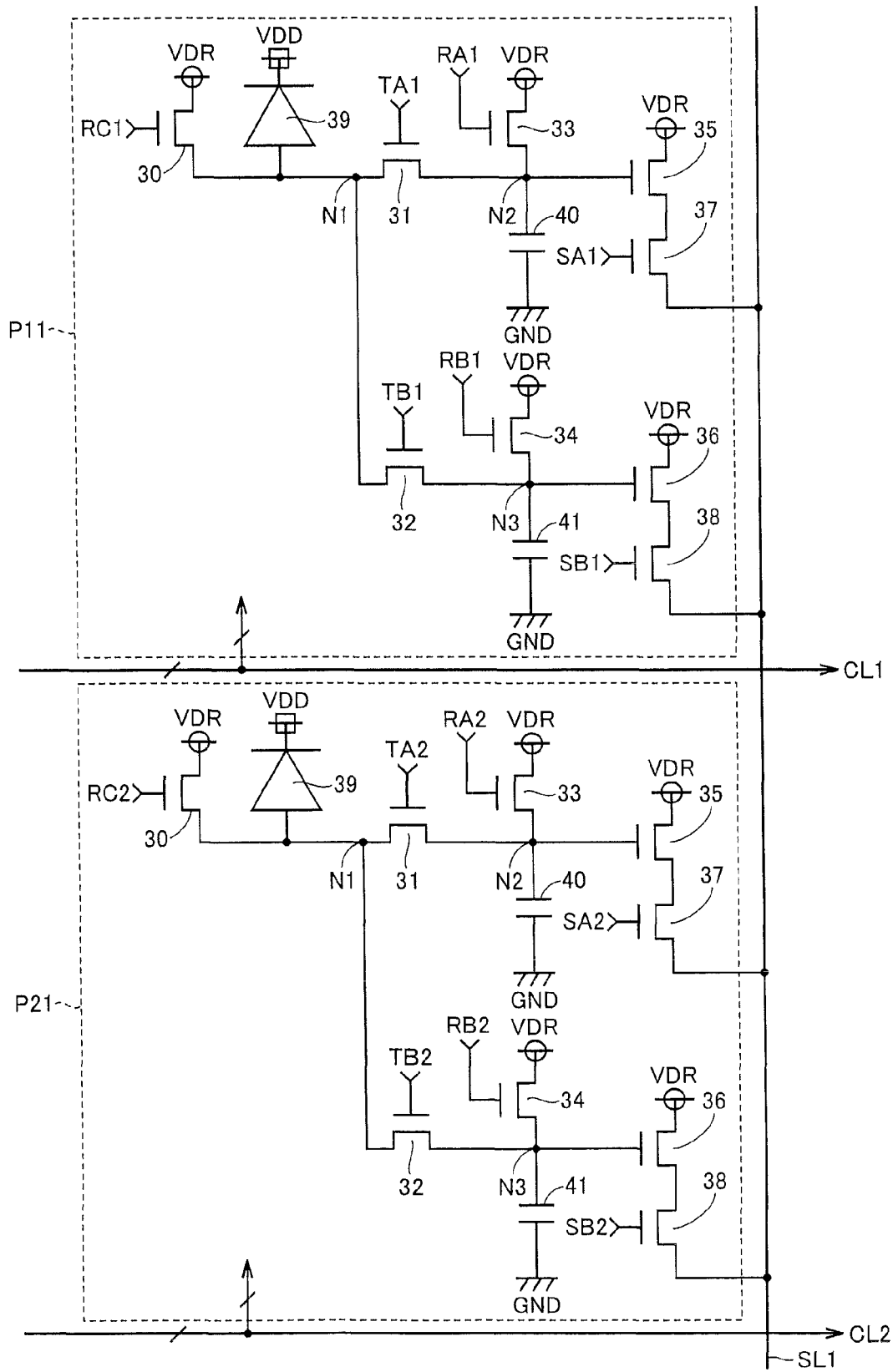
FIG. 11 is a circuit diagram showing a configuration of a pixel shown in FIG. 10.

A configuration and an operation of pixel P will now be described in further detail. As shown in FIG. 11, pixel P11 in the first row and the first column includes N-channel MOS transistors 30 to 38, a photodiode 39, and capacitors 40 and 41. A cathode of photodiode 39 receives a first supply voltage VDD and an anode thereof is connected to a node N1. Photodiode 39 permits flow of a current at a value in accordance with a quantity of incident light to node N1.

A drain of transistor 30 receives a second supply voltage VDR, a gate thereof receives a reset signal RC1, and a source thereof is connected to node N1. Second supply voltage VDR is a prescribed voltage lower than first supply voltage VDD and higher than ground voltage GND.

Capacitor 40 is connected between a node N2 and a line of ground voltage GND. Capacitor 41 is connected between a node N3 and a line of ground voltage GND. Transistor 31 is connected between nodes N1 and N2, and a gate thereof receives a transfer signal TA1. Transistor 32 is connected between nodes N1 and N3 and a gate thereof receives a transfer signal TB1.

Transfer signals TA1 and TB1 are alternately set to the "H" level in a prescribed cycle. When reset signal RC1 is set to the "H" level while transfer signal TA1 is at "H", transistors 30 and 31 are rendered conductive and nodes N1 and N2 are reset to second supply voltage VDR. When reset signal RC1 is set to the "L" level while transfer signal TA1 is at the "H" level, transistor 30 is rendered non-conductive and transistor 31 is rendered conductive, and capacitor 40 is charged with the output current from photodiode 39.

When reset signal RC1 is set to the "H" level while transfer signal TB1 is at the "H" level, transistors 30 and 32 are rendered conductive and nodes N1 and N3 are reset to second supply voltage VDR. When reset signal RC1 is set to the "L" level while transfer signal TB1 is at the "H" level, transistor 30 is rendered non-conductive and transistor 32 is rendered conductive and capacitor 41 is charged with the output current from photodiode 39.

A drain of transistor 33 receives second supply voltage VDR, a gate thereof receives a reset signal RA1, and a source thereof is connected to node N2. A drain of transistor 34 receives second supply voltage VDR, a gate thereof receives a reset signal RB1, and a source thereof is connected to node N3.

When reset signal RA1 is set to the "H" level while transfer signal TA1 is at the "L" level, transistor 33 is rendered conductive and node N2 is reset to second supply voltage VDR. When reset signal RB1 is set to the "H" level while transfer signal TB1 is at the "L" level, transistor 34 is rendered conductive and node N3 is reset to second supply voltage VDR.

A drain of transistor 35 receives second supply voltage VDR and a gate thereof is connected to node N2. A drain of transistor 37 is connected to a source of transistor 35, a gate thereof receives a selection signal SA1, and a source thereof is connected to corresponding signal line SL1. It is noted that first supply voltage VDD instead of second supply voltage VDR may be provided to the drain of transistor 35.

When selection signal SA1 is set to the "H" level while transfer signal TA1 is at the "L" level before reset signal RA1 is set to the "H" level, transistor 37 is rendered conductive and a pixel current at a level in accordance with the voltage of node N2 flows from a line of second supply voltage VDR through transistors 35 and 37 to corresponding signal line SL1.

When selection signal SA1 is set to the "H" level while transfer signal TA1 is at the "L" level after reset signal RA1 is set to the "H" level, transistor 37 is rendered conductive and a reference current at a level in accordance with second supply voltage VDR flows from the line of second supply voltage VDR through transistors 35 and 37 to corresponding signal line SL1.

A drain of transistor 36 receives second supply voltage VDR and a gate thereof is connected to node N3. A drain of transistor 38 is connected to a source of transistor 36, a gate thereof receives a selection signal SB1, and a source thereof is connected to corresponding signal line SL1. It is noted that first supply voltage VDD instead of second supply voltage VDR may be provided to the drain of transistor 35.

When selection signal SB1 is set to the "H" level while transfer signal TB1 is at the "L" level before reset signal RB1 is set to the "H" level, transistor 38 is rendered conductive and a pixel current at a level in accordance with the voltage of node N3 flows from the line of second supply voltage VDR through transistors 36 and 38 to corresponding signal line SL1.

When selection signal SB1 is set to the "H" level while transfer signal TB1 is at the "L" level after reset signal RB1 is set to the "H" level, transistor 38 is rendered conductive and a reference current at a level in accordance with second supply voltage VDR flows from the line of second supply voltage VDR through transistors 36 and 38 to corresponding signal line SL1.

Signals RA1, RB1, RC1, TA1, TB1, SA1, and SB1 are supplied to pixel P11 through corresponding control signal line group CL1.

Each of other pixels P12 to P1n in the first row is configured similarly to pixel P11. It is noted that sources of transistors 37 and 38 in pixels P12 to P1n are connected to signal lines SL2 to SLn respectively.

Pixels P21 to P2n in the second row are configured similarly to pixels P11 to P1n respectively. It is noted that signals RA2, RB2, RC2, TA2, TB2, SA2, and SB2 are supplied from control signal line group CL2 to each of pixels P21 to P2n.

Pixels Pm1 to Pmn in the mth row are configured similarly to pixels P11 to P1n respectively. It is noted that signals RAm, RBm, RCm, TAm, TBm, SAm, and SBm are supplied from control signal line group CLm to each of pixels Pm1 to Pmn.

Figure 12:
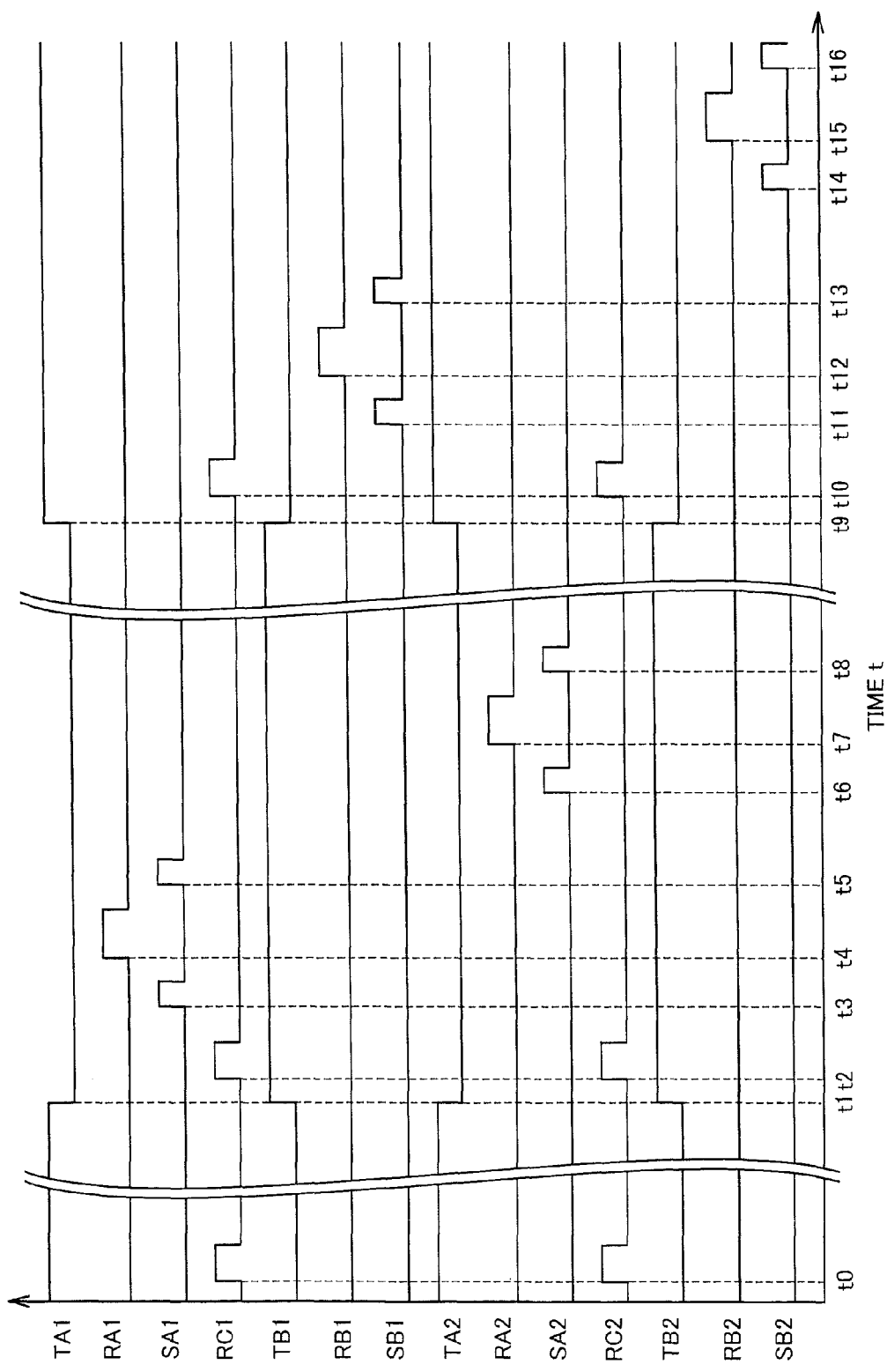
FIG. 12 is a time chart showing an operation of the photoelectric conversion device shown in FIGS. 10 and 11.

FIG. 12 is a time chart showing a global shutter operation of this photoelectric conversion device. It is noted that FIG. 12 shows only an operation of pixels P in the first row and the second row. In FIG. 12, transfer signals TA1 to TAm and transfer signals TB1 to TBm are alternately set to the "H" level in a constant cycle. At a certain time t1, transfer signals TA1 to TAm are caused to fall from the "H" level to the "L" level and transfer signals TB1 to TBm are caused to rise from the "L" level to the "H" level. Thus, transistor 31 in each of all pixels P11 to Pmn is rendered non-conductive and transistor 32 is rendered conductive.

Then, at a time t2, reset signals RC1 to RCm are caused to rise to the "H" level only for a prescribed period of time. Thus, transistor 30 in each of all pixels P11 to Pmn is rendered conductive only for a prescribed period of time and nodes N1 and N3 are reset to second supply voltage VDR. When reset signals RC1 to RCm are caused to fall to the "L" level, an output current from photodiode 39 flows into node N3 through transistor 32 in each of all pixels P11 to Pmn and charging of capacitor 41 is started. Charging of capacitor 41 is continued while transfer signals TB1 to TBm are at the "H" level.

Then, at a time t3, vertical scanning portion 27 selects pixels P11 to P1n in the first row, selection signal SA1 is caused to rise to the "H" level only for a prescribed period of time, and transistor 37 in each of pixels P11 to P1n is rendered conductive. Here, node N2 has been charged while transfer signals TA1 to TAm are at the "H" level (t0 to t1) and a voltage of node N2 has attained to a level in accordance with a quantity of light incident on photodiode 39 in each pixel P. Therefore, a pixel current at a value in accordance with the voltage of node N2 flows from the line of second supply voltage VDR through transistors 35 and 37 to signal line SL and the voltage of signal line SL increases to a level in accordance with the pixel current. Voltages of signal lines SL1 to SLn are provided to output portion 17 through amplifiers Q and selector 16 in FIG. 10.

Then, at a time t4, reset signal RA1 is caused to rise to the "H" level only for a prescribed period of time, and transistor 33 in each of pixels P11 to P1n is rendered conductive. Thus, node N2 in each of pixels P11 to P1n is reset to second supply voltage VDR. Then, at a time t5, selection signal SA1 is caused to rise to the "H" level only for a prescribed period of time and transistor 37 in each of pixels P11 to P1n is rendered conductive. Thus, a reference current at a value in accordance with the voltage of node N2 (in this case, VR) flows from the line of second supply voltage VDR through transistors 35 and 37 to signal line SL, and the voltage of signal line SL increases to a level in accordance with that reference current. Voltages of signal lines SL1 to SLn are provided to output portion 17 through amplifiers Q and selector 16 in FIG. 10.

Then, at a time t6, vertical scanning portion 27 selects pixels P21 to P2n in the second row, selection signal SA2 is caused to rise to the "H" level only for a prescribed period of time, and transistor 37 in each of pixels P21 to P2n is rendered conductive. Here, node N2 has been charged while transfer signals TA1 to TAm are at the "H" level (t0 to t1) and a voltage of node N2 has attained to a level in accordance with a quantity of light incident on photodiode 39 in each pixel P. Therefore, a pixel current at a value in accordance with the voltage of node N2 flows from the line of second supply voltage VDR through transistors 35 and 37 to signal line SL and the voltage of signal line SL increases to a level in accordance with the pixel current. Voltages of signal lines SL1 to SLn are provided to output portion 17 through amplifiers Q and selector 16 in FIG. 10.

Then, at a time t7, reset signal RA2 is caused to rise to the "H" level only for a prescribed period of time, and transistor 33 in each of pixels P21 to P2n is rendered conductive. Thus, node N2 in each of pixels P21 to P2n is reset to second supply voltage VDR. Then, at a time t8, selection signal SA2 is caused to rise to the "H" level only for a prescribed period of time and transistor 37 in each of pixels P21 to P2n is rendered conductive. Thus, a reference current at a value in accordance with the voltage of node N2 (in this case, VR) flows from the line of second supply voltage VDR through transistors 35 and 37 to signal line SL, and the voltage of signal line SL increases to a level in accordance with that reference current. Voltages of signal lines SL1 to SLn are provided to output portion 17 through amplifiers Q and selector 16 in FIG. 10.

Similarly hereafter, a pixel current at a level in accordance with the voltage of node N2 and a reference current at a level in accordance with second supply voltage VDR are output from each of pixels P31 to P3n, . . . , and Pm1 to Pmn in the third to the mth rows to signal line SL, and a voltage of signal line SL is provided to output portion 17 through amplifiers Q and selector 16.

Then, at a time t9, transfer signals TA1 to TAm are caused to rise from the "L" level to the "H" level and transfer signals TB1 to TBb are caused to fall from the "H" level to the "L" level. Thus, transistor 32 in each of all pixels P11 to Pmn is rendered conductive and transistor 31 is rendered conductive.

Then, at a time t10, reset signals RC1 to RCm are caused to rise to the "H" level only for a prescribed period of time. Thus, transistor 30 in each of all pixels P11 to Pmn is rendered conductive only for a prescribed period of time and nodes N1 and N2 are reset to second supply voltage VDR. When reset signals RC1 to RCm are caused to fall to the "L" level, an output current from photodiode 39 flows into node N2 through transistor 31 in each of all pixels P11 to Pmn and charging of capacitor 40 is started. Charging of capacitor 40 is continued while transfer signals TA1 to TAm are at the "H" level.

Then, at a time t11, vertical scanning portion 27 selects pixels P11 to P1n in the first row, selection signal SB1 is caused to rise to the "H" level only for a prescribed period of time, and transistor 38 in each of pixels P11 to P1n is rendered conductive. Here, node N3 has been charged while transfer signals TB1 to TBm are at the "H" level (t1 to t9) and a voltage of node N3 has attained to a level in accordance with a quantity of light incident on photodiode 39 in each pixel portion P. Therefore, a pixel current at a value in accordance with the voltage of node N3 flows from the line of second supply voltage VDR through transistors 36 and 38 to signal line SL and the voltage of signal line SL increases to a level in accordance with the pixel current. Voltages of signal lines SL1 to SLn are provided to output portion 17 through amplifiers Q and selector 16 in FIG. 10.

Then, at a time t12, reset signal RB1 is caused to rise to the "H" level only for a prescribed period of time, and transistor 34 in each of pixels P11 to P1n is rendered conductive. Thus, node N3 in each of pixels P11 to P1n is reset to second supply voltage VDR. Then, at a time t13, selection signal SB1 is caused to rise to the "H" level only for a prescribed period of time and transistor 38 in each of pixels P11 to P1n is rendered conductive. Thus, a reference current at a value in accordance with the voltage of node N3 (in this case, VR) flows from the line of second supply voltage VDR through transistors 36 and 38 to signal line SL, and the voltage of signal line SL increases to a level in accordance with that reference current. Voltages of signal lines SL1 to SLn are provided to output portion 17 through amplifiers Q and selector 16 in FIG. 10.

Then, at a time t14, vertical scanning portion 27 selects pixels P21 to P2n in the second row, selection signal SB2 is caused to rise to the "H" level only for a prescribed period of time, and transistor 38 in each of pixels P21 to P2n is rendered conductive. Here, node N3 has been charged while transfer signals TB1 to TBm are at the "H" level (t1 to t9) and a voltage of node N3 has attained to a level in accordance with a quantity of light incident on photodiode 39 in each pixel P. Therefore, a pixel current at a value in accordance with the voltage of node N3 flows from the line of second supply voltage VDR through transistors 36 and 38 to signal line SL and the voltage of signal line SL increases to a level in accordance with the pixel current. Voltages of signal lines SL1 to SLn are provided to output portion 17 through amplifiers Q and selector 16 in FIG. 10.

Then, at a time t15, reset signal RB2 is caused to rise to the "H" level only for a prescribed period of time, and transistor 34 in each of pixels P21 to P2n is rendered conductive. Thus, node N3 in each of pixels P21 to P2n is reset to second supply voltage VDR. Then, at a time t16, selection signal SB2 is caused to rise to the "H" level only for a prescribed period of time and transistor 38 in each of pixels P21 to P2n is rendered conductive. Thus, a reference current at a value in accordance with the voltage of node N3 (in this case, VR) flows from the line of second supply voltage VDR through transistors 36 and 38 to signal line SL, and the voltage of signal line SL increases to a level in accordance with that reference current. Voltages of signal lines SL1 to SLn are provided to output portion 17 through amplifiers Q and selector 16 in FIG. 10.

Similarly hereafter, a pixel current at a level in accordance with the voltage of node N2 and a reference current at a level in accordance with second supply voltage VDR are output from each of pixels P31 to P3n, . . . , and Pm1 to mn in the third to the mth rows to signal line SL, and a voltage of signal line SL is provided to output portion 17 through amplifier Q and selector 16. Output portion 17 generates an image signal based on a voltage signal provided through selector 16.

As described above, in this photoelectric conversion device, during a period in which transfer signal TA1 is at the "H" level, a current at a level in accordance with a voltage of node N3 flows through signal line SL while an output current from photodiode 39 flows through reset node N2, and during a period in which transfer signal TB1 is at the "H" level, a current at a level in accordance with a voltage of node N2 flows through signal line SL while an output current from photodiode 39 flows through reset node N3. Therefore, an output current from photodiode 39 can be prevented from flowing to node N3 (or N2) during a period in which transfer signal TA1 (or TB1) is at the "H" level.

FIG. 13(a) is a cross-sectional view showing a main portion of pixel array 26, and FIG. 13(b) is a cross-sectional view along the line XIIIB-XIIIB in FIG. 13(a). In FIGS. 13(a) and 13(b), pixel array 26 includes a p-type silicon substrate 50. A read circuit layer 51 is formed on a surface of p-type silicon substrate 50. Read circuit layer 51 is constituted of N-channel MOS transistors 30 to 38, capacitors 40 and 41, a line, an insulating layer, a contact hole, and the like.

A plurality of pixel electrodes 52 are aligned on a surface of read circuit layer 51 at prescribed intervals, in a plurality of rows and a plurality of columns. Each pixel electrode 52 is provided in correspondence with pixel P and formed of Mo in a quadrangular shape. A CIGS thin film 53 is formed to cover the plurality of pixel electrodes 52 and a CdS layer 54 and a transparent electrode 55 are stacked on a surface of CIGS thin film 53. CIGS is abbreviation of $Cu(In_x, Ga_{(1-x)})Se_2$ ($0 \leq x \leq 1$).

CIGS thin film 53 is a p-type compound semiconductor thin film and it has a thickness, for example, of 1.7 μm. CdS layer 54 is a buffer layer formed of an n-type compound semiconductor thin film and it has a thickness, for example, of 50 nm. Transparent electrode 55 is implemented, for example, by a ZnO film and it has a thickness, for example, of 1 μm. Therefore, CIGS thin film 53 and transparent electrode 55 form a PN junction.

In other words, CIGS thin film 53 serving as a photoelectric conversion film is divided into a plurality of pixel regions, transparent electrode 55 is formed on the surface of CIGS thin film 53 with CdS layer 54 serving as a buffer layer being interposed, and pixel electrode 52 is formed in each pixel region on a back surface of CIGS thin film 53. Each pixel electrode 52 serves as the anode of photodiode 39, and transparent electrode 55 serves as the cathode of photodiode 39. First supply voltage VDD is applied to transparent electrode 55 and second supply voltage VDR lower than first supply voltage VDD is applied to each pixel electrode 52.

When light is incident on CIGS thin film 53 from the outside through transparent electrode 55, electron-hole pairs in an amount in accordance with the quantity of light are produced in CIGS thin film 53. Since holes are majority carriers in CIGS thin film 53, holes, that is, positive charges, flow into pixel electrode 52 in the vicinity.

Figure 14:
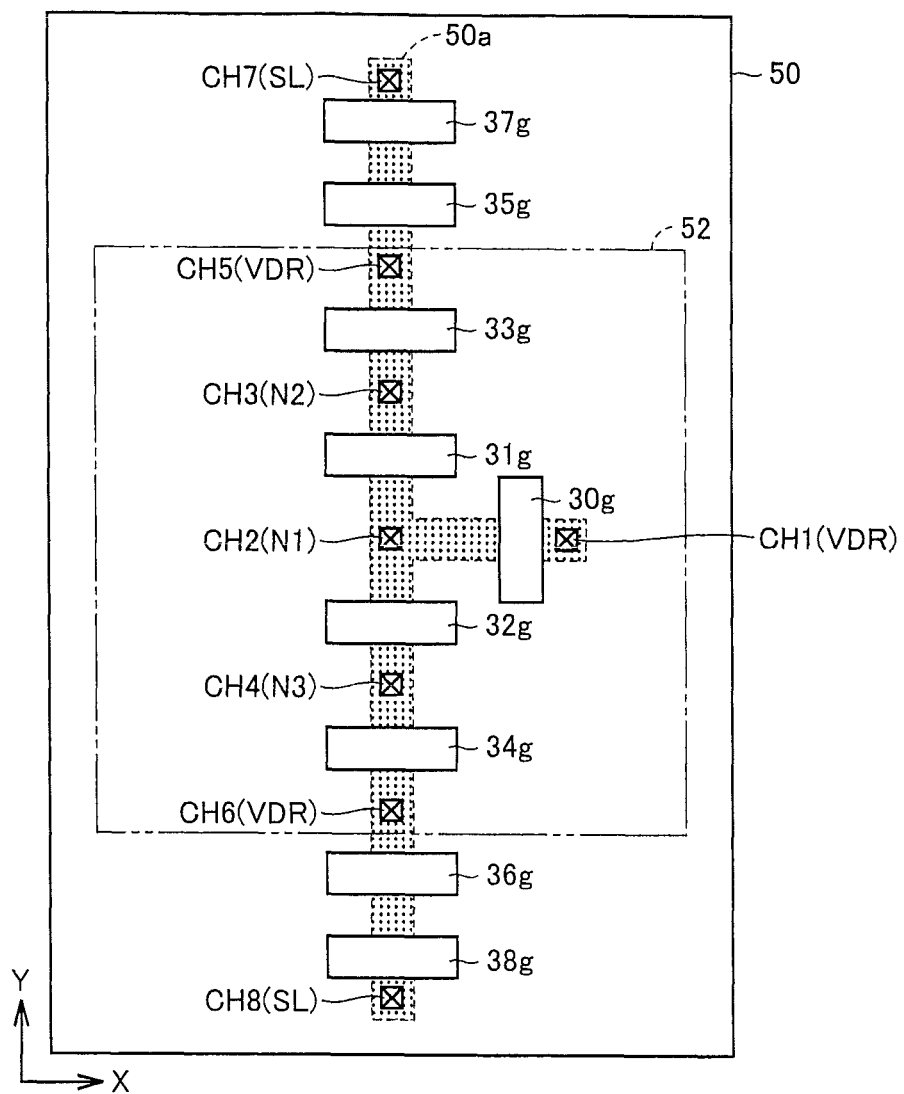
FIG. 14 is a diagram showing a layout of transistors shown in FIG. 11.

FIG. 14 is a diagram showing a layout of transistors 30 to 38 belonging to one pixel P in read circuit layer 51. In FIG. 14, gates 30g to 38g of respective transistors 30 to 38 are formed on the surface of p-type silicon substrate 50. Each of gates 31g to 38g extends in an X direction in FIG. 14, and gate 30g extends in a Y direction in FIG. 14. Gates 37g, 35g, 33g, 31g, 32g, 34g, 36g, and 38g are aligned in this order in the Y direction at prescribed intervals. Gate 30g is arranged at a position distant from the center between gates 31g and 32g, by a prescribed distance in the X direction.

A T-shaped n-type impurity diffusion region 50a is formed in the surface of p-type silicon substrate 50 such that central portions of all gates 30g to 38g are connected to one another.

N-type impurity diffusion region 50a on one sides of gates 30g to 38g serves as the drains of respective transistors 30 to 38. N-type impurity diffusion region 50a on the other sides of gates 30g to 38g serves as the sources of respective transistors 30 to 38.

The drain of transistor 30 (n-type impurity diffusion region 50a of gate 30g on the right in FIG. 14) is connected to the line of second supply voltage VDR through a contact hole CH1. The source of transistor 30 and the drains of transistors 31 and 32 (n-type impurity diffusion region 50a between gates 30g to 32g) are connected to node N1 and the anode of photodiode 39 through a contact hole CH2.

The sources of respective transistors 31 and 33 (n-type impurity diffusion region 50a between gates 31g and 33g) are connected to node N2 and capacitor 40 through a contact hole CH3. The sources of respective transistors 32 and 34 (n-type impurity diffusion region 50a between gates 32g and 34g) are connected to node N3 and capacitor 41 through a contact hole CH4.

The drains of respective transistors 33 and 35 (n-type impurity diffusion region 50a between gates 33g and 35g) are connected to the line of second supply voltage VDR through a contact hole CH5. The drains of respective transistors 34 and 36 (n-type impurity diffusion region 50a between gates 34g and 36g) are connected to the line of second supply voltage VDR through a contact hole CH6.

The source of transistor 37 (n-type impurity diffusion region 30a of gate 37g on an upper side in FIG. 14) is connected to signal line SL through a contact hole CH7. The source of transistor 38 (n-type impurity diffusion region 50a of gate 38g on a lower side in FIG. 14) is connected to signal line SL through a contact hole CH8. Transistors 30 to 34 are arranged under pixel electrode 52.

Figure 15:
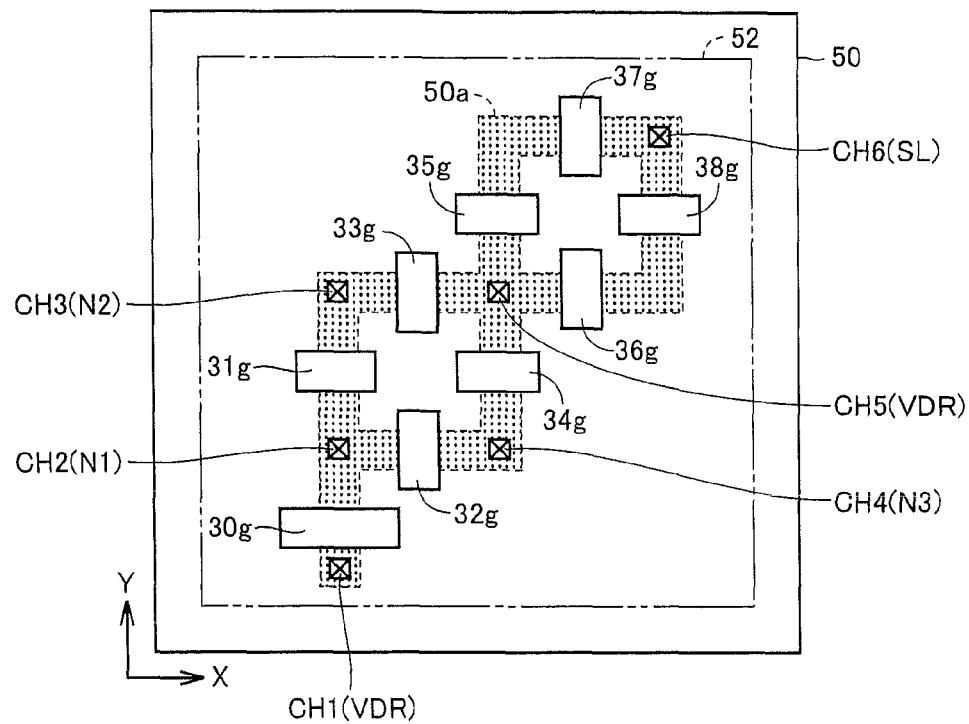
FIG. 15 is a diagram showing a variation of Embodiment 2.

FIG. 15 is a diagram showing a variation of Embodiment 2 and compared with FIG. 14. In FIG. 15, gates 30g to 38g of respective transistors 30 to 38 are formed on the surface of p-type silicon substrate 50. Each of gates 30g, 31g, 34g, 35g, and 38g extends in an X direction in FIG. 15, and each of gates 32g, 33g, 36g, and 37g extends in a Y direction in FIG. 15. Gates 31g, 32g, and 30g are arranged in a bracket shape, gates 31g to 34g are arranged in a cross shape, gates 33g to 36g are arranged in a quadrangular shape, and gates 35g to 38g are arranged in a cross shape.

N-type impurity diffusion region 50a in 8-shape is formed in the surface of p-type silicon substrate 50 such that central portions of all gates 30g to 38g are connected to one another. N-type impurity diffusion region 50a on one sides of gates 30g to 38g serves as drains of respective transistors 30 to 38.

The drain of transistor 30 (n-type impurity diffusion region 50a of gate 30g on a lower side in FIG. 15) is connected to the line of second supply voltage VDR through contact hole CH1. The source of transistor 30 and the drains of respective transistors 31 and 32 (n-type impurity diffusion region 50a between gates 30g to 32g) are connected to node N1 and the anode of photodiode 39 through contact hole CH2.

The sources of respective transistors 31 and 33 (n-type impurity diffusion region 50a between gates 31g and 33g) are connected to node N2 and capacitor 40 through contact hole CH3. The sources of respective transistors 32 and 34 (n-type impurity diffusion region 50a between gates 32g and 34g) are connected to node N3 and capacitor 41 through contact hole CH4.

The drains of respective transistors 33 to 36 (n-type impurity diffusion region 50a among gates 33g to 36g) are connected to the line of second supply voltage VDR through contact hole CH5. The sources of respective transistors 37 and 38 (n-type impurity diffusion region 50a between gates 37g and 38g) are connected to signal line SL through contact hole CH6. Transistors 30 to 38 are arranged under pixel electrode 52.

Embodiment 3

An ordinary CMOS image sensor includes, for example, a plurality of photoelectric conversion elements and a plurality of amplifiers provided in correspondence with the respective photoelectric conversion elements, each for amplifying charges from a corresponding photoelectric conversion element. Then, a good image is obtained even when illuminance is low, by using an output from each amplifier for generating a pixel signal in normal condition and using combined outputs from the amplifiers for generating a pixel signal when illuminance is low. Namely, as signals and noises are added by combining outputs from the amplifiers, the signals are multiplied and the noise increases by root mean square. Therefore, an S/N (Signal to Noise) ratio of a pixel signal is improved. Such a method is adopted also in a CCD (Charge Coupled Device) image sensor.

Such a method, however, has been disadvantageous in that an effect of improvement in the S/N ratio of a pixel signal is low and significant improvement in image quality cannot be expected because noise is added in each amplifier when illuminance is low.

PTL 3, however, does not disclose a configuration for solving such a problem.

Therefore, an object of present Embodiment 3 is to provide a photoelectric conversion device and an image pick-up device capable of achieving significant improvement in image quality.

Figure 16:
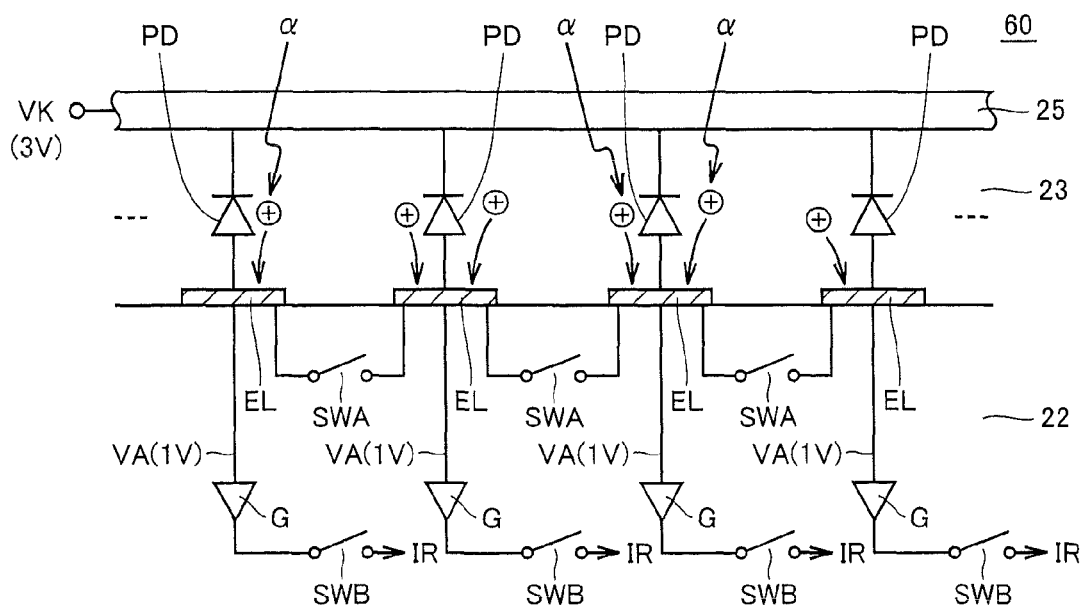
FIG. 16 is a diagram schematically showing a cross-sectional structure and an operation of a pixel array of an image pick-up device according to Embodiment 3 of the present invention.
Figure 17:
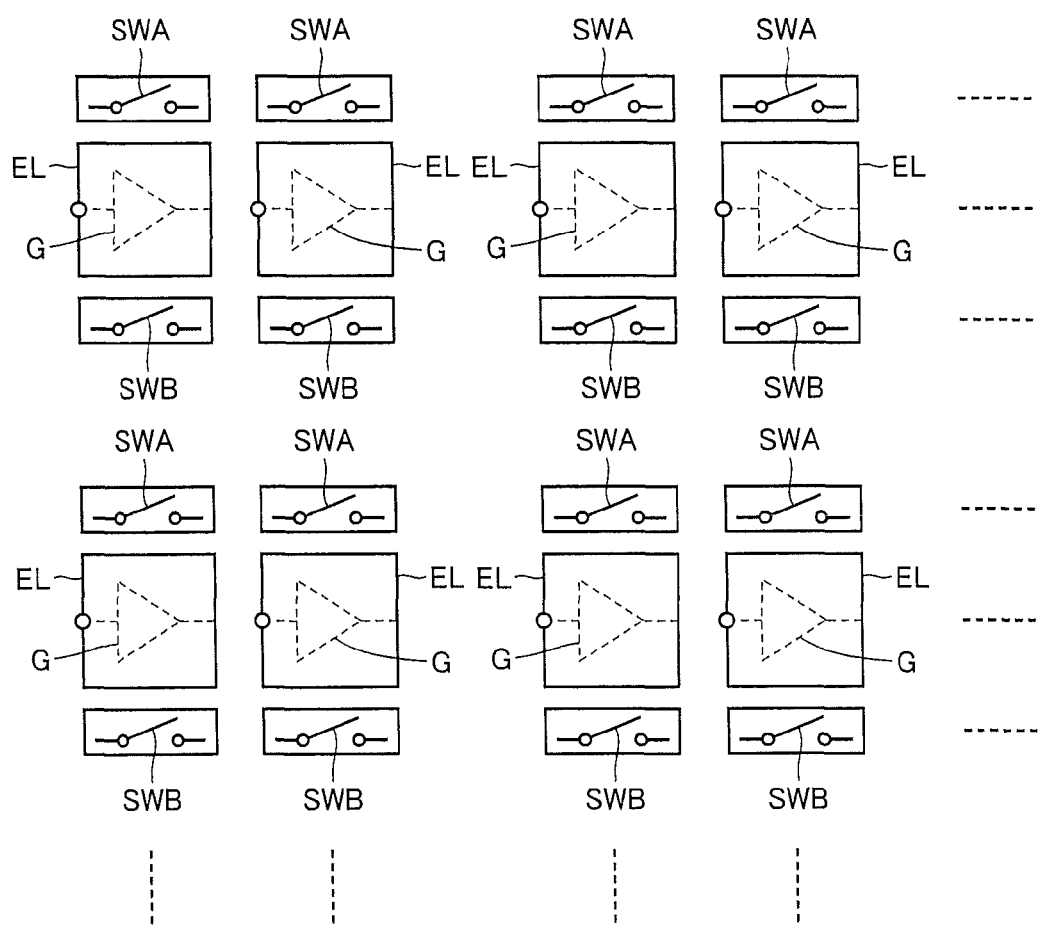
FIG. 17 is a diagram of the pixel array shown in FIG. 16 when viewed from above.

FIG. 16 is a diagram schematically showing a cross-sectional structure and an operation of a pixel array 60 according to Embodiment 3 of the present invention and compared with FIG. 5. FIG. 17 is a diagram of pixel array 60 according to Embodiment 3 of the present invention when viewed from above and compared with FIG. 6.

Referring to FIGS. 16 and 17, pixel array 60 is obtained by adding a plurality of switches SWA to pixel array 10.

Read circuit G is provided in correspondence with pixel electrode EL and formed under corresponding pixel electrode EL in read circuit layer 22. Namely, read circuit G is provided on a side of CIGS thin film 23 opposite to corresponding pixel electrode EL. Thus, the photoelectric conversion device can be made smaller.

During read operation, read circuit G applies anode voltage VA, for example, of 1 V to corresponding pixel electrode EL. In addition, cathode voltage VK, for example, of 3 V, which is higher than anode voltage VA, is applied to transparent electrode 25. Thus, a depletion layer is formed between each pixel electrode EL and transparent electrode 25, and a region between each pixel electrode EL and transparent electrode 25 operates as photodiode PD. Pixel electrode EL serves as the anode of photodiode PD and transparent electrode 25 serves as the cathode of photodiode PD.

When light α is incident on CIGS thin film 23 from the outside through transparent electrode 25, electron-hole pairs in an amount in accordance with the quantity of light are produced in CIGS thin film 23. Since holes are majority carriers in CIGS thin film 23, holes, that is, positive charges, flow into pixel electrode EL in the vicinity. Read circuit G outputs current IR at a level in accordance with the amount of charges that flowed in corresponding pixel electrode EL.

As shown in FIG. 17, switches SWA and SWB are provided at positions opposed to each other, with corresponding pixel electrode EL lying therebetween, in a direction of extension of CIGS thin film 23. Switch SWA is provided in read circuit layer 22 and connected between pixel electrodes EL. Switch SWB is provided in read circuit layer 22 in correspondence with read circuit G, and it has a first terminal connected to an output terminal of corresponding read circuit G and a second terminal connected to corresponding read signal line SL.

Figure 18:
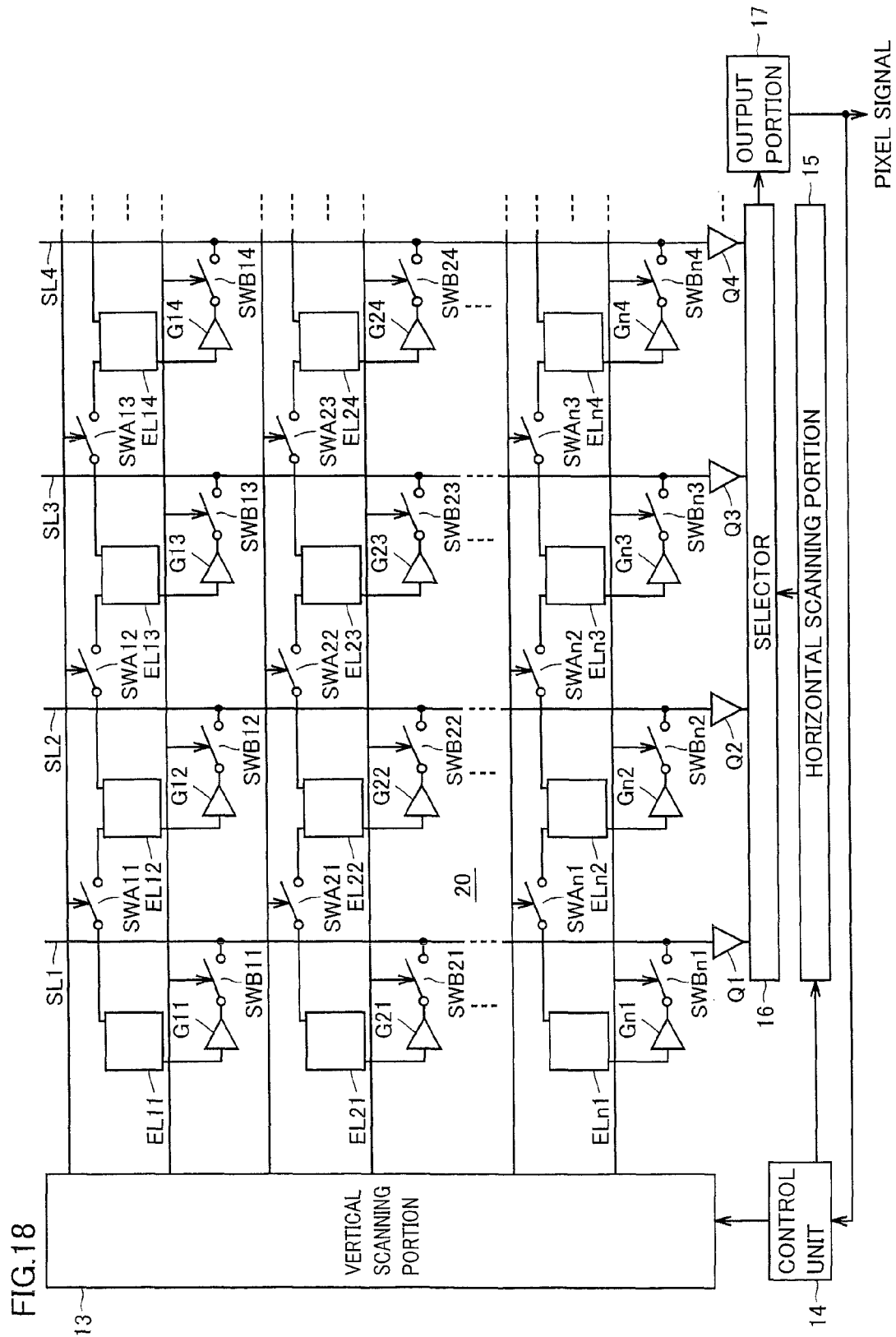
FIG. 18 is a diagram showing relation between a pixel electrode and a switch in the pixel array shown in FIG. 17.

FIG. 18 is a diagram showing relation between a pixel electrode and a switch in the photoelectric conversion device according to Embodiment 3 of the present invention. FIG. 18 representatively shows some of circuits corresponding to pixels in a plurality of rows and a plurality of columns and mainly illustrates an operation of these circuits.

Referring to FIG. 18, pixel array 60 includes a plurality of pixel electrodes EL aligned in n rows and n columns. Here, first, second, . . . , and nth pixel rows are referred to as a pixel row 1, a pixel row 2, . . . , and a pixel row n respectively, and first, second, . . . , and nth pixel columns are referred to as a pixel column 1, a pixel column 2, . . . , and a pixel column n respectively. In one example shown in FIG. 18, n is a natural number not smaller than 3.

Namely, pixel electrodes EL11, EL12, EL13, EL14, and so on correspond to pixel row 1, pixel electrodes EL21, EL22, EL23, EL24, and so on correspond to pixel row 2, and pixel electrodes ELn1, ELn2, ELn3, ELn4, and so on correspond to pixel row n. In addition, pixel electrodes EL11, EL21, . . . , and ELn1 correspond to pixel column 1, pixel electrodes EL12, EL22, . . . , and ELn2 correspond to pixel column 2, pixel electrodes EL13, EL23, . . . , and ELn3 correspond to pixel column 3, and pixel electrodes EL14, EL24, . . . , and ELn4 correspond to pixel column 4 These pixel electrodes correspond to pixel electrode EL described previously.

In correspondence with pixel electrodes EL11, EL12, EL13, EL14, and so on, pixel electrodes EL21, EL22, EL23, EL24, and so on, and pixel electrodes ELn1, ELn2, ELn3, ELn4, and so on, read circuits G11, G12, G13, G14, and so on, read circuits G21, G22, G23, G24, and so on, and read circuits Gn1, Gn2, Gn3, Gn4, and so on are provided. These read circuits correspond to read circuit G described previously.

In correspondence with read circuits G11, G12, G13, G14, and so on, read circuits G21, G22, G23, G24, and so on, and read circuits Gn1, Gn2, Gn3, Gn4, and so on, switches SWB11, SWB12, SWB13, SWB14, and so on, switches SWB21, SWB22, SWB23, SWB24, and so on, and switches SWBn1, SWBn2, SWBn3, SWBn4, and so on are provided. These switches correspond to switch SWB described previously.

In addition, read signal lines SL1, SL2, SL3, and SL4 are provided in correspondence with pixel columns 1 to 4 respectively. These signal lines correspond to read signal line SL described previously.

Amplifiers Q1, Q2, Q3, and Q4 are connected to the other ends of read signal lines SL1, SL2, SL3, and SL4, respectively. These amplifiers correspond to amplifier Q described previously.

Switches SWA11, SWA12, and SWA13 are provided in correspondence with pixel row 1, switches SWA21, SWA22, and SWA 23 are provided in correspondence with pixel row 2, and switches SWAn1, SWAn2, and SWAn3 are provided in correspondence with pixel row n.

Switch SWA11 is connected between pixel electrode EL11 and pixel electrode EL12, switch SWA12 is connected between pixel electrode EL12 and pixel electrode EL13, and switch SWA13 is connected between pixel electrode EL13 and pixel electrode EL14. Switch SWA 21 is connected between pixel electrode EL21 and pixel electrode EL22, switch SWA22 is connected between pixel electrode EL22 and pixel electrode EL23, and switch SWA23 is connected between pixel electrode EL23 and pixel electrode EL24. Switch SWAn1 is connected between pixel electrode ELn1 and pixel electrode ELn2, switch SWAn2 is connected between pixel electrode ELn2 and pixel electrode ELn3, and switch SWAn3 is connected between pixel electrode ELn3 and pixel electrode ELn4.

Then, an operation of control unit 14 will be described in detail. Initially, a case of normal illuminance in which a quantity of light incident on a photoelectric conversion device is at a normal level will be described, and then a case of low illuminance in which a quantity of light incident on a photoelectric conversion device is lower than a normal level will be described. Here, control unit 14 detects a quantity of light incident on a photoelectric conversion device, for example, based on a pixel signal received from output portion 17, and switches between an operation in a case of normal illuminance and an operation in a case of low illuminance based on a result of detection.

[Case of Normal Illuminance]

Vertical scanning portion 13 initially selects pixel row 1 based on a vertical scanning signal provided from control unit 14 and turns on switches SWB11, SWB12, SWB13, and SWB14 in selected pixel row 1. In addition, vertical scanning portion 13 turns off each switch SWB corresponding to pixel rows that have not been selected and turns off also all switches SWA.

Thus, a current at a level in accordance with a quantity of light incident on photodiode PD corresponding to pixel electrodes EL11, EL12, EL13, and EL14 is output from read circuits G11, G12, G13, and G14 in selected pixel row 1 to read signal lines SL1, SL2, SL3, and SL4, and read signal lines SL1, SL2, SL3, and SL4 are charged to voltages at levels in accordance with the quantity of incident light, respectively. Voltages of read signal lines SL1, SL2, SL3, and SL4 are amplified by amplifiers Q1 to Q4 respectively and provided to selector 16.

Then, while vertical scanning portion 13 selects pixel row 1, horizontal scanning portion 15 successively selects one of pixel columns 1, 2, 3, 4, and so on one by one, based on a horizontal scanning signal provided from control unit 14. Selector 16 selects output voltage VD from amplifier Q corresponding to the pixel column selected by horizontal scanning portion 15 and transmits the voltage to output portion 17.

Thereafter, vertical scanning portion 13 successively selects one of pixel row 2 to pixel row n one by one based on a vertical scanning signal provided from control unit 14 and horizontal scanning portion 15 successively selects one of pixel column 1 to pixel column n one by one based on a horizontal scanning signal provided from control unit 14. Thus, an operation similar to that for pixel row 1 above is repeated, and read signals corresponding to all pixels in pixel array 60 are output to output portion 17.

[Case of Low Illuminance]

A case of low illuminance in which a quantity of light incident on a photoelectric conversion device is lower than a normal level will now be described.

Initially, vertical scanning portion 13 selects pixel row 1 based on a vertical scanning signal provided from control unit 14 and turns on every other switch SWA in selected pixel row 1. More specifically, vertical scanning portion 13 turns on switches SWA11 and SWA13 and turns off switch SWA 12. In addition, vertical scanning portion 13 turns on every other switch SWB in selected pixel row 1. More specifically, vertical scanning portion 13 turns on switches SWB11 and SWB13 and turns off switches SWB12 and SWB14. Moreover, vertical scanning portion 13 turns off each switch SWA and each switch SWB corresponding to pixel rows that have not been selected.

Thus, a current at a level in accordance with the total sum of a quantity of light incident on photodiode PD corresponding to pixel electrode EL11 and a quantity of light incident on photodiode PD corresponding to pixel electrode EL12 is output from read circuit G11 to read signal line SL1, and read signal line SL1 is charged to a voltage at a level in accordance with the total sum of the quantities of incident light. Further, a current at a level in accordance with the total sum of a quantity of light incident on photodiode PD corresponding to pixel electrode EL13 and a quantity of light incident on photodiode PD corresponding to pixel electrode EL14 is output from read circuit G13 to read signal line SL3, and read signal line SL3 is charged to a voltage at a level in accordance with the total sum of the quantities of incident light. Voltages of read signal lines SL1 and SL3 are amplified by amplifiers Q1 and Q3 respectively and provided to selector 16.

Then, while vertical scanning portion 13 selects pixel row 1, horizontal scanning portion 15 successively selects every other pixel column one by one based on a horizontal scanning signal provided from control unit 14. Namely, one of pixel columns 1, 3, 5, and so on is successively selected. Selector 16 selects output voltage VD from amplifier Q corresponding to the pixel column selected by horizontal scanning portion 15 and transmits the voltage to output portion 17.

Thereafter, vertical scanning portion 13 successively selects one of pixel row 2 to pixel row n one by one based on a vertical scanning signal provided from control unit 14, and horizontal scanning portion 15 successively selects every other column from among pixel column 1 to pixel column n one by one based on a horizontal scanning signal provided from control unit 14. Thus, an operation similar to that for pixel row 1 above is repeated. Thus, sensitivity of the photoelectric conversion device can be improved, because each pixel electrode EL can be short-circuited by switch SWA and an area of pixel electrodes for reading charges generated in CIGS thin film 23 can be increased while illuminance is low.

Though control unit 14 is configured to combine charges from two pixel electrodes in a case where illuminance is low, it is not limited as such, and it may be configured to combine charges from three or more pixel electrodes. For example, in combining charges from three pixel electrodes, vertical scanning portion 13 turns off every third switch SWA in selected pixel row 1 based on a horizontal scanning signal provided from control unit 14. Namely, switches SWA11 and SWA12 are turned on, switch SWA 13 is turned off, switch SWA14 and not-shown switches SWA15 and SWA16 are turned on, and a not-shown switch SWA17 is turned off. Further, vertical scanning portion 13 turns on every third switch SWB in selected pixel row 1. Namely, switch SWB11 is turned on, switches SWB12 and SWB13 are turned off, switch SWB14 is turned on, and not-shown switches SWB15 and SWB16 are turned off. Furthermore, vertical scanning portion 13 turns off each switch SWA and each switch SWB corresponding to pixel rows that have not been selected.

Then, while vertical scanning portion 13 selects one pixel row, horizontal scanning portion 15 successively selects every third pixel column one by one based on a horizontal scanning signal provided from control unit 14. Namely, one column of pixels 1, 4, 7, and so on is successively selected. Selector 16 selects output voltage VD from amplifier Q corresponding to the pixel column selected by horizontal scanning portion 15 and transmits the voltage to output portion 17.

A conventional method in which an output from each amplifier is used for generating a pixel signal in normal condition and combined outputs from amplifiers are used for generating a pixel signal when illuminance is low, however, has been disadvantageous in that an effect of improvement in the S/N ratio of a pixel signal is low and significant improvement in image quality cannot be expected because noise is added in each amplifier when illuminance is low.

The photoelectric conversion device according to Embodiment 3 of the present invention, however, includes CIGS thin film 23 for converting received light to charges, a plurality of pixel electrodes EL provided on the surface of CIGS thin film 23 and receiving charges converted by CIGS thin film 23, a plurality of read circuits G provided in correspondence with pixel electrodes EL respectively and each outputting a read signal based on charges received by corresponding pixel electrode EL, a plurality of switches SWB provided in correspondence with read circuits G respectively, for switching whether to output the read signal received from corresponding read circuit G or not, and switch SWA connected between pixel electrodes EL.

According to such a configuration, in combining charges received by pixel electrodes, only a read circuit corresponding to one pixel electrode among the pixel electrodes can be used. Namely, influence by noise in the read circuit corresponding to each pixel electrode can be suppressed to that only in a single read circuit. Thus, a voltage transmitted to output portion 17, that is, a signal component in the read signal, can be improved as many times as the number of pixel electrodes to be combined, but a noise component in the read signal transmitted to output portion 17 can be suppressed to noise only in a single read circuit. Therefore, the S/N ratio of the read signal, that is, the S/N ratio of the pixel signal, can significantly be improved and hence image quality can significantly be improved.

Figure 19:
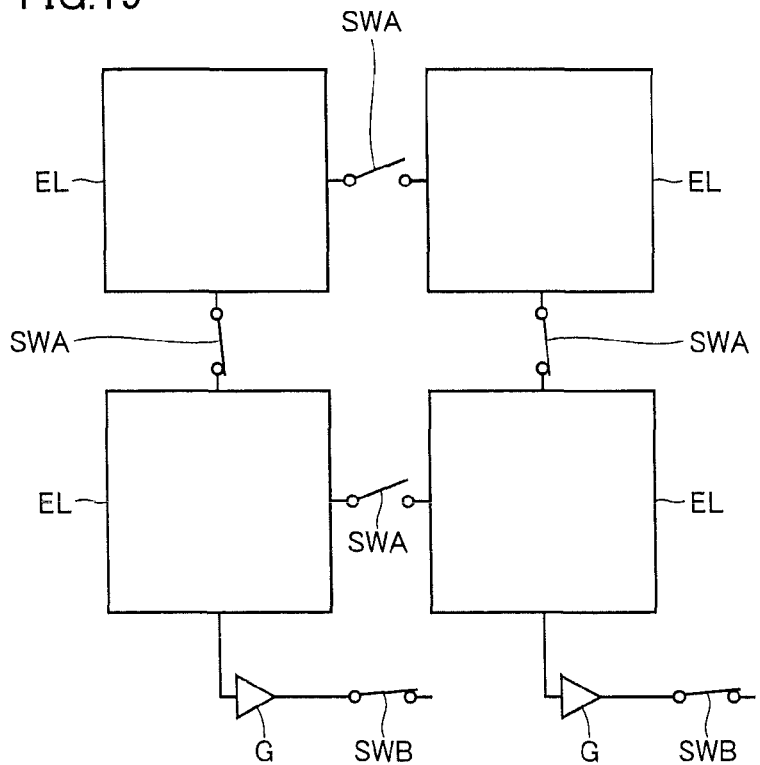
FIG. 19 is a diagram schematically showing a configuration and an operation of a variation of Embodiment 3.
Figure 20:
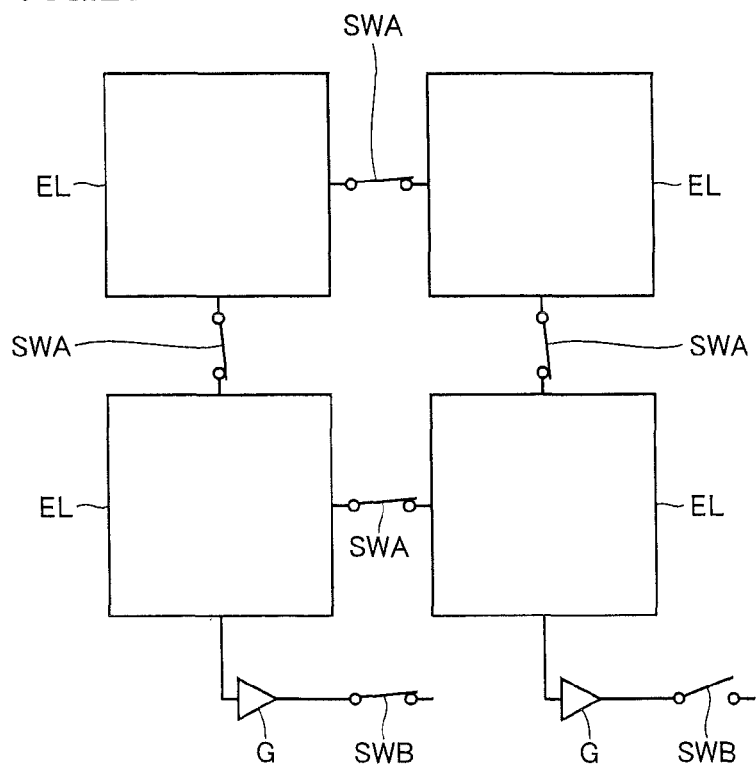
FIG. 20 is a diagram showing another operation in the variation shown in FIG. 19.

FIGS. 19 and 20 are diagrams schematically showing a configuration of a variation of the photoelectric conversion device according to Embodiment 3 of the present invention.

Referring to FIGS. 19 and 20, in pixels P arranged in two rows and two columns, two switches SWA are connected between respective pairs of pixel electrodes EL adjacent in the pixel row. In addition, two other switches SWA are connected between respective pairs of pixel electrodes EL adjacent in the pixel column. Then, two read circuits G are provided in correspondence with the pixel columns respectively.

In a case of normal illuminance, as shown in FIG. 19, switch SWA connected between pixel electrodes EL adjacent in the pixel column is turned on, switch SWA connected between pixel electrodes EL adjacent in the pixel row is turned off, and each switch SWB is turned on. Thus, charges received by two pixel electrodes EL are combined to thereby generate two pixel signals.

In a case of low illuminance, as shown in FIG. 20, switch SWA connected between pixel electrodes EL adjacent in the pixel column is turned on, switch SWA connected between pixel electrodes EL adjacent in the pixel row is turned on, and any of switches SWB is turned on. Thus, charges from four pixel electrodes EL are combined to thereby generate one pixel signal.

Figure 21:
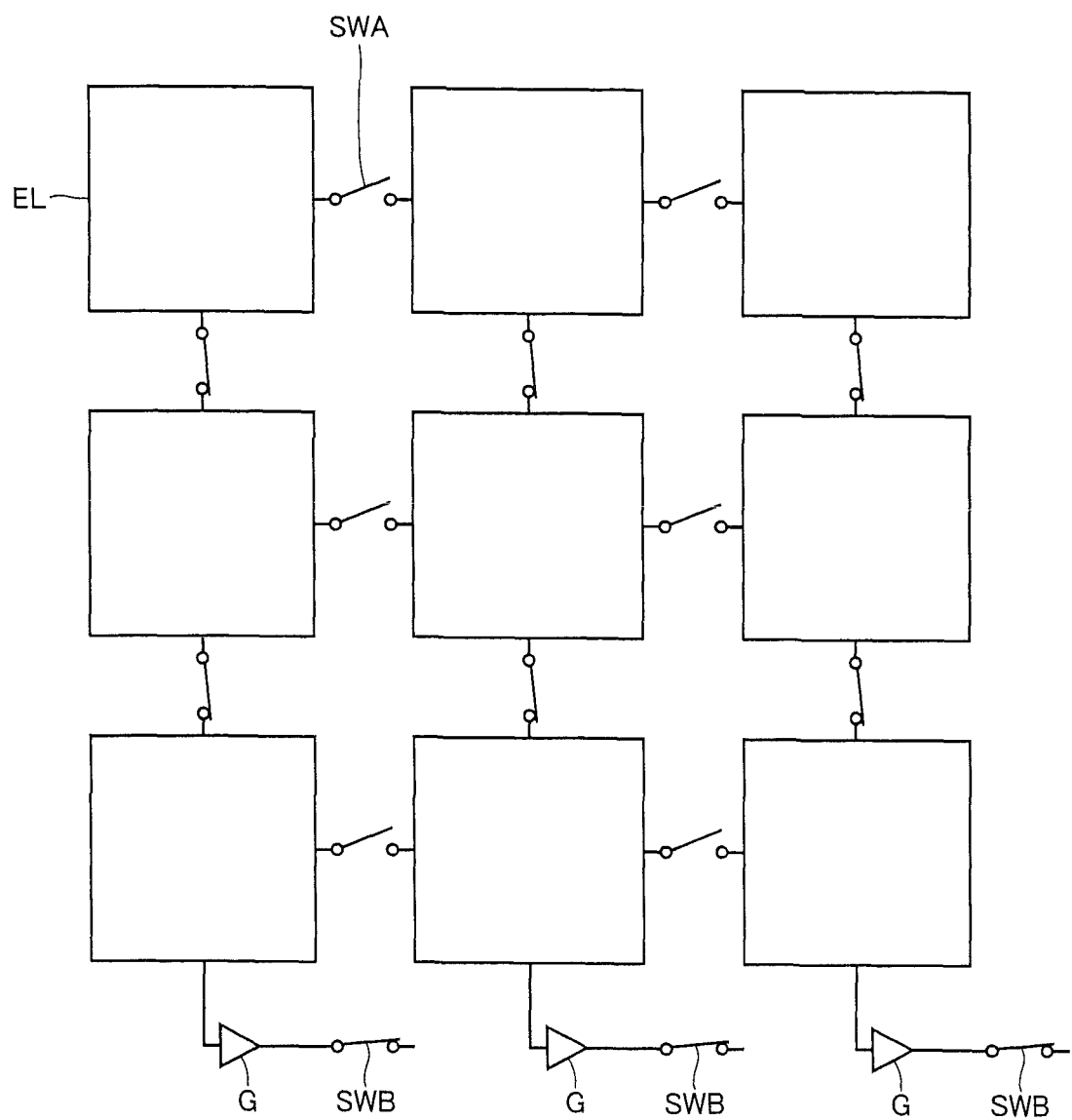
FIG. 21 is a diagram schematically showing a configuration and an operation of another variation of Embodiment 3.
Figure 22:
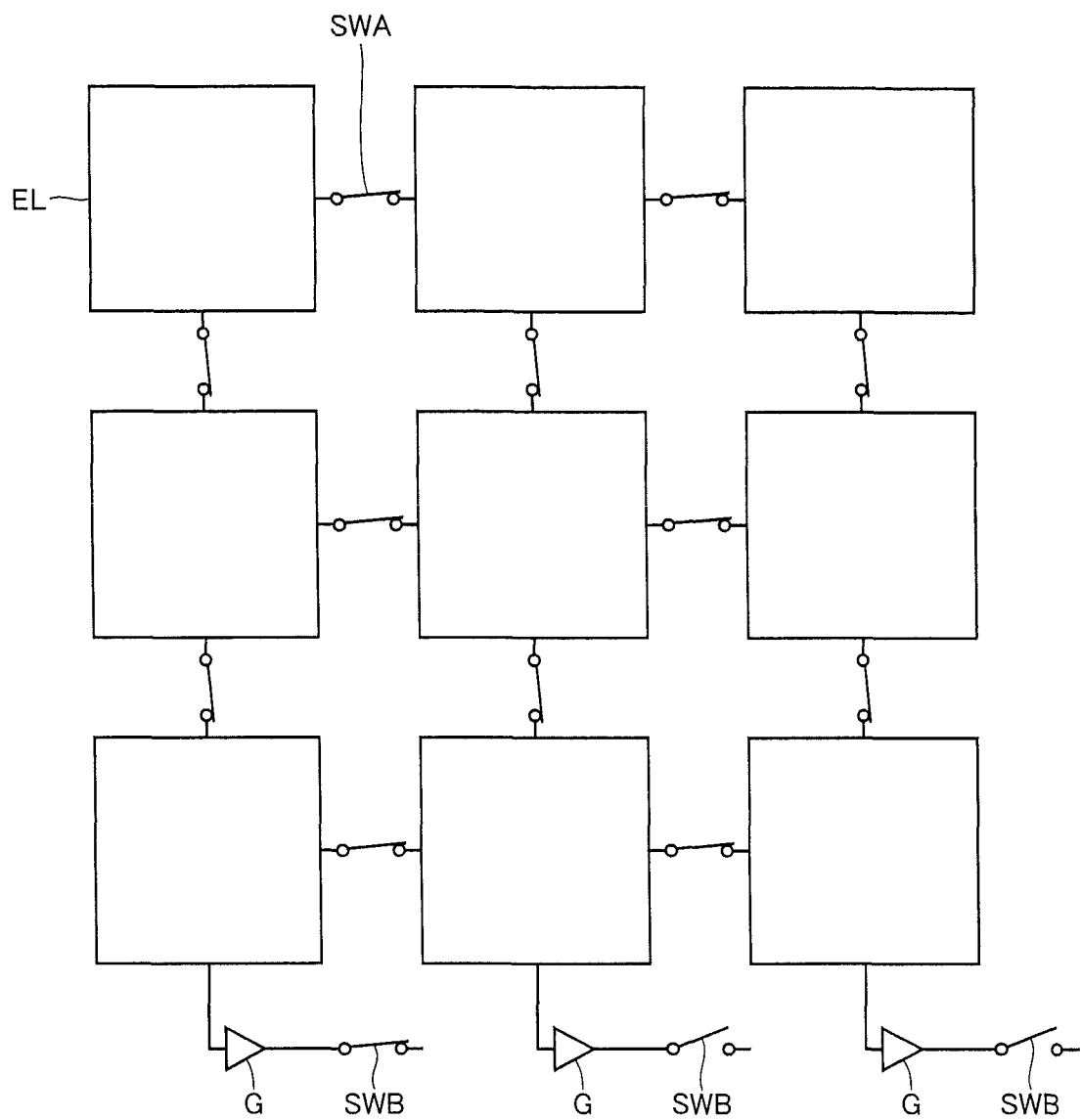
FIG. 22 is a diagram showing another operation in the variation shown in FIG. 21.

FIGS. 21 and 22 are diagrams schematically showing a configuration of another variation of the photoelectric conversion device according to Embodiment 3 of the present invention.

Referring to FIGS. 21 and 22, in pixels P arranged in three rows and three columns, six switches SWA are connected between respective pairs of pixel electrodes EL adjacent in the pixel row. In addition, six other switches SWA are connected between respective pairs of pixel electrodes EL adjacent in the pixel column. Then, three read circuits G are provided in correspondence with the pixel columns respectively.

In a case of normal illuminance, as shown in FIG. 21, each switch SWA connected between pixel electrodes EL adjacent in the pixel column is turned on, each switch SWA connected between pixel electrodes EL adjacent in the pixel row is turned off, and each switch SWB is turned on. Thus, charges received by three pixel electrodes EL are combined to thereby generate three pixel signals.

In a case of low illuminance, as shown in FIG. 22, each switch SWA connected between pixel electrodes EL adjacent in the pixel column is turned on, each switch SWA connected between pixel electrodes EL adjacent in the pixel row is turned on, and any of switches SWB is turned on. Thus, charges from nine pixel electrodes EL are combined to thereby generate one pixel signal, so that image quality when illuminance is low can further be improved as compared with the photoelectric conversion device according to Embodiment 3 of the present invention.

Figure 23:
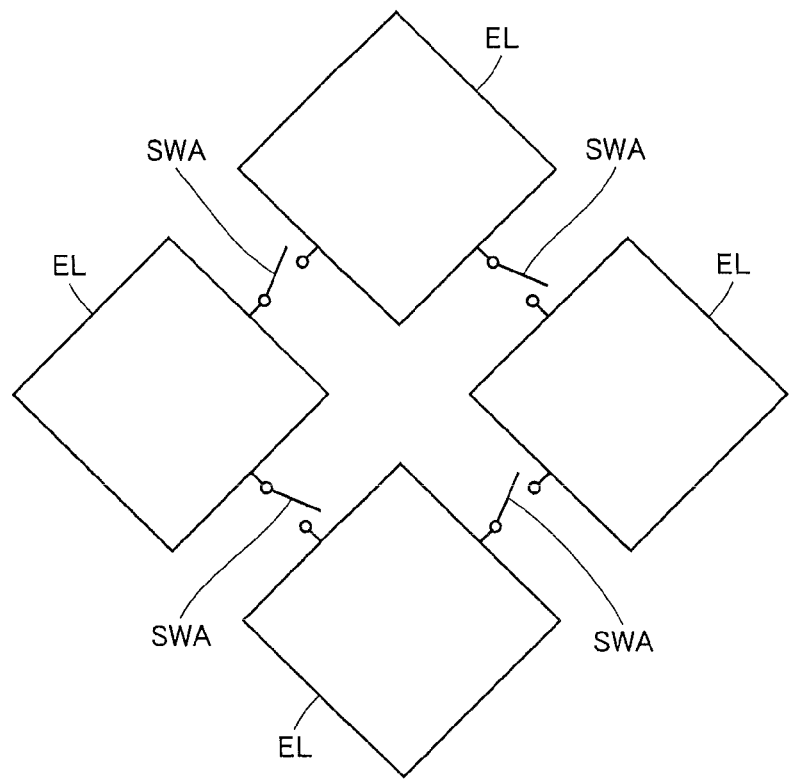
FIG. 23 is a diagram schematically showing a configuration of yet another variation of Embodiment 3.

FIG. 23 is a diagram showing a configuration of another variation of the pixel electrode according to Embodiment 3 of the present invention.

Referring to FIG. 23, this variation is configured such that each pixel electrode EL shown in FIGS. 19 and 20 is arranged obliquely, for example, at an angle of 45 degrees.

Figure 24:
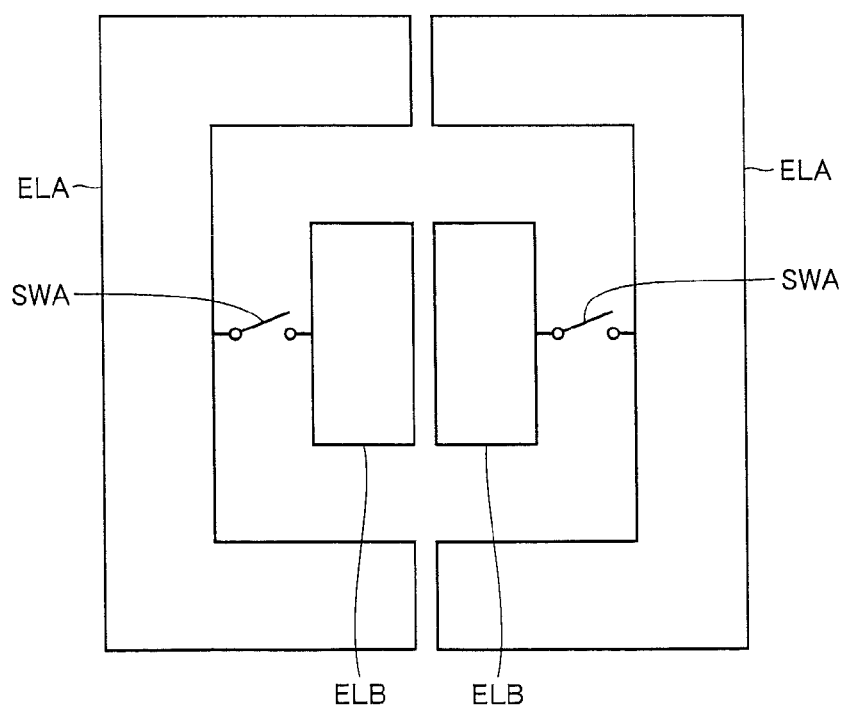
FIG. 24 is a diagram schematically showing a configuration of yet another variation of Embodiment 3.

FIG. 24 is a diagram showing a configuration of another variation of the pixel electrode according to Embodiment 3 of the present invention.

Referring to FIG. 24, two pixel electrodes ELA are opposed to each other as if each formed a half of a rectangular frame. In addition, two rectangular pixel electrodes ELB are provided in a space formed by two pixel electrodes ELA and opposed to each other. Two switches SWA are connected between respective pairs of pixel electrodes ELA and ELB opposed to each other.

Figure 25:
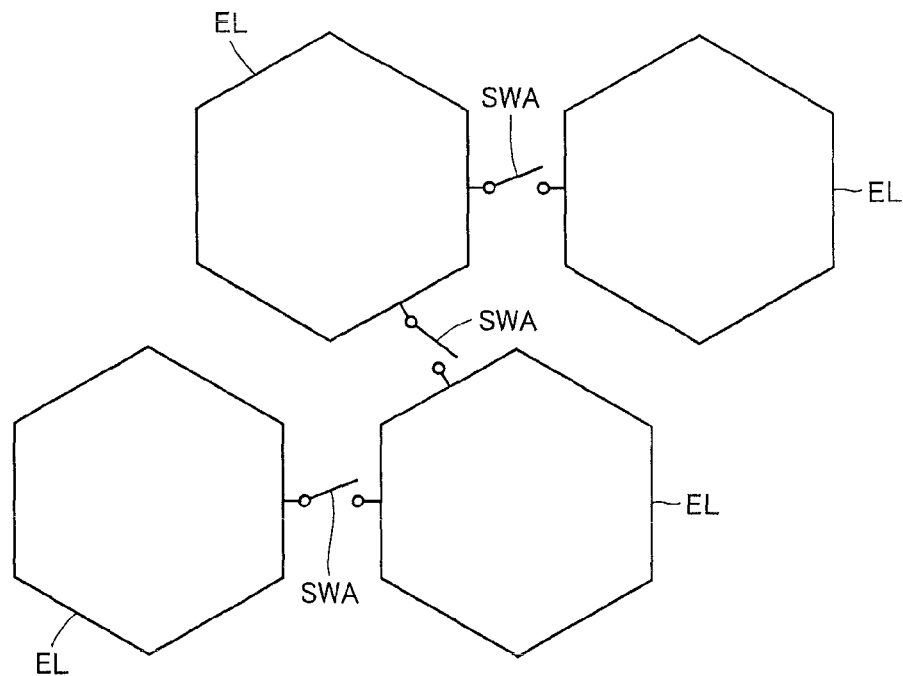
FIG. 25 is a diagram schematically showing a configuration of yet another variation of Embodiment 3.

FIG. 25 is a diagram showing a configuration of another variation of the pixel electrode according to Embodiment 3 of the present invention.

Referring to FIG. 25, each pixel electrode EL has a hexagonal shape. Three switches SWA are connected between respective pairs of adjacent pixel electrodes EL.

Figure 26:
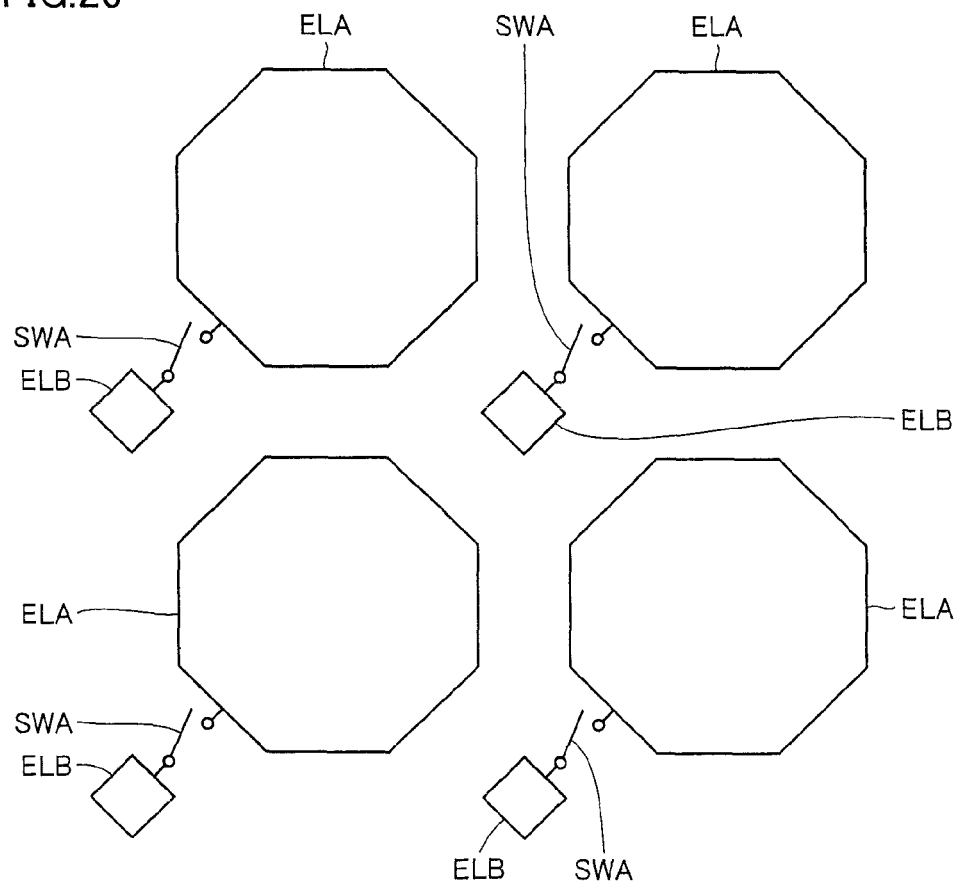
FIG. 26 is a diagram schematically showing a configuration of yet another variation of Embodiment 3.

FIG. 26 is a diagram showing a configuration of another variation of the pixel electrode according to Embodiment 3 of the present invention.

Referring to FIG. 26, four pixel electrodes ELA each have an octagonal shape. In addition, four pixel electrodes ELB each have a quadrangular shape. Four switches SWA are connected between respective pairs of adjacent pixel electrodes ELA and ELB.

Figure 27:
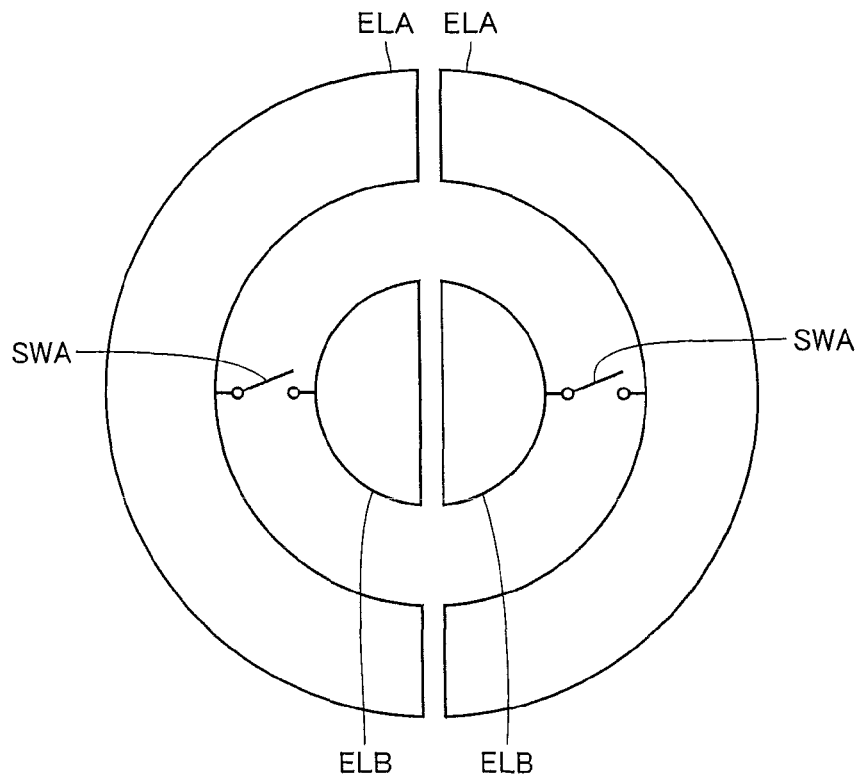
FIG. 27 is a diagram schematically showing a configuration of yet another variation of Embodiment 3.

FIG. 27 is a diagram showing a configuration of another variation of the pixel electrode according to Embodiment 3 of the present invention.

Referring to FIG. 27, two pixel electrodes ELA are opposed to each other as if each formed a half of a circular frame. In addition, two semicircular pixel electrodes ELB are provided in a space formed by two pixel electrodes ELA and opposed to each other. Two switches SWA are connected between respective pairs of pixel electrodes ELA and ELB opposed to each other.

Figure 28:
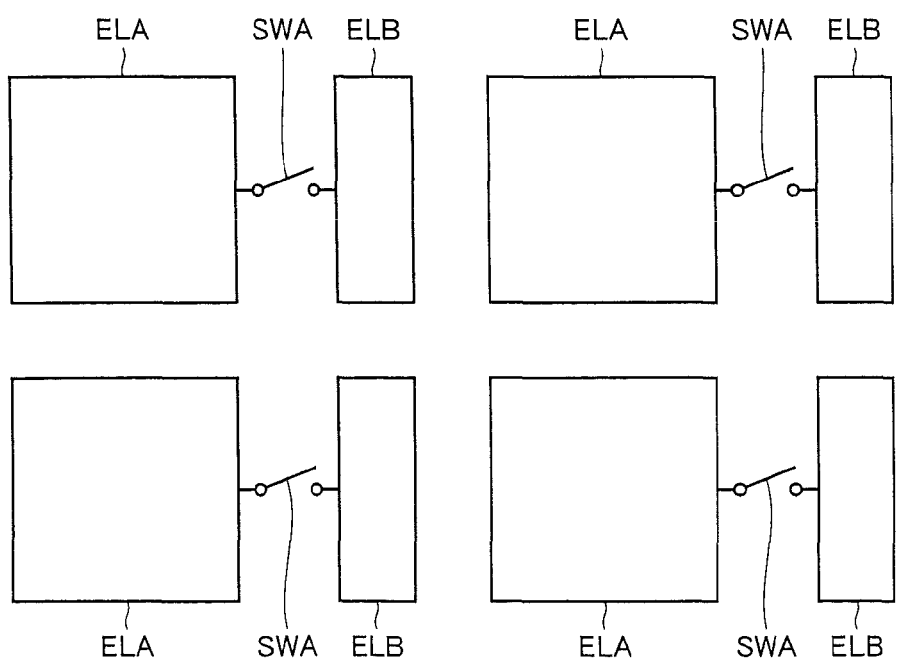
FIG. 28 is a diagram schematically showing a configuration of yet another variation of Embodiment 3.

FIG. 28 is a diagram showing a configuration of another variation of the pixel electrode according to Embodiment 3 of the present invention.

Referring to FIG. 28, rectangular pixel electrode ELA and rectangular pixel electrode ELB smaller than pixel electrode ELA are alternately arranged in a direction of a pixel row.

Though pixel array 60 according to Embodiment 3 of the present invention is configured to include a CIGS thin film, the pixel array is not limited as such. Any of a photoelectric conversion thin film and a photoelectric conversion thick film may be employed, and a configuration may include, for example, a compound semiconductor thin film, an organic semiconductor thin film, and the like other than the CIGS thin film. In addition, the present invention is also applicable to a photosensor, a line sensor and the like, without limited to the photoelectric conversion device.

Moreover, though pixel array 60 according to Embodiment 3 of the present invention is configured to include a plurality of pixels P aligned in a plurality of rows and a plurality of columns, the pixel array is not limited as such. The configuration should only be such that pixel array 60 includes two pixels P, switch SWA is connected between pixel electrodes EL in these two pixels P, and control unit 14 selectively carries out such control as turning on switch SWA, turning on switch SWB corresponding to any pixel electrode EL of two pixel electrodes EL connected to switch SWA, and turning off switch SWB corresponding to the other pixel electrode EL and such control as turning off switch SWA and turning on switch SWB corresponding to each pixel electrode EL.

Further, though pixel array 60 according to Embodiment 3 of the present invention is configured such that switch SWA is connected between pixel electrodes adjacent in a pixel row, the pixel array is not limited as such. Switch SWA may be configured to be connected between pixel electrodes adjacent in a pixel column. In this case, control unit 14 combines charges from a plurality of pixel electrodes adjacent in a pixel column when illuminance is low.

Embodiment 4

A solid-state image sensing device adopting a general single-chip color system includes, for example, an IR cut-off filter for cutting off near-infrared rays in a near-infrared region in a wavelength from 700 nm (nanometer) to 1000 nm and RGB color filters in Bayer arrangement. Then, in normal condition such as during daytime, the solid-state image sensing device operates as a color camera with the IR cut-off filter and the RGB color filters being combined, and when illuminance is low such as during night, the solid-state image sensing device operates as a monochrome camera with the IR cut-off filter being removed from an optical axis.

According to such a configuration, however, an IR cut-off filter and a mechanical structure for arranging the IR cut-off filter on the optical axis or removing the same from the optical axis are required, which leads to increase in manufacturing cost and increase in size.

PTL 3, however, does not disclose a configuration for solving such a problem.

Therefore, an object of present Embodiment 4 is to provide an image pick-up device and a photoelectric conversion device capable of serving as both of a color camera and a monochrome camera, avoiding increase in manufacturing cost, and achieving reduction in size.

Figure 29:
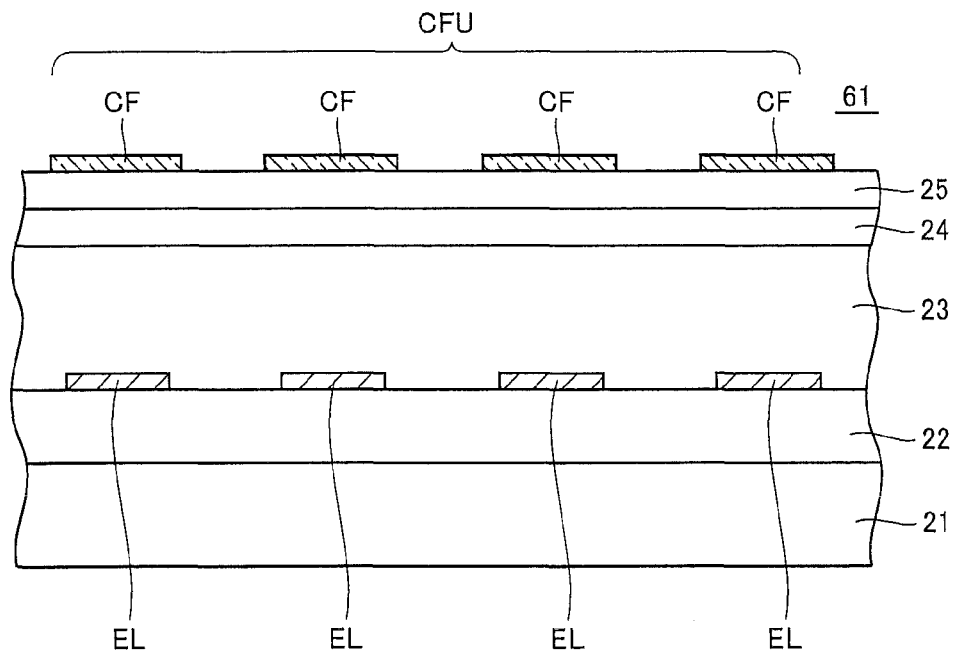
FIG. 29 is a diagram showing a cross-sectional structure of a main portion of a pixel array of an image pick-up device according to Embodiment 4 of the present invention.

FIG. 29 is a diagram showing a cross-sectional structure of a main portion of a pixel array 61 of the image pick-up device according to Embodiment 4 of the present invention and compared with FIG. 4.

Referring to FIG. 29, pixel array 61 includes semiconductor substrate 21, read circuit layer 22, a plurality of pixel electrodes EL, CIGS thin film 23, CdS (cadmium sulfide) layer 24, transparent electrode 25, and a color filter portion CFU.

Color filter portion CFU is provided on a side of the surface of transparent electrode 25, that is, CIGS thin film 23, opposite to pixel electrode EL. Color filter portion CFU includes a plurality of color filters CF. Color filter CF is provided in correspondence with each pixel electrode EL.

Figure 30:
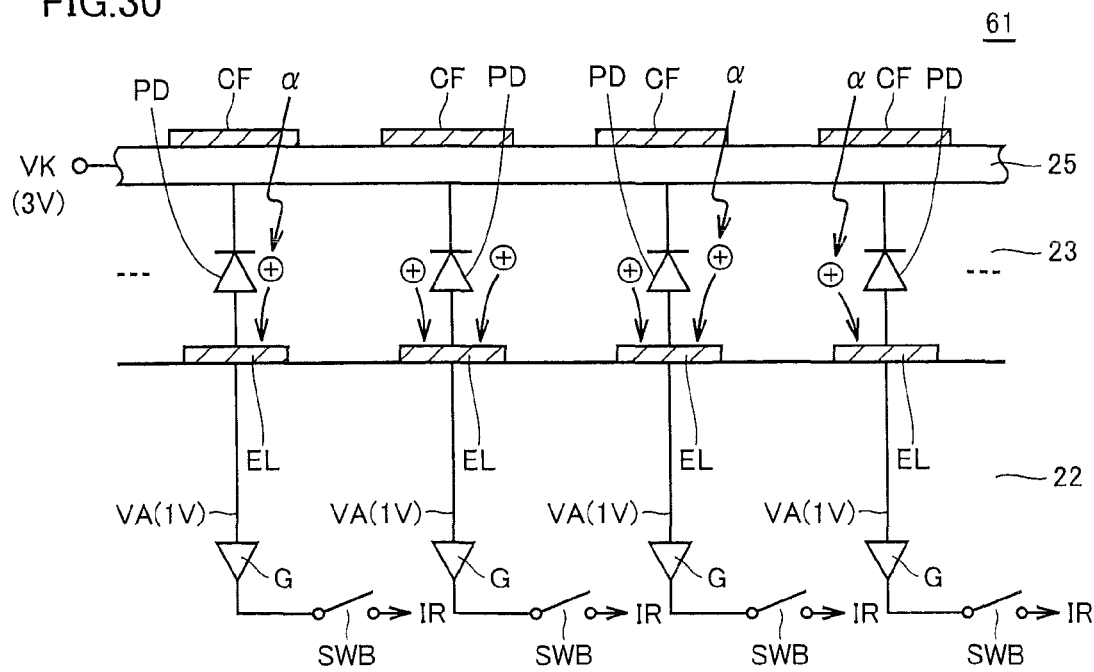
FIG. 30 is a diagram schematically showing a cross-sectional structure and an operation of the pixel array shown in FIG. 29.

FIG. 30 is a diagram schematically showing a cross-sectional structure and an operation of pixel array 61 according to Embodiment 4 of the present invention.

Referring to FIG. 30, read circuit G is provided in correspondence with pixel electrode EL and formed under corresponding pixel electrode EL in read circuit layer 22 shown in FIG. 29. Namely, read circuit G is provided on a side of CIGS thin film 23, opposite to corresponding pixel electrode EL. Thus, the photoelectric conversion device can be made smaller.

During read operation, read circuit G applies anode voltage VA, for example, of 1 V to corresponding pixel electrode EL. In addition, cathode voltage VK, for example, of 3 V, which is higher than anode voltage VA, is applied to transparent electrode 25. Thus, a depletion layer is formed between each pixel electrode EL and transparent electrode 25, and a region between each pixel electrode EL and transparent electrode 25 operates as photodiode PD. Pixel electrode EL serves as the anode of photodiode PD and transparent electrode 25 serves as the cathode of photodiode PD.

When light α is incident on CIGS thin film 23 from the outside through color filter portion CFU and transparent electrode 25, electron-hole pairs in an amount in accordance with the quantity of light are produced in CIGS thin film 23. Since holes are majority carriers in CIGS thin film 23, holes, that is, positive charges, flow into pixel electrode EL in the vicinity. Read circuit G outputs current IR at a level in accordance with the amount of charges that flowed in corresponding pixel electrode EL.

Switch SWB is provided in read circuit layer 22 in correspondence with read circuit G, and it has a first terminal connected to an output terminal of corresponding read circuit G and a second terminal connected to corresponding read signal line SL.

FIG. 31 is a diagram showing color arrangement of color filters for one pixel in the image pick-up device according to Embodiment 4 of the present invention.

Referring to FIG. 31, color filter portion CFU includes color filters CF of four colors aligned in Bayer arrangement. Namely, color filter portion CFU includes a color filter CF of W (white), a color filter CF of Ye (yellow), a color filter CF of Cy (cyan), and a color filter CF of Bk (black).

Color filter portion CFU is provided with a black color filter having a transmission characteristic in a near-infrared region. The black color filter has such a characteristic as permitting passage of substantially no visible light in a wavelength from 400 nm to 700 nm but permitting passage of near-infrared rays.

Here, light passing through color filter portion CFU includes also mid-infrared rays and far-infrared rays. Since a wavelength of light photoelectrically converted by CIGS thin film 23 is substantially not longer than 1300 nm, however, a read signal output from read circuit G is an electric signal corresponding to a wavelength component in the near-infrared region.

FIG. 32 is a diagram showing transmittance of a color filter of each of white, yellow and cyan.

Referring to FIG. 32, the color filters of yellow and cyan allow passage of light of that color in a visible light region, and also allow passage of light in the near-infrared region. In addition, the white color filter allows passage of visible light and near-infrared rays.

An operation of the image pick-up device according to Embodiment 4 of the present invention for generating an image signal will now be described in detail. An overall configuration of the image pick-up device is as described with reference to FIGS. 1 to 3.

The image pick-up device operates as a color camera having the RGB color filters by employing white, yellow and cyan in normal condition such as during daytime. In addition, the image pick-up device operates as a monochrome camera by using white, yellow, cyan, and black while illuminance is low such as during night.

In the following, W, Ye, Cy, and Bk represent electric signals obtained as a result of passage and conversion of light from lens 2 through the respective color filters of white, yellow, cyan, and black. Namely, they represent read signals from read circuits G described previously. In addition, R, G and B represent electric signals corresponding to wavelength components of red, green and blue, respectively, and IR represents an electric signal corresponding to a wavelength component in the near-infrared region.

Initially, W, Ye, Cy, and Bk have color components expressed in the following formulae, respectively.

$$W = R+G+B+IR$$

$$Ye = R+G+IR$$

$$Cy = G+B+IR$$

$$Bk = IR$$

Based on this relation, image signal processing portion 4 calculates electric signals R, G and B for obtaining an RGB color image, in accordance with the following formula.

$$G = W-R-B-Bk$$

More specifically, G is derived as follows.

$$\begin{aligned} W - R - B - Bk &= \Delta W + Cy + Ye - Bk \\ &= -(R + G + B + IR) + (G + B + IR) + \\ &\quad (R + G + IR) \\ &= G + IR - IR \\ &= G \end{aligned}$$

$$R = W - Cy$$

More specifically, R is derived as follows.

$$\begin{aligned} W - Cy &= R + G + B + IR - (G + B + IR) \\ &= R \end{aligned}$$

$$B = W - Ye$$

More specifically, B is derived as follows.

$$\begin{aligned} W - Ye &= R + G + B + IR - (R + G + IR) \\ &= B \end{aligned}$$

Namely, each of a signal W, a signal Ye, a signal Cy, and a signal Bk has an IR (near-infrared region) component, however, these IR components are canceled. Therefore, signals R, G and B can be obtained based on signal W, signal Ye, signal Cy, and signal Bk.

In addition, a luminance signal Y for obtaining an RGB color image is calculated in accordance with the following formula.

$$Y = W + IR + Cy + IR + Ye + IR = 2 \times R + 3 \times G + 2 \times B + 3 \times IR$$

Moreover, image signal processing portion 4 calculates a signal B/W for obtaining a monochrome image in accordance with the following formula.

$$B/W = W + Cy + Ye + Bk = 2 \times R + 3 \times G + 2 \times B + 4 \times IR$$

FIG. 33 is a diagram showing transmittance of a color filter of each of red, green and blue.

Image signal processing portion 4 can perform interlace processing and interleave processing in an NTSC system on the number of pixels of VGA at a reading rate of 60 fps (frame/second) by using the color filters in color arrangement as shown in FIG. 31. Thus, an RGB color image realized by the RGB color filters having such a transmission characteristic as shown in FIG. 33 can be obtained.

The color filter portion in color arrangement as shown in FIG. 31 is used, for example, in such a case where the number of pixels in a horizontal direction is small. In addition, image signal processing portion 4 obtains a wavelength component in the near-infrared region from the black color filter.

Here, the configuration using the RGB color filters achieves high color reproducibility but it is poor in a utilization factor of light.

The image pick-up device according to Embodiment 4 of the present invention, however, is configured to use color filters of four colors. Therefore, as compared with the configuration in which RGB color filters are used, sensitivity is poorer during the daytime, whereas the image pick-up device achieves high performance as a color camera and a monochrome camera as a whole, because it achieves a high utilization factor of light.

Figure 34:
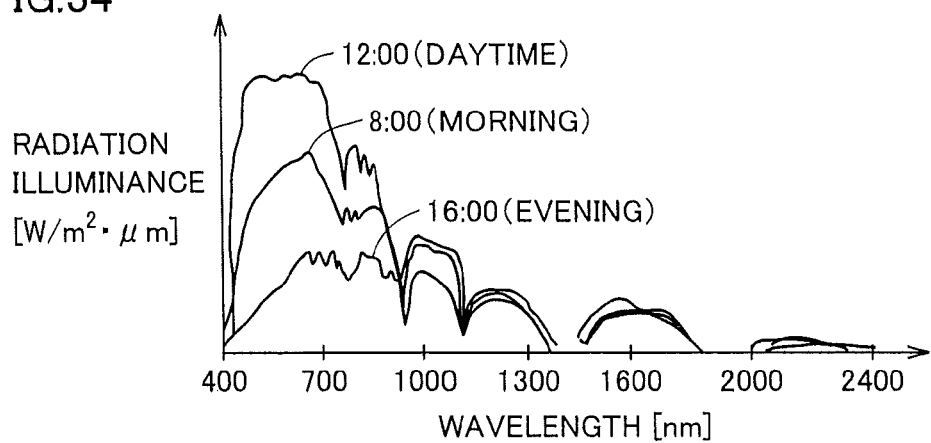
FIG. 34 is a diagram showing spectrum distribution of solar rays.

FIG. 34 is a diagram showing spectrum distribution of solar rays.

Referring to FIG. 34, solar rays are great in temporal change in intensity of light in the visible light region, less in temporal change in intensity of light in the near-infrared region, and further less in temporal change in intensity of light in a wavelength not shorter than 1000 nm.

Namely, intensity of visible light is high from the morning through the daytime to the evening, and a signal of intensity almost twice as high as near-infrared rays is obtained. Therefore, with the image pick-up device according to Embodiment 4 of the present invention, a utilization factor of light substantially comparable to the RGB filters can be obtained with the configuration using the color filters of four colors from the morning through the daytime to the evening. Further, sensitivity in the near-infrared region is improved during the night and thus a utilization factor of light can be enhanced.

In addition, as shown in FIG. 34, a solar ray spectrum substantially does not exist around 800 nm and around 1100 nm.

Then, light around 800 nm or around 1100 nm is emitted from an LED (Light Emitting Diode) or the like and received by the black color filter in photoelectric conversion device 3, so that light from a transmission side can satisfactorily be received without being affected by solar rays. Thus, a color camera, a monochrome camera, and an object detection camera having good light reception characteristics can be realized.

Unlike the CIGS thin film, an organic thin film is low in sensitivity in the near-infrared region. Since the image pick-up device according to Embodiment 4 of the present invention including the CIGS thin film as the photoelectric conversion film can satisfactorily receive light in the near-infrared region and obtain good light reception characteristics even when illuminance is low, both of a color camera and a monochrome camera with good performance can be realized.

Figure 35:
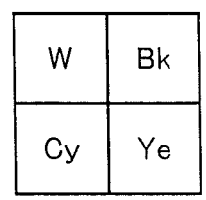
FIG. 35 is a diagram showing a variation of color arrangement of color filters for one pixel in an image pick-up device according to Embodiment 4.
Figure 36:
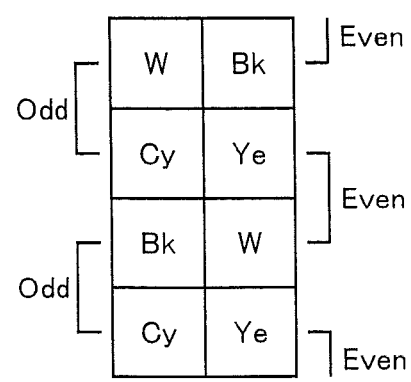
FIG. 36 is a diagram showing interlace processing and interleave processing in the variation shown in FIG. 35.

FIG. 35 is a diagram showing a variation of color arrangement of color filters for one pixel in the image pick-up device according to Embodiment 4 of the present invention. FIG. 36 is a diagram showing interlace processing and interleave processing in the variation shown in FIG. 35.

Referring to FIG. 35, color filter portion CFU includes as the color filters of four colors, a color filter CF of W (white), a color filter CF of Ye (yellow), a color filter CF of Cy (cyan), and a color filter CF of Bk (black). In this variation, the white color filter and the black color filter are aligned in the horizontal direction. This alignment is used, for example, in a case where the number of pixels in a vertical direction is great.

Referring to FIG. 36, in performing interlace processing in the NTSC system, addition of W and Cy and addition of Bk and Cy are performed in an Odd field, and addition of Ye and W and addition of Ye and Bk are performed in an Even field.

Thus, interlace processing at 30 fps can be performed at a reading rate of 60 fps (frame/second). Namely, resolution in the vertical direction can be improved as compared with the configuration shown in FIG. 31.

FIG. 37 is a diagram showing a variation of color arrangement of color filters for one pixel in the image pick-up device according to Embodiment 4 of the present invention.

Referring to FIG. 37, in this variation, the white color filter and the black color filter are aligned in the vertical direction. This alignment is used, for example, in a case where the number of pixels in the horizontal direction is great.

FIG. 38 is a diagram showing a variation of color arrangement of color filters for one pixel in the image pick-up device according to Embodiment 4 of the present invention.

Referring to FIG. 38, color filter portion CFU includes color filters CF of four colors aligned in Bayer arrangement. Namely, color filter portion CFU includes a color filter CF of W (white), a color filter CF of Ye (yellow), a color filter CF of Cy (cyan), and a color filter CF of Gr (green).

Thus, as compared with the image pick-up device according to Embodiment 4 of the present invention, a utilization factor of light can further be improved by using a green color filter instead of black.

On the other hand, the image pick-up device according to Embodiment 4 of the present invention can achieve further improved near-infrared ray reception characteristics by using the black color filter rather than green. Namely, since the image pick-up device according to Embodiment 4 of the present invention includes the CIGS thin film as the photoelectric conversion film, it is advantageous in its ability to satisfactorily receive light in the near-infrared region. In addition, this advantage can further be enhanced by using the black color filter rather than green.

As described above, since the image pick-up device according to Embodiment 4 of the present invention can obtain a color image and a monochrome image only by performing signal processing with the use of color filters of four colors, an IR cut-off filter and a mechanical structure for arranging the IR cut-off filter on the optical axis or removing the same from the optical axis are not necessary.

Though pixel array 61 according to Embodiment 4 of the present invention is configured to include the CIGS thin film, the pixel array is not limited as such. The configuration should only include a compound semiconductor thin film or a compound semiconductor thick film. In addition, the present invention is also applicable to a photosensor, a line sensor and the like, without limited to the photoelectric conversion device.

Further, though the image pick-up device according to Embodiment 4 of the present invention is configured such that color filters of four colors are provided for one pixel in color filter portion CFU, the configuration is not limited as such. The configuration may be such that color filters of five or more colors for one pixel are provided, without limited to four colors.

Embodiment 5

An effective image pick-up portion and an optically black portion have been provided in an image sensor, and a photocurrent read from a pixel in the effective image pick-up portion is corrected based on a dark current read from a pixel in the optically black portion.

A level of the dark current, however, varies with variation in temperature, and it has been difficult to eliminate difference in level between the dark current generated in the pixel in the effective image pick-up portion and the dark current generated in the pixel in the optically black portion with the method in PTL 4.

Therefore, a primary object of the present invention is to provide a photoelectric conversion device capable of readily eliminating difference in level between a dark current in an effective image pick-up portion and a dark current in an optically black portion.

FIG. 39 is a plan view showing a configuration of a pixel array 71 of the photoelectric conversion device according to Embodiment 5 of the present invention. In FIG. 39, pixel array 71 is equally divided into a plurality of rectangular regions aligned in a plurality of rows and a plurality of columns. Actually, a large number of regions are present, however, FIG. 39 schematically shows regions in nine rows and nine columns.

A plurality of regions in a central portion of pixel array 71 are used as an effective image pick-up portion 72, and a region around effective image pick-up portion 72 is used as an optically black portion 73. In addition, each region in effective image pick-up portion 72 is used as a pixel region 74, each region on the inner side of the plurality of regions in optically black portion 73 is used as an isolation region 75, and each region on the outer side thereof is used as a pixel region 76.

Though one isolation region 75 is provided between pixel regions 74 and 76 in FIG. 39, two or more isolation regions 75 may be provided between pixel regions 74 and 76. In addition, though one pixel region 76 is provided outside isolation region 75 in FIG. 39, two or more pixel regions 76 may be provided.

FIG. 40(a) is a cross-sectional view showing a main portion of pixel array 71 and FIG. 40(b) is a cross-sectional view along the line XLB-XLB in FIG. 40(a). In FIGS. 40(a) and 40(b), pixel array 71 includes semiconductor substrate 21. Read circuit layer 22 is formed on the surface of semiconductor substrate 21. Read circuit layer 22 is constituted of a MOS transistor, a capacitor, a line, an insulating layer, a via hole, and the like.

In a central portion of each rectangular region in the surface of read circuit layer 22, a rectangular electrode is formed. Each electrode is formed of Mo. Each electrode in pixel region 74 is used as a pixel electrode 80, each electrode in isolation region 75 is used as an isolation electrode 81, and each electrode in pixel region 76 is used as a pixel electrode 82.

CIGS thin film 23 common to effective image pick-up portion 72 and optically black portion 73 is formed to cover all electrodes 80 to 82, and CdS layer 24 and transparent electrode 25 are stacked on the surface of CIGS thin film 23. CIGS thin film 23 is formed of $Cu(In_x,Ga_{(1-x)})Se_2$ ($0 \leq x \leq 1$). CIGS thin film 23 is a p-type compound semiconductor thin film and it has a thickness, for example, of 1.7 μm. CdS layer 24 is a buffer layer formed of an n-type compound semiconductor thin film and it has a thickness, for example, of 50 nm. Transparent electrode 25 is implemented, for example, by a ZnO film and it has a thickness, for example, of 1 μm. Therefore, CIGS thin film 23 and transparent electrode 25 form a PN junction. In addition, a light cut-off layer 83 is formed on the surface of transparent electrode 25 in optically black portion 73. Light cut-off layer 83 is formed of aluminum and it cuts off light incident on CIGS thin film 23 in optically black portion 73.

In other words, CIGS thin film 23 is divided into pixel region 74, isolation region 75 and pixel region 76, and pixel electrode 80, isolation electrode 81, and pixel electrode 82 are formed in pixel region 74, isolation region 75, and pixel region 76 on the back surface of CIGS thin film 23, respectively. In addition, transparent electrode 25 is formed on the surface of CIGS thin film 23 with CdS layer 24 serving as a buffer layer being interposed, and light cut-off layer 83 is formed on the surface of transparent electrode 25 in optically black portion 73.

Figure 41:
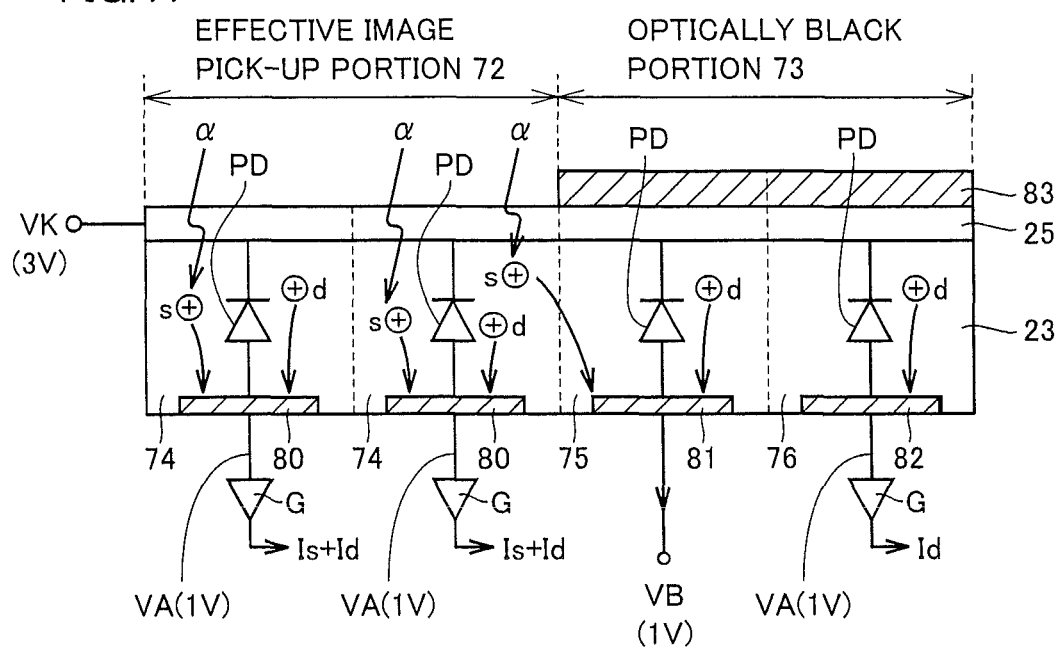
FIG. 41 is a diagram schematically showing a configuration and an operation of the pixel array shown in FIG. 40.

FIG. 41 is a diagram schematically showing a configuration and an operation of pixel array 71 shown in FIG. 39. It is noted that CdS layer 24 serving as a buffer layer is not illustrated. In FIG. 41, read circuit G is provided in correspondence with each of pixel electrodes 80 and 82. Read circuit G is formed under corresponding pixel electrode 80 or 82 in read circuit layer 22 in FIG. 40(a). During read operation, read circuit G applies anode voltage VA (for example, of 1 V) to corresponding pixel electrode 80 or 82 and outputs a current at a level in accordance with the amount of charges that flowed in corresponding pixel electrode 80 or 82.

In addition, cathode voltage VK (for example, of 3 V), which is higher than anode voltage VA, is applied to transparent electrode 25, and a bias voltage VB (in this case, of 1 V) as high as anode voltage VA is applied to isolation electrode 81. Thus, a depletion layer is formed between each of electrodes 80 to 82 and transparent electrode 25, and a region between each of electrodes 80 to 82 and transparent electrode 25 operates as photodiode PD. Each of electrodes 80 to 82 serves as the anode of photodiode PD and transparent electrode 25 serves as the cathode of photodiode PD.

When light α is incident on CIGS thin film 23 from the outside through transparent electrode 25, electron-hole pairs in an amount in accordance with the quantity of light are produced in CIGS thin film 23. Since holes are majority carriers in CIGS thin film 23, holes, that is, positive charges, flow into pixel electrode 80 in the vicinity. This current is a photocurrent. The photocurrent is amplified by read circuit G and becomes an current Is.

In addition, in CIGS thin film 23, electron-hole pairs in an amount in accordance with a temperature are produced regardless of whether light α is incident or not, and produced holes, that is, positive charges, flow into pixel electrode 80, 81 or 82 in the vicinity. This current is a dark current. The dark current is amplified by read circuit G and becomes a current Id. Though a part of the photocurrent generated in pixel region 74 at an end portion of effective image pick-up portion 72 flows into isolation electrode 81, it does not flow into pixel electrode 82.

Therefore, the photocurrent and the dark current flow into pixel electrode 80, and read circuit G corresponding to pixel electrode 80 outputs a current Is+Id. In addition, only the dark current flows into pixel electrode 82 and read circuit G corresponding to pixel electrode 82 outputs current Id. Therefore, by subtracting output current Id from read circuit G corresponding to pixel electrode 82 from output current Is+Id from read circuit G corresponding to pixel electrode 80, current Is at a level in accordance with the photocurrent generated in pixel region 74 can be detected.

Figure 42:
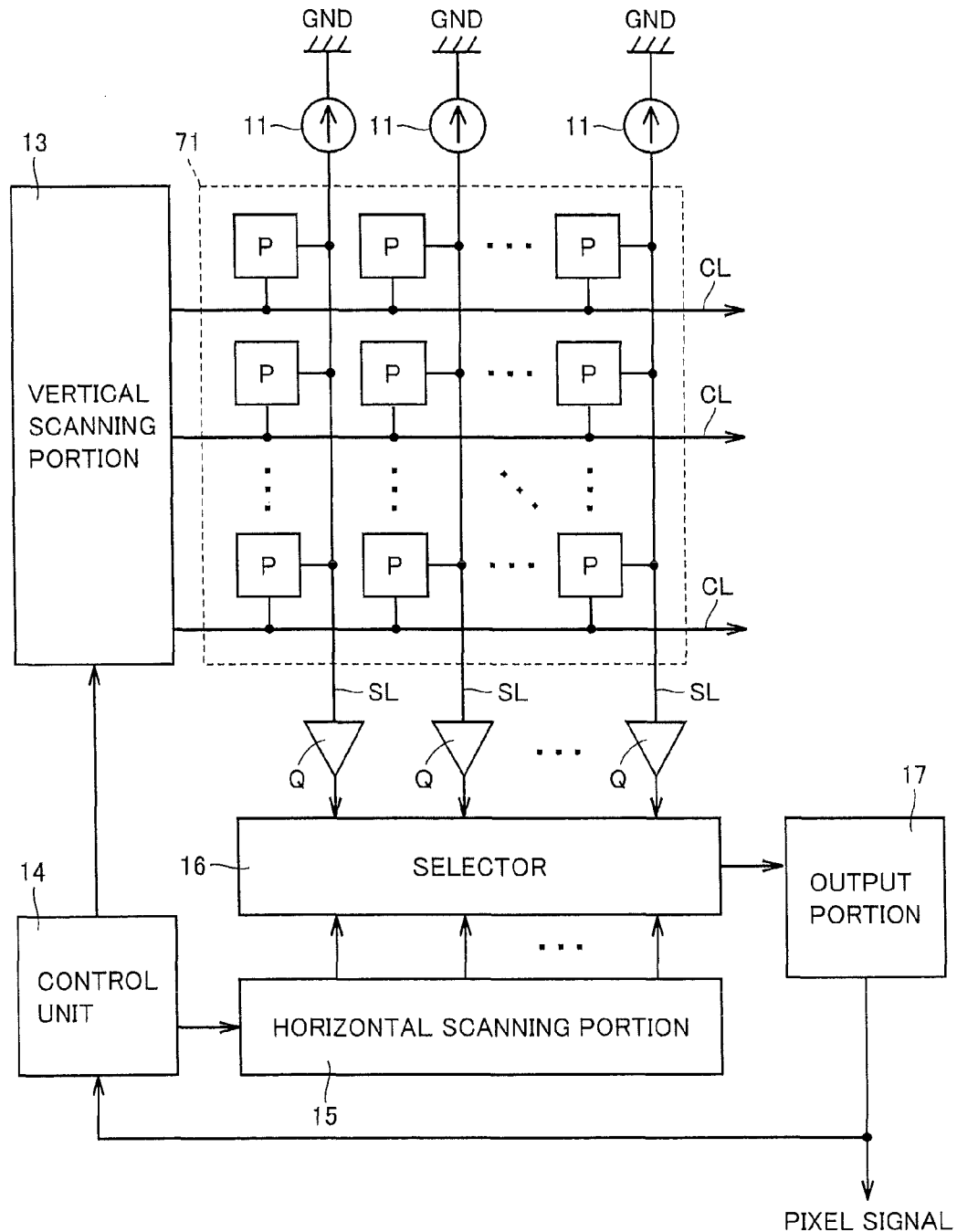
FIG. 42 is a circuit block diagram showing a configuration of the photoelectric conversion device including the pixel array shown in FIGS. 39 to 41.

FIG. 42 is a circuit block diagram showing an overall configuration of the photoelectric conversion device. In FIG. 42, the photoelectric conversion device includes pixel array 71 shown in FIG. 39. Pixel array 71 includes a plurality of pixels P aligned in a plurality of rows and a plurality of columns, a plurality of control signal lines CL provided in correspondence with the plurality of rows respectively, and a plurality of signal lines SL provided in correspondence with the plurality of columns respectively. Pixel P in the central portion of pixel array 71 is used for detecting a photocurrent, and pixel P around the same is used for detecting a dark current.

One end of each signal line SL is connected to the line of ground voltage GND through load circuit 11. Load circuit 11 has a prescribed resistance value. The other end of each signal line SL is connected to an input node of amplifier Q. Amplifier Q amplifies a voltage of corresponding signal line SL.

Figure 43:
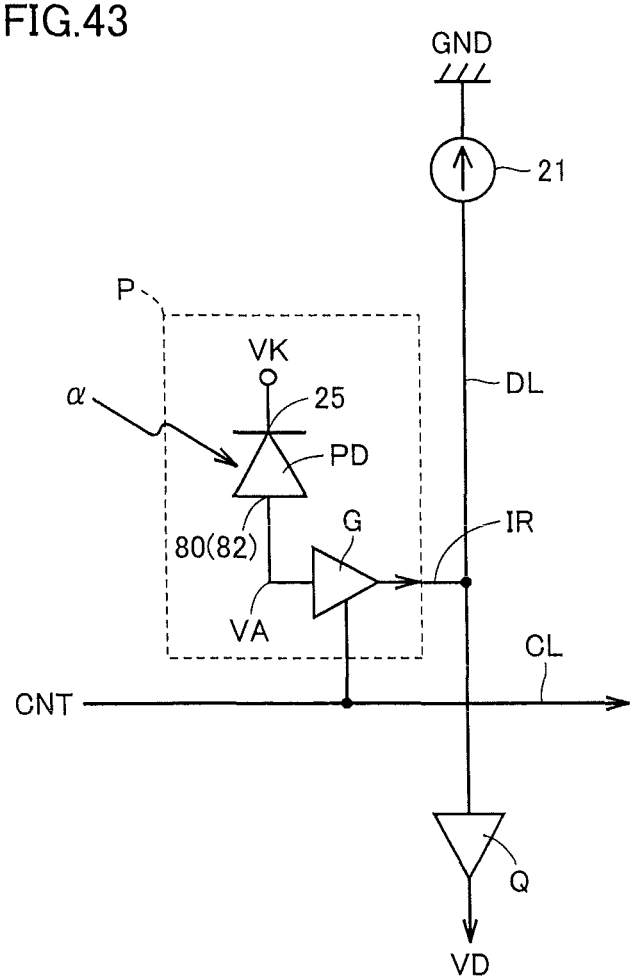
FIG. 43 is a circuit diagram showing a configuration of the pixel shown in FIG. 42.

As shown in FIG. 43, pixel P includes photodiode PD and read circuit G. As described with reference to FIGS. 40(a), 40(b) and 41, photodiode PD is formed with pixel electrode 80 (or 82), CIGS thin film 23, CdS layer 24, and transparent electrode 25. Pixel electrode 80 (or 82) implements the anode of photodiode PD and transparent electrode 25 implements the cathode of photodiode PD. Cathode voltage VK is applied to the cathode of photodiode PD and anode voltage VA is applied to the anode thereof.

When light α is incident on photodiode PD, charges in an amount in accordance with the quantity of light flow to read circuit G through pixel electrode 80. In addition, charges in an amount in accordance with a temperature flow to pixel electrodes 80 and 82, regardless of whether light α is incident or not. Read circuit G is controlled by control signal CNT provided through corresponding control signal line CL and outputs to corresponding signal line SL, current IR at a level in accordance with the amount of charges that flowed from photodiode PD. Signal line SL attains to a voltage as high as a product of output current IR from read circuit G and a resistance value of load circuit 11. The voltage of signal line SL is amplified by amplifier Q. Therefore, output voltage VD from amplifier Q varies in accordance with the amount of charges generated in photodiode PD.

Referring back to FIG. 42, the photoelectric conversion device includes vertical scanning portion 13, control unit 14, horizontal scanning portion 15, selector 16, and output portion 17. Operations of vertical scanning portion 13, control unit 14, horizontal scanning portion 15, and selector 16 are as described with reference to FIG. 2. Output portion 17 generates an image signal based on output voltage VD from amplifier Q provided through selector 16. Here, output portion 17 corrects voltage VD read from pixel P in effective image pick-up portion 72 based on voltage VD read from pixel P in optically black portion 73. An image signal is provided to an image display device. An image of a subject for the photoelectric conversion device is displayed on a screen of the image display device.

In this Embodiment 5, CIGS thin film 23 is formed in common to effective image pick-up portion 72 and optically black portion 73, and isolation electrode 81 for preventing a current generated in effective image pick-up portion 72 from flowing to pixel electrode 82 is provided between pixel electrode 80 in effective image pick-up portion 72 and pixel electrode 82 in optically black portion 73. Therefore, difference in level between the dark current in effective image pick-up portion 72 and the dark current in optically black portion 73 can readily be eliminated.

Figure 44:
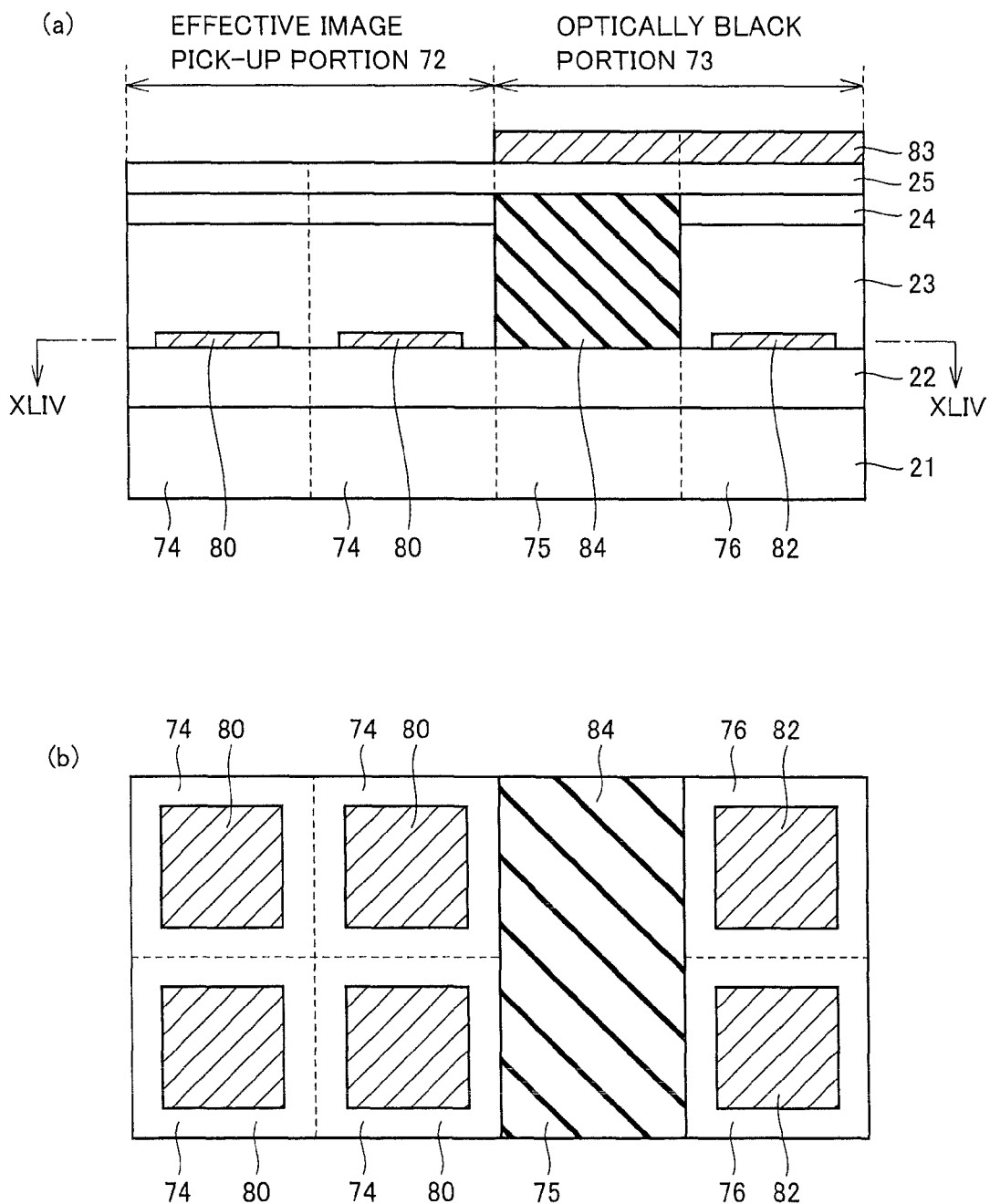
FIG. 44 is a cross-sectional view showing a variation of Embodiment 5.

FIG. 44(a) is a cross-sectional view showing a main portion of a pixel array according to a variation of Embodiment 5 and FIG. 44(b) is a cross-sectional view along the line XLIVB-XLIVB in FIG. 44(a). In addition, FIG. 45 is a diagram schematically showing a configuration and an operation of the pixel array shown in FIGS. 44(a) and 44(b).

Figure 45:
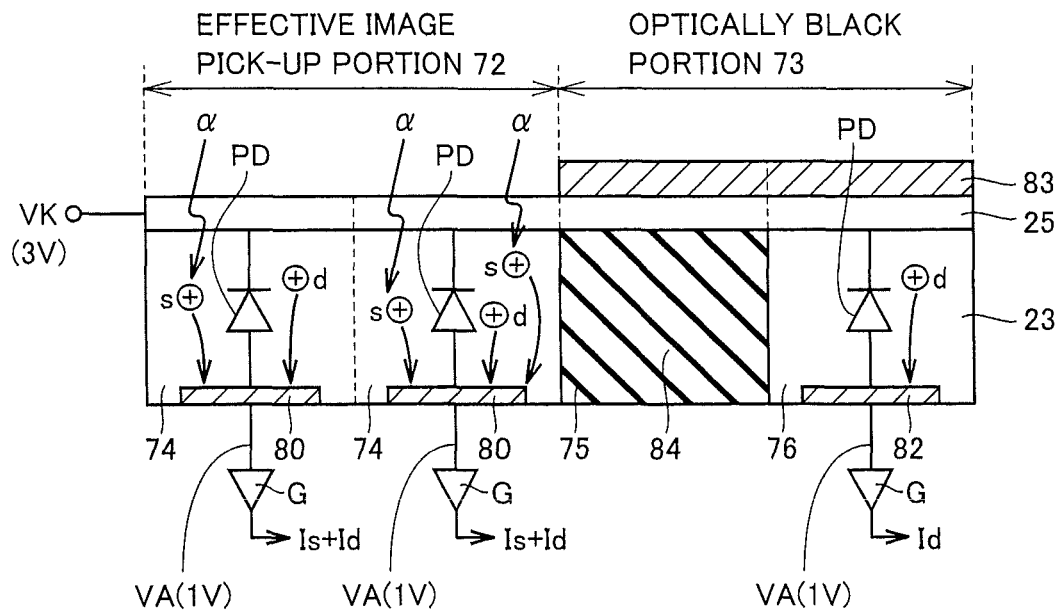
FIG. 45 is a diagram schematically showing a configuration and an operation of the pixel array shown in FIG. 44.

This pixel array in FIGS. 44(a), 44(b) and 45 is different from the pixel array in FIGS. 40(a), 40(b) and 41 in that isolation electrode 81 in isolation region 75, CIGS thin film 23 and CdS layer 24 are replaced with a band-shaped insulating film 84. Insulating film 84 is formed, for example, of $SiO_2$, and formed to surround effective image pick-up portion 72. Therefore, a current generated in effective image pick-up portion 72 is prevented from flowing to pixel electrode 82.

This variation can also achieve an effect the same as in Embodiment 5.

Though a case where the invention of the subject application is applied to the photoelectric conversion device including the CIGS thin film has been described in Embodiment 5 above, the invention of the subject application is also applicable to a photoelectric conversion device including a compound semiconductor thin film, an organic semiconductor thin film, a photoelectric conversion thin film, or a photoelectric conversion thick film, other than the CIGS thin film. In addition, the invention of the subject application is also applicable to a photosensor or a line sensor without limited to the photoelectric conversion device.

Embodiment 6

In general, in a solid-state image sensing element, a photodiode is formed on a silicon substrate, and a photodiode and a plurality of transistors constituting a read circuit reading charges from the photodiode and outputting a current are arranged in a pixel region for one pixel in the silicon substrate. Then, in order to secure a light reception area of the photodiode, an amplifier for amplifying a current output from the read circuit is arranged outside the pixel region.

Meanwhile, in a stack-type solid-state image sensing element in which a photoelectric conversion film is provided on a silicon substrate with a line layer or the like being interposed as in the solid-state image sensing element including CIGS, it is not necessary to provide a photodiode on the silicon substrate and hence there is a room in a region in the silicon substrate under the photoelectric conversion film. Since a degree of freedom in selecting a process for manufacturing a transistor provided on the silicon substrate is enhanced, miniaturization can be achieved and hence an amplifier for amplifying a current output from the read circuit can be provided in the pixel region.

Here, for example, a source follower circuit is arranged in an output stage of the read circuit reading charges from the photodiode and outputting a current, however, the source follower circuit is narrow in output range. Therefore, a differential amplifier having a wide output range may be provided as a read circuit.

In a case where a differential amplifier is provided in a pixel region, the anode of the photodiode is connected to one input terminal of the differential amplifier and a bias voltage is supplied to the other input terminal. Then, negative feedback is applied to the differential amplifier to operate in an imaginary short-circuited state. Here, since a reverse voltage should be applied to the photodiode, the bias voltage should be set lower than the voltage supplied to the cathode of the photodiode.

In such a configuration, however, a plurality of lines each for transmitting a bias voltage from a circuit generating the bias voltage to each pixel region are required and a line region is increased.

PTL 1, however, does not disclose a configuration for solving such a problem.

Therefore, an object of the present invention is to provide a photoelectric conversion device and an image pick-up device capable of achieving reduction in size in such a configuration that a differential amplifier for amplifying a photoelectrically converted electric signal is provided in each pixel region.

The configurations of the image pick-up device and the photoelectric conversion device in present Embodiment 6 are as described with reference to FIGS. 1 and 2.

Figure 46:
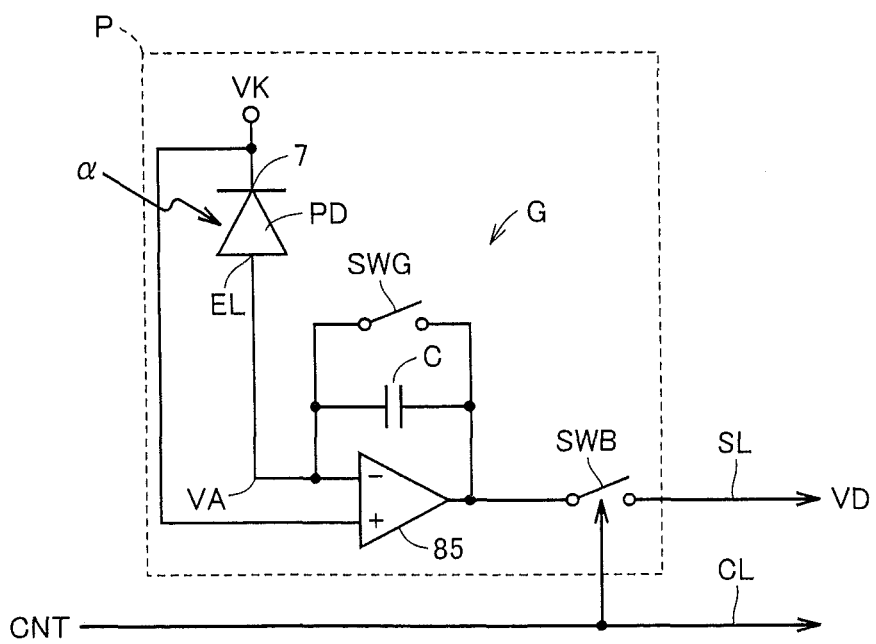
FIG. 46 is a diagram showing a configuration of a pixel in a photoelectric conversion device according to Embodiment 6 of the present invention.

FIG. 46 is a diagram showing a configuration of pixel P in Embodiment 6 of the present invention.

Referring to FIG. 46, pixel P includes photodiode PD, a differential amplifier 85, a capacitor C, a switch SWG, and switch SWB. Cathode voltage VK is applied to the cathode of photodiode PD, and anode voltage VA is applied to the anode of photodiode PD. Differential amplifier 85, capacitor C and switch SWG constitute read circuit G.

When light α from lens 2 is incident on photodiode PD, charges in an amount in accordance with the quantity of light flow to differential amplifier 85. Differential amplifier 85 amplifies charges that flowed from photodiode PD, that is, an electric signal, to generate voltage VD, and outputs the voltage as a read signal to corresponding read signal line SL. Therefore, output voltage VD from differential amplifier 85 varies in accordance with a quantity of light α incident on photodiode PD. By thus outputting the amplified read signal from pixel P, a variety of levels that a read signal can take is increased, and therefore light reception accuracy can be improved.

More specifically, differential amplifier 85 has an inverting input terminal connected to the anode of photodiode PD, a first terminal of capacitor C and a first terminal of switch SWG, a non-inverting input terminal connected to the cathode of photodiode PD, and an output terminal connected to a second terminal of capacitor C and a second terminal of switch SWG.

Negative feedback is applied to differential amplifier 85 by capacitor C. Charges from photodiode PD are stored in capacitor C. As charges are stored in capacitor C, an output voltage from differential amplifier 85 lowers. Thus, a read signal having a level in accordance with the amount of charges in capacitor C, that is, the quantity of light α, is generated. In addition, charges in capacitor C are released by turning on switch SWG, and charges are again stored in capacitor C by thereafter turning off switch SWG.

Switch SWB switches whether to output a read signal from differential amplifier 85 to corresponding read signal line SL or not, based on control signal CNT received through corresponding control signal line CL. Read signal line SL transmits a read signal from differential amplifier 85 to selector 16.

Vertical scanning portion 13 shown in FIG. 2 successively selects one of the plurality of pixel rows one by one based on a vertical scanning signal provided from control unit 14 and provides control signal CNT to each switch SWB in that pixel row through control signal line CL in the selected pixel row.

Thus, a read signal at a level in accordance with the quantity of incident light is output from each pixel P in the selected pixel row to corresponding read signal line SL and provided to selector 16.

Horizontal scanning portion 15 successively selects one column of the plurality of pixel columns one by one while vertical scanning portion 13 selects one pixel row, based on a horizontal scanning signal provided from control unit 14. Selector 16 selects a read signal corresponding to the pixel column selected by horizontal scanning portion 15 and transmits the read signal to output portion 17.

Output portion 17 generates a pixel signal, that is, a signal indicating a quantity of light received by pixel P, based on the read signal provided through selector 16, and outputs the signal to image signal processing portion 4 and control unit 14.

Figure 47:
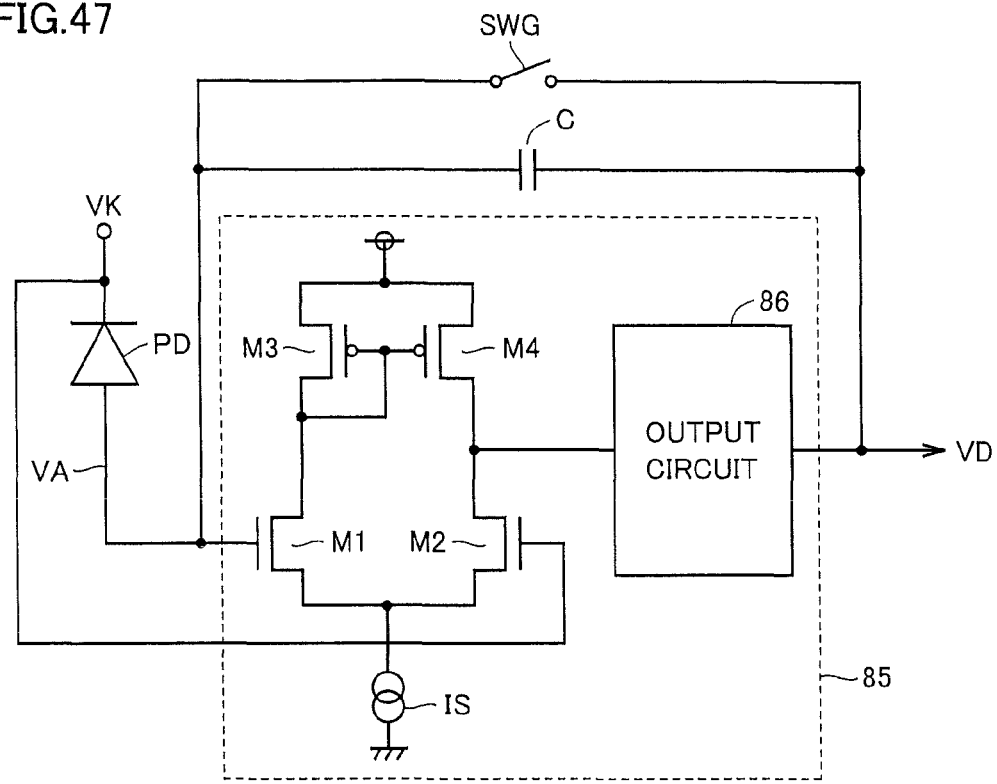
FIG. 47 is a diagram showing a circuit configuration of a differential amplifier shown in FIG. 46.

FIG. 47 is a diagram showing a circuit configuration of differential amplifier 85 according to Embodiment 6 of the present invention.

Referring to FIG. 47, differential amplifier 85 includes N-channel MOS transistors M1 and M2, P-channel MOS transistors M3 and M4, a current source IS, and an output circuit 86.

P-channel MOS transistor M3 has a source connected to a node supplied with a supply voltage and a gate and a drain connected to each other. P-channel MOS transistor M4 has a source connected to the node supplied with the supply voltage, a gate connected to the gate of P-channel MOS transistor M3, and a source connected to a drain of N-channel MOS transistor M2 and an input node of output circuit 86. N-channel MOS transistor M1 has a drain connected to the drain of P-channel MOS transistor M3, a source connected to current source IS, and a gate connected to the first terminal of capacitor C, the first terminal of switch SWG, and the anode of photodiode PD. N-channel MOS transistor M2 has the drain connected to the drain of P-channel MOS transistor M4, a source connected to current source IS, and a gate connected to the cathode of photodiode PD. A second terminal of capacitor C and a second terminal of switch SWG are connected to an output node of output circuit 86.

The gate of N-channel MOS transistor M1 corresponds to the inverting input terminal of differential amplifier 85, and the gate of N-channel MOS transistor M2 corresponds to the non-inverting input terminal of differential amplifier 85.

Output circuit 86 is provided in order to adjust an output from differential amplifier 85 and it outputs voltage VD corresponding to a drain voltage of N-channel MOS transistor M2.

Figure 48:
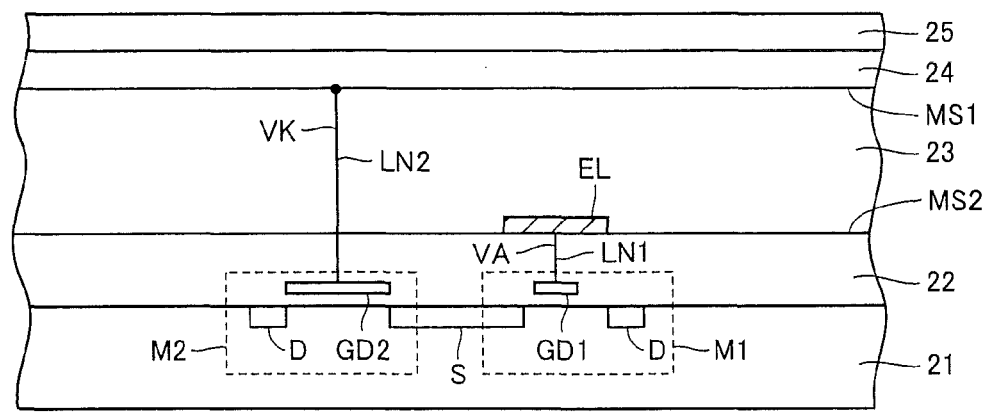
FIG. 48 is a diagram showing in detail a cross-sectional structure of a main portion of a pixel array shown in FIG. 47.

FIG. 48 is a diagram showing in detail a cross-sectional structure of a main portion of a pixel array according to Embodiment 6 of the present invention.

Referring to FIG. 48, a drain region D and a source region S of N-channel MOS transistors M1 and M2 are formed in semiconductor substrate 21. In addition, gate electrodes GD1 and GD2 of N-channel MOS transistors M1 and M2 are provided in read circuit layer 22.

Gate electrode GD1 of N-channel MOS transistor M1 is connected to pixel electrode EL through a line LN1.

A line LN2 extends from differential amplifier 85 in a direction toward a region of CIGS thin film 23 opposed to differential amplifier 85, and electrically connects the non-inverting input terminal of differential amplifier 85 and a main surface MS1 to each other. Namely, gate electrode GD2 of N-channel MOS transistor M2 is connected to main surface MS1 of CIGS thin film 23 through line LN2.

Here, N-channel MOS transistors M1 and M2 are different in size from each other. Namely, an area of gate electrode GD1 of N-channel MOS transistor M1 in the direction of extension of a main surface MS2 of CIGS thin film 23 is smaller than that of gate electrode GD2 of N-channel MOS transistor M2.

Therefore, differential amplifier 85 does not enter the imaginary short-circuited state but it operates such that a potential at the inverting input terminal is lower than that at the non-inverting input terminal Namely, a voltage at the inverting input terminal of differential amplifier 85 becomes lower than the voltage at the non-inverting input terminal of a differential amplifier G.

Thus, anode voltage VA of photodiode PD becomes lower than cathode voltage VK, and a reverse bias is applied to photodiode PD.

In a case where differential amplifier 85 is provided in a pixel region, a plurality of lines each for transmitting a bias voltage to each pixel region from a circuit generating the bias voltage have been required and a line region has disadvantageously increased.

The photoelectric conversion device according to Embodiment 6 of the present invention, however, includes a plurality of differential amplifiers 85 each having an inverting input terminal provided in correspondence with pixel electrode EL, provided on a side of CIGS thin film 23 opposite to corresponding pixel electrode EL, and electrically connected to pixel electrode EL, a non-inverting input terminal electrically connected to main surface MS1, and an output terminal, and outputting a read signal based on charges received by corresponding pixel electrode EL. Then, differential amplifier 85 operates such that a voltage at the inverting input terminal is lower than a voltage at the non-inverting input terminal.

According to such a configuration, a bias voltage can be supplied from the node for supplying a voltage to the cathode of photodiode PD to the non-inverting input terminal of differential amplifier 85 and a reverse voltage can be applied to photodiode PD. Thus, the need for a circuit for generating a bias voltage and a plurality of lines each for transmitting a bias voltage from this circuit to each pixel region can be obviated.

Therefore, the photoelectric conversion device according to Embodiment 6 of the present invention configured such that differential amplifier 85 for amplifying a photoelectrically converted electric signal is provided in each pixel region can achieve reduction in size.

Though the pixel array according to Embodiment 6 of the present invention is configured to include a CIGS thin film, the pixel array is not limited as such. Any of a photoelectric conversion thin film and a photoelectric conversion thick film may be employed, and the configuration may include, for example, a compound semiconductor thin film, an organic semiconductor thin film, and the like other than the CIGS thin film. In addition, the present invention is also applicable to a photosensor, a line sensor and the like, without limited to the photoelectric conversion device.

A variation of Embodiment 6 of the present invention will now be described with reference to the drawings. It is noted that the same or corresponding elements in the drawings have the same reference characters allotted and description thereof will not be repeated.

The present variation relates to a photoelectric conversion device different in configuration of a differential amplifier from the photoelectric conversion device according to Embodiment 6. The photoelectric conversion device in the variation is the same as the photoelectric conversion device in Embodiment 6, except for the description below.

Figure 49:
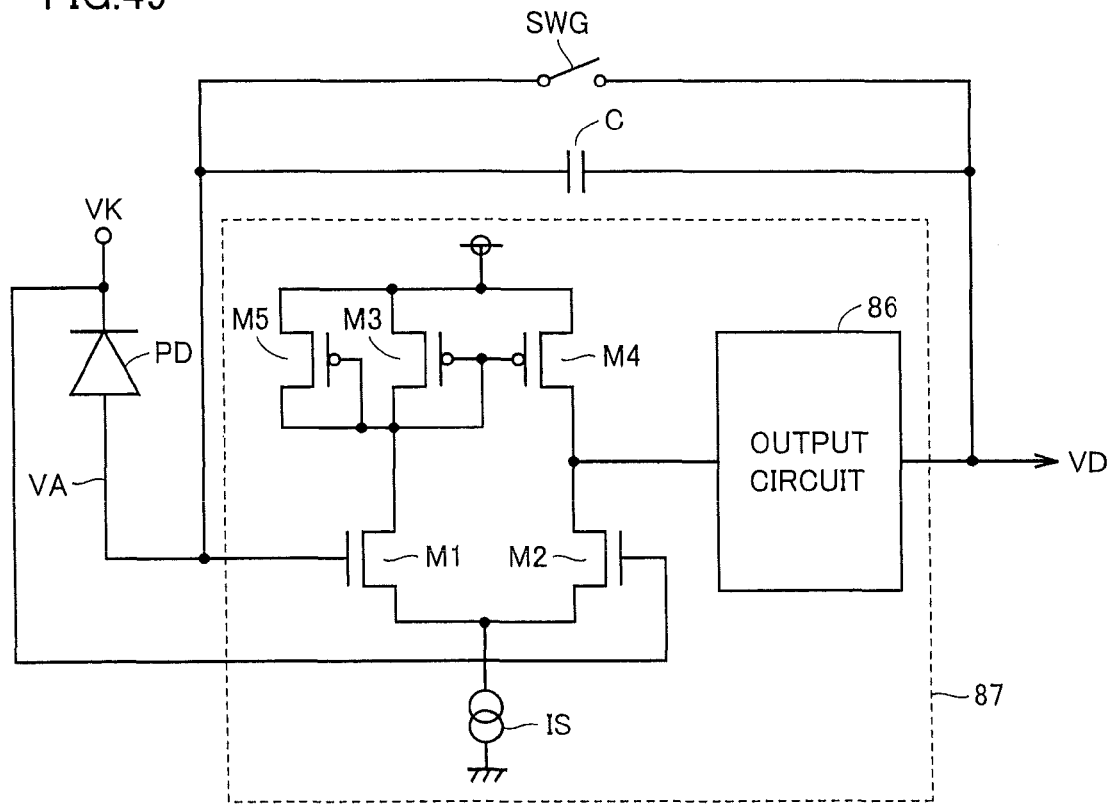
FIG. 49 is a diagram showing a circuit configuration of a differential amplifier according to a variation of Embodiment 6.

FIG. 49 is a diagram showing a circuit configuration of a differential amplifier 87 according to the present variation.

Figure 50:
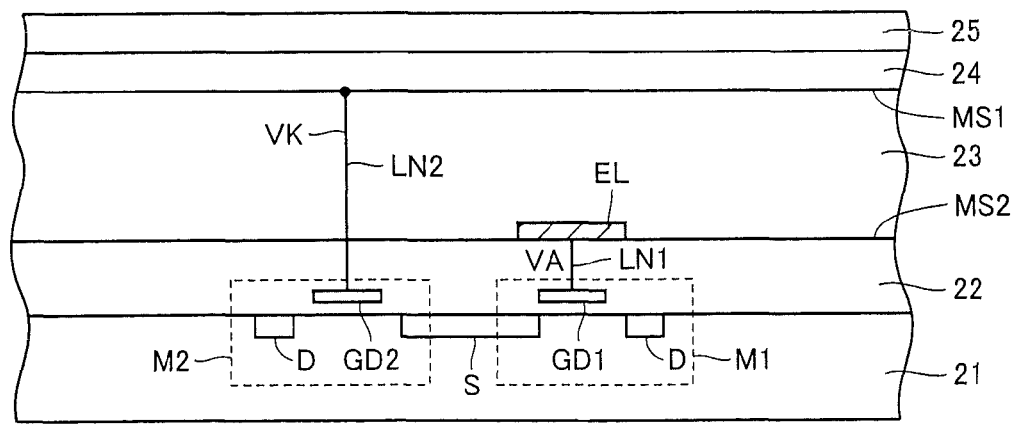
FIG. 50 is a diagram showing in detail a cross-sectional structure of a main portion of a pixel array shown in FIG. 49.

FIG. 50 is a diagram showing in detail a cross-sectional structure of a main portion of a pixel array according to the present variation.

Referring to FIGS. 49 and 50, differential amplifier 87 further includes a P-channel MOS transistor M5 as compared with differential amplifier 85 according to Embodiment 6.

P-channel MOS transistor M5 is connected in parallel to P-channel MOS transistor M3. More specifically, P-channel MOS transistor M5 has a source connected to the node supplied with the supply voltage and a gate and a drain connected to each other, and these gate and source are connected to the gate and the source of P-channel MOS transistor M3 respectively.

N-channel MOS transistors M1 and M2 are substantially identical in size. Namely, an area of gate electrode GD1 of N-channel MOS transistor M1 in the direction of extension of main surface MS2 is substantially the same as that of gate electrode GD2 of N-channel MOS transistor M2. In addition, P-channel MOS transistors M3 to M5 are substantially identical in size.

Therefore, differential amplifier 87 does not enter the imaginary short-circuited state but it operates such that a potential at the inverting input terminal is lower than that at the non-inverting input terminal Namely, a voltage at the inverting input terminal of differential amplifier 87 becomes lower than the voltage at the non-inverting input terminal of differential amplifier G.

Thus, anode voltage VA of photodiode PD becomes lower than cathode voltage VK, and a reverse bias is applied to photodiode PD.

Since the configuration and the operation are otherwise the same as in the photoelectric conversion device according to Embodiment 6, detailed description will not be repeated here.

Therefore, likewise the photoelectric conversion device according to Embodiment 6 of the present invention, the photoelectric conversion device according to the present variation configured such that the differential amplifier for amplifying a photoelectrically converted electric signal is provided in each pixel region can achieve reduction in size.

Embodiment 7

In such a solid-state image sensing device, in order to broaden a dynamic range of a quantity of received light, for example, a method of combining electric signals obtained within a plurality of periods different in time length for storing charges from photoelectric conversion elements is adopted.

With such a method, however, a length of time for storing charges is different and images of a subject at different time points are synthesized. Therefore, deviation is likely in a synthesized image in picking up an image of a subject moving fast. Thus, an effect of synthesis is lost and image quality deteriorates.

PTL 3, however, does not disclose a configuration for solving such a problem.

Therefore, an object of present Embodiment 7 is to provide a photoelectric conversion device and an image pick-up device capable of broadening a dynamic range and preventing deterioration of image quality.

The configuration and the operation of the image pick-up device according to Embodiment 7 of the present invention are as described with reference to FIG. 1. In addition, the configuration and the operation of the photoelectric conversion device are as described with reference to FIG. 2. Moreover, the configuration of pixel P is as described with reference to FIG. 3.

Figure 51:
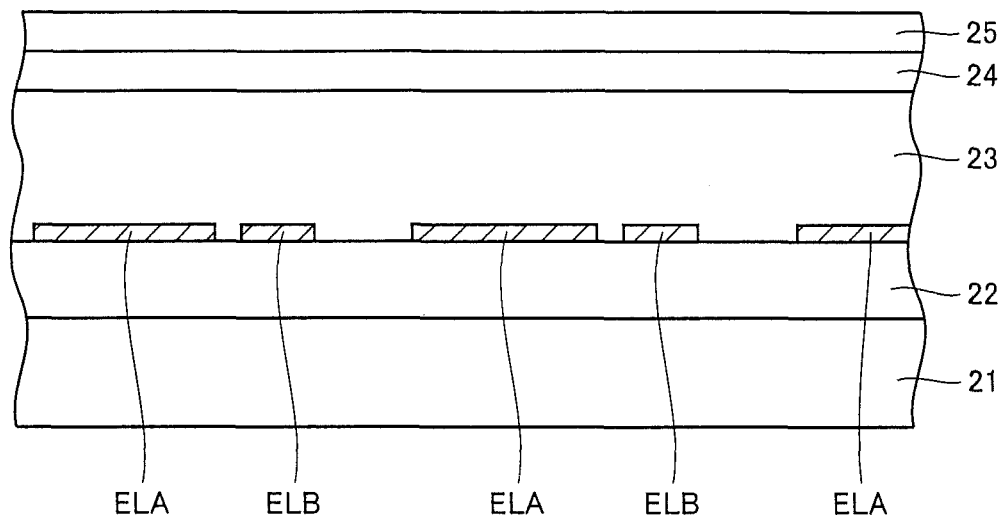
FIG. 51 is a diagram showing a cross-sectional structure of a main portion of a pixel array of a photoelectric conversion device according to Embodiment 7 of the present invention.

FIG. 51 is a diagram showing a cross-sectional structure of a main portion of a pixel array according to Embodiment 7 of the present invention.

Referring to FIG. 51, the pixel array includes semiconductor substrate 21, read circuit layer 22, a plurality of pixel electrodes ELA and ELB, CIGS thin film 23, CdS (cadmium sulfide) layer 24, and transparent electrode 25.

Read circuit layer 22 is formed on the surface of semiconductor substrate 21. Read circuit layer 22 includes a MOS transistor, a capacitor, a line, an insulating layer, a via hole, and the like.

One pixel electrode ELA and one pixel electrode ELB are provided proximate to each other on the surface of CIGS thin film 23. Pixel electrode ELA is greater than pixel electrode ELB in size, that is, area, in the direction of extension of CIGS thin film 23. Each of pixel electrode ELA and pixel electrode ELB will also hereinafter be referred to as pixel electrode EL.

A plurality of rectangular pixel electrodes EL are arranged at prescribed intervals on the surface of read circuit layer 22. The plurality of pixel electrodes EL are aligned in a plurality of rows and a plurality of columns. Each pixel electrode EL is formed, for example, of Mo (molybdenum).

CIGS thin film 23 is formed to cover the plurality of pixel electrodes EL and CdS layer 24 and transparent electrode 25 are stacked on the surface of CIGS thin film 23 in this order. CIGS thin film 23 is a p-type compound semiconductor thin film and it has a thickness, for example, of 1.7 μm. CdS layer 24 is a buffer layer and it has a thickness, for example, of 50 nm. Transparent electrode 25 is a low-resistance n-type ZnO film, and it has a thickness, for example, of 1 μm. Therefore, CIGS thin film 23 and transparent electrode 25 form a PN junction.

In other words, transparent electrode 25 is formed on the first main surface of CIGS thin film 23 serving as a photoelectric conversion film with CdS layer 24 serving as a buffer layer being interposed, and the plurality of pixel electrodes EL corresponding to respective pixels are formed on the second main surface of CIGS thin film 23.

Figure 52:
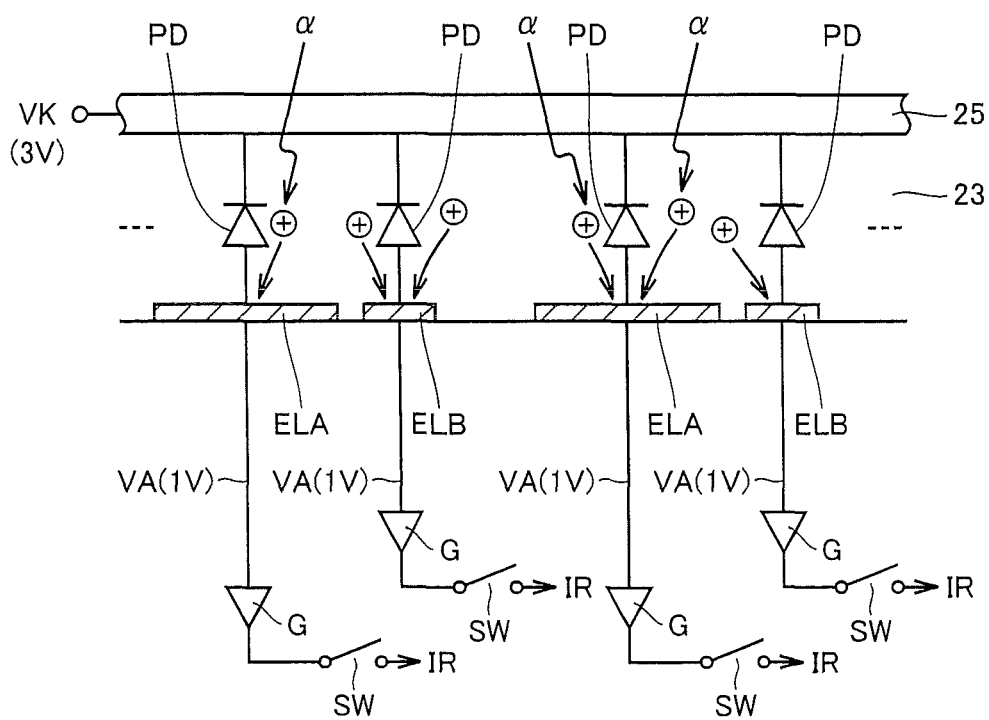
FIG. 52 is a diagram schematically showing a cross-sectional structure and an operation of the pixel array shown in FIG. 51.
Figure 53:
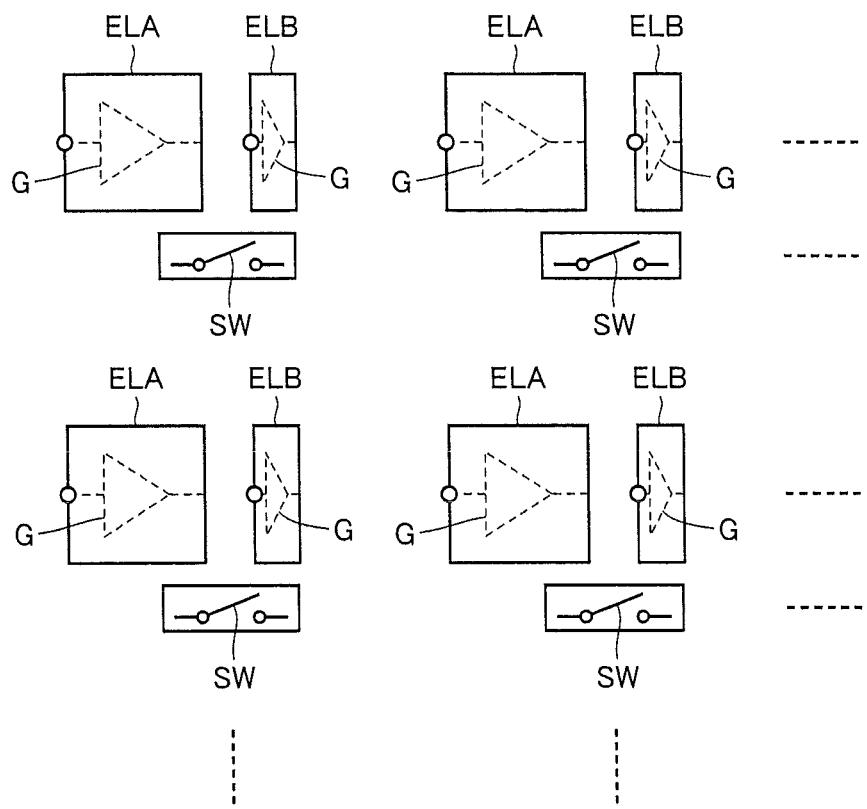
FIG. 53 is a diagram of the pixel array shown in FIG. 51 when viewed from above.

FIG. 52 is a diagram schematically showing a cross-sectional structure and an operation of the pixel array according to Embodiment 7 of the present invention. FIG. 53 is a diagram of the pixel array according to Embodiment 7 of the present invention when viewed from above.

Referring to FIGS. 52 and 52, read circuit G is provided in correspondence with pixel electrode EL and formed under corresponding pixel electrode EL in read circuit layer 22 shown in FIG. 51. Namely, read circuit G is provided on a side of CIGS thin film 23 opposite to corresponding pixel electrode EL. Thus, the photoelectric conversion device can be made smaller.

During read operation, read circuit G applies anode voltage VA, for example, of 1 V to corresponding pixel electrode EL. In addition, cathode voltage VK, for example, of 3 V, which is higher than anode voltage VA, is applied to transparent electrode 25. Thus, a depletion layer is formed between each pixel electrode EL and transparent electrode 25, and a region between each pixel electrode EL and transparent electrode 25 operates as photodiode PD. Pixel electrode EL serves as the anode of photodiode PD and transparent electrode 25 serves as the cathode of photodiode PD.

When light α is incident on CIGS thin film 23 from the outside through transparent electrode 25, electron-hole pairs in an amount in accordance with the quantity of light are produced in CIGS thin film 23. Since holes are majority carriers in CIGS thin film 23, holes, that is, positive charges, flow into pixel electrode EL in the vicinity. Read circuit G outputs current IR at a level in accordance with the amount of charges that flowed in corresponding pixel electrode EL.

As shown in FIG. 53, a switch SW is provided in correspondence with read circuit G in read circuit layer 22, and it has a first terminal connected to the output terminal of corresponding read circuit G and a second terminal connected to corresponding read signal line SL.

Figure 54:
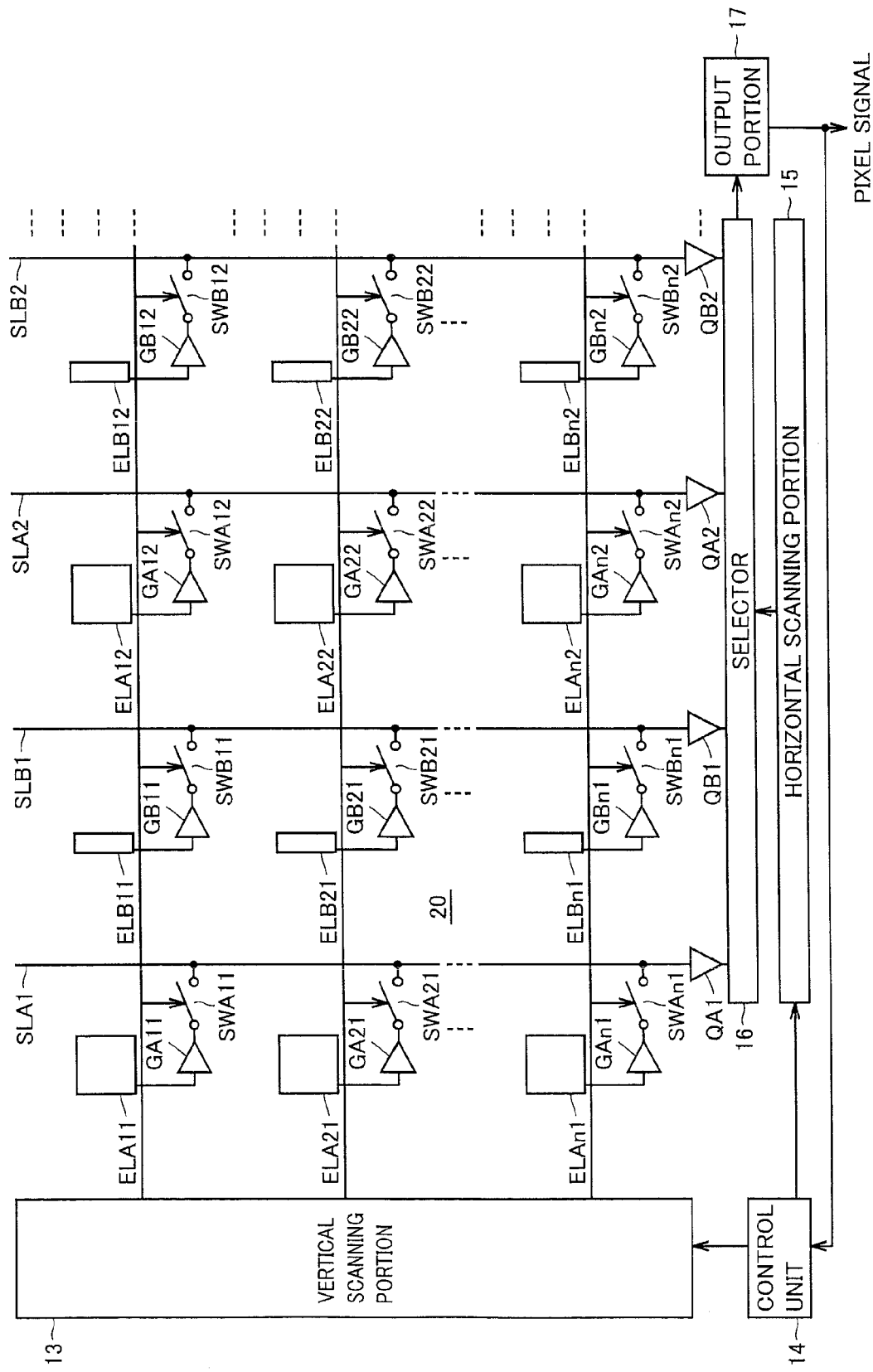
FIG. 54 is a diagram showing relation between a pixel electrode and a switch in the photoelectric conversion device according to Embodiment 7.

FIG. 54 is a diagram showing relation between a pixel electrode and a switch in the photoelectric conversion device according to Embodiment 7 of the present invention. FIG. 54 representatively shows some of circuits corresponding to pixels in a plurality of rows and a plurality of columns and mainly illustrates an operation of these circuits.

Referring to FIG. 54, the pixel array includes a plurality of pixel electrodes EL aligned in n rows and n columns. Here, first, second, . . . , and nth pixel rows are referred to as pixel row 1, pixel row 2, . . . , and pixel row n respectively, and first, second, . . . , and nth pixel columns are referred to as pixel column 1, pixel column 2, . . . , and pixel column n respectively. In one example shown in FIG. 54, n is a natural number not smaller than 3.

Namely, pixel electrodes ELA11, ELB11, ELA12, ELB12, and so on correspond to pixel row 1, pixel electrodes ELA21, ELB21, ELA22, ELB22, and so on correspond to pixel row 2, and pixel electrodes ELAn1, ELBn1, ELAn2, ELBn2, and so on correspond to pixel row n. In addition, pixel electrodes ELA11, ELA21, . . . , and ELAn1 correspond to pixel column 1, pixel electrodes ELB11, ELB21, . . . , and ELBn1 correspond to pixel column 2, pixel electrodes ELA12, ELA22, . . . , and ELAn2 correspond to pixel column 3, and pixel electrodes ELB12, ELB22, . . . , and ELBn2 correspond to pixel column 4 These pixel electrodes correspond to pixel electrodes ELA and ELB described previously. Hereinafter, each of pixel electrodes ELA11, ELA12, ELA21, ELA22, ELAn1, and ELAn2 is also referred to as pixel electrode ELA, and each of pixel electrodes ELB11, ELB12, ELB21, ELB22, ELBn1, and ELBn2 is also referred to as pixel electrode ELB.

In correspondence with pixel electrodes ELA11, ELB11, ELA12, ELB12, and so on, pixel electrodes ELA21, ELB21, ELA22, ELB22, and so on, and pixel electrodes ELAn1, ELBn1, ELAn2, ELBn2, and so on, read circuits GA11, GB11, GA12, GB12, and so on, read circuits GA21, GB21, GA22, GB22, and so on, and read circuits GnA1, GnB1, GnA2, GnB2, and so on are provided. These read circuits correspond to read circuit G described previously.

In correspondence with read circuits GA11, GB11, GA12, GB12, and so on, read circuits GA21, GB21, GA22, GB22, and so on, and read circuits GnA1, GnB1, GnA2, GnB2, and so on, switches SWA11, SWB11, SWA12, SWB12, and so on, switches SWA21, SWB21, SWA22, SWB22, and so on, and switches SWAn1, SWBn1, SWAn2, SWBn2, and so on are provided. These switches correspond to switches SWA and SWB described previously.

In addition, read signal lines SLA1, SLB1, SLA2, and SLB2 are provided in correspondence with pixel columns 1 to 4, respectively. These signal lines correspond to read signal line SL described previously.

Amplifiers QA1, QB1, QA2, and QB2 are connected to the other ends of read signal lines SLA1, SLB1, SLA2, and SLB2, respectively. These amplifiers correspond to amplifier Q described previously.

An operation of the photoelectric conversion device according to Embodiment 7 of the present invention for generating a pixel signal will now be described in detail. Initially, an operation of control unit 14 will be described in detail.

Vertical scanning portion 13 initially selects pixel row 1 based on a vertical scanning signal provided from control unit 14 and turns on switches SWA11, SWB11, SWA12, and SWB12 in selected pixel row 1. In addition, vertical scanning portion 13 turns off each switch SWB corresponding to a pixel row that has not been selected.

Thus, a current at a level in accordance with a quantity of light incident on photodiode PD corresponding to pixel electrodes ELA11, ELB11, ELA12, and ELB12 is output from read circuits GA11, GB11, GA12, and GB12 in selected pixel row 1 to read signal lines SLA1, SLB1, SLA2, and SLB2, and read signal lines SLA1, SLB1, SLA2, and SLB2 are charged to voltages at levels in accordance with the quantity of incident light, respectively. Voltages of read signal lines SLA1, SLB1, SLA2, and SLB2 are amplified by amplifiers QA1, QB1, QA2, and QB2 respectively and provided to selector 16.

Then, while vertical scanning portion 13 selects pixel row 1, horizontal scanning portion 15 successively selects one of pixel columns 1, 2, 3, 4, and so on one by one, based on a horizontal scanning signal provided from control unit 14. Selector 16 selects output voltage VD of amplifier Q corresponding to the pixel column selected by horizontal scanning portion 15 and transmits the voltage to output portion 17.

Thereafter, vertical scanning portion 13 successively selects one of pixel row 2 to pixel row n one by one based on a vertical scanning signal provided from control unit 14 and horizontal scanning portion 15 successively selects one of pixel column 1 to pixel column n one by one based on a horizontal scanning signal provided from control unit 14. Thus, an operation similar to that for pixel row 1 above is repeated, and read signals corresponding to all pixels in the pixel array are output to output portion 17.

An operation of output portion 17 for generating a pixel signal will now be described in detail. Output portion 17 detects a quantity of light incident on the photoelectric conversion device based on a read signal and switches between read signals to be used based on a result of detection.

Figure 55:
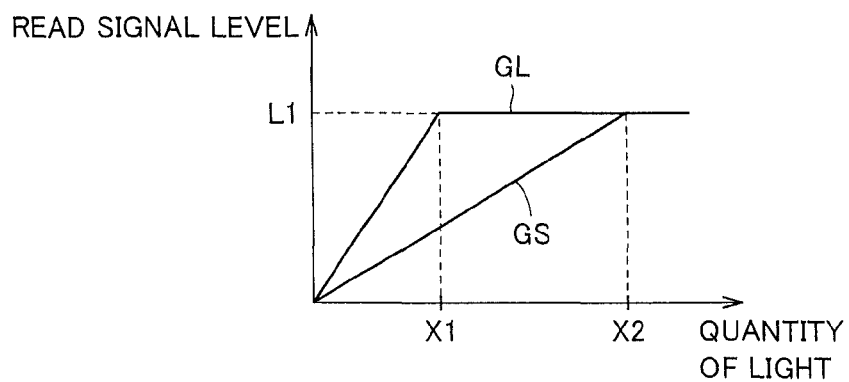
FIG. 55 is a graph showing relation between a quantity of incident light and a read signal level in the photoelectric conversion device shown in FIG. 54.

FIG. 55 is a graph showing relation between a quantity of incident light and a read signal level in the photoelectric conversion device according to Embodiment 7 of the present invention. In FIG. 55, GL represents a read signal generated based on charges received by pixel electrode ELA and GS represents a read signal generated based on charges received by pixel electrode ELB.

Referring to FIG. 55, a read signal output from read circuit G receiving charges from pixel electrode ELA greater in area is saturated when the quantity of light α is not smaller than X1. On the other hand, a read signal output from read circuit G receiving charges from pixel electrode ELB smaller in area is saturated when the quantity of light α is not smaller than X2 which is not smaller than X1.

Therefore, output portion 17 selects a read signal based on charges from pixel electrode ELA when the quantity of received light is less than X1 and selects a read signal based on charges from pixel electrode ELB when the quantity of received light is not smaller than X1.

Referring again to FIG. 54, when the quantity of received light is less than X1 and pixel row 1 is selected, output portion 17 selects a read signal received from amplifier QA1 corresponding to pixel electrode ELA11 in pixel row 1 and generates a pixel signal based on the selected read signal. Then, output portion 17 selects a read signal received from amplifier QA2 corresponding to pixel electrode ELA12 in pixel row 1 and generates a pixel signal based on the selected read signal. Thus, while vertical scanning portion 13 selects pixel row 1, output portion 17 successively selects a read signal corresponding to each pixel electrode ELA and generates a pixel signal. Namely, the output portion generates a pixel signal based on a read signal corresponding to pixel column 1, 3, 5, and so on.

On the other hand, when the quantity of received light is equal to or greater than X1 and pixel row 1 is selected, output portion 17 selects a read signal received from amplifier QB1 corresponding to pixel electrode ELB11 in pixel row 1 and generates a pixel signal based on the selected read signal. Then, output portion 17 selects a read signal received from amplifier QB2 corresponding to pixel electrode ELB12 in pixel row 1 and generates a pixel signal based on the selected read signal. Thus, while vertical scanning portion 13 selects pixel row 1, output portion 17 successively selects a read signal corresponding to each pixel electrode ELB and generates a pixel signal. Namely, the output portion generates a pixel signal based on a read signal corresponding to pixel column 2, 4, 6, and so on.

Thereafter, one of pixel row 2 to pixel row n is successively selected one by one, and output portion 17 successively selects each read signal corresponding to pixel electrode ELA or ELB. Thus, an operation similar to that for pixel row 1 above is repeated.

Figure 56:
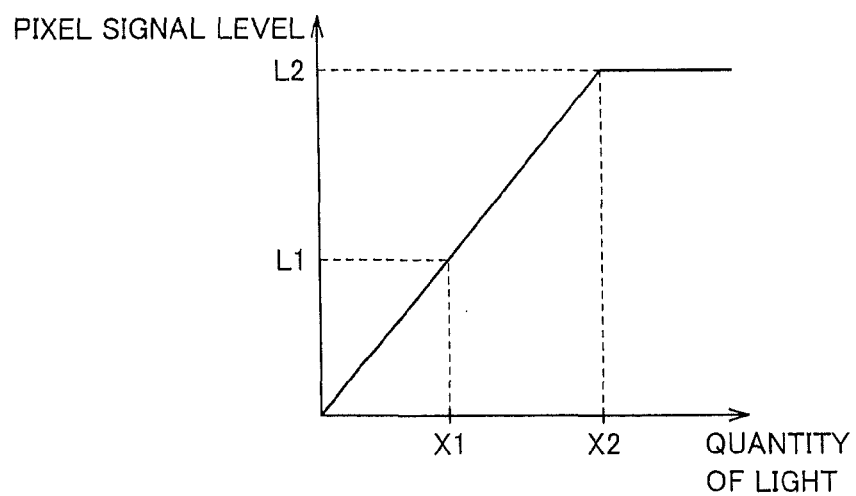
FIG. 56 is a graph showing relation between a quantity of incident light and a pixel signal level in the photoelectric conversion device shown in FIG. 51.

FIG. 56 is a graph showing relation between a quantity of incident light and a pixel signal level in the photoelectric conversion device according to Embodiment 7 of the present invention.

Referring to FIG. 56, output portion (a signal processing portion) 17 generates a pixel signal based on each read signal received from each read circuit G through each amplifier Q and a size of each pixel electrode. Namely, output portion 17 generates a pixel signal by correcting a read signal from a pixel electrode selected by control unit 14 based on a size of the selected pixel electrode.

For example, when the quantity of received light is less than X1 and a read signal corresponding to pixel electrode ELA is selected, output portion 17 outputs a pixel signal having a level of the selected read signal.

Alternatively, when the quantity of received light is equal to or greater than X1 and a read signal corresponding to pixel electrode ELB is selected, output portion 17 outputs a pixel signal having a level calculated by multiplying a level of the selected read signal by (size of pixel electrode ELA/size of pixel electrode ELB).

Another example of generation of a pixel signal will now be described in detail.

When the quantity of received light is less than X1, output portion 17 selects a read signal based on charges from pixel electrode ELA, and when the quantity of received light is equal to or greater than X1, output portion 17 selects a read signal based on charges from pixel electrode ELA and pixel electrode ELB.

Referring again to FIG. 54, when the quantity of received light is less than X1 and pixel row 1 is selected, output portion 17 selects a read signal received from amplifier QA1 corresponding to pixel electrode ELA11 in pixel row 1 and generates a pixel signal based on the selected read signal. Then, output portion 17 selects a read signal received from amplifier QA2 corresponding to pixel electrode ELA12 in pixel row 1 and generates a pixel signal based on the selected read signal. Thus, while vertical scanning portion 13 selects pixel row 1, output portion 17 successively selects a read signal corresponding to each pixel electrode ELA and generates a pixel signal. Namely, the output portion generates a pixel signal based on a read signal corresponding to pixel column 1, 3, 5, and so on.

Thereafter, one of pixel row 2 to pixel row n is successively selected one by one, and output portion 17 successively selects each read signal corresponding to pixel electrode ELA. Thus, an operation similar to that for pixel row 1 above is repeated.

On the other hand, when the quantity of received light is equal to or greater than X1 and pixel row 1 is selected, output portion 17 selects read signals received from amplifiers QA1 and QB1 corresponding to pixel electrodes ELA11 and ELB11 in pixel row 1 and generates a pixel signal based on respective selected read signals. Then, output portion 17 selects read signals received from amplifiers QA2 and QB2 corresponding to pixel electrodes ELA12 and ELB12 in pixel row 1 and generates a pixel signal based on respective selected read signals. Thus, while vertical scanning portion 13 selects pixel row 1, output portion 17 successively selects read signals corresponding to pixel electrodes ELA and ELB and generates a pixel signal. Namely, the output portion generates a pixel signal based on a read signal corresponding to pixel column 1, 2, 3, and so on.

Thereafter, one of pixel row 2 to pixel row n is successively selected one by one, and output portion 17 successively selects respective read signals corresponding to pixel electrodes ELA and ELB. Thus, an operation similar to that for pixel row 1 above is repeated.

Another example of an operation of the photoelectric conversion device according to Embodiment 7 of the present invention for generating a pixel signal will now be described in detail.

Figure 57:
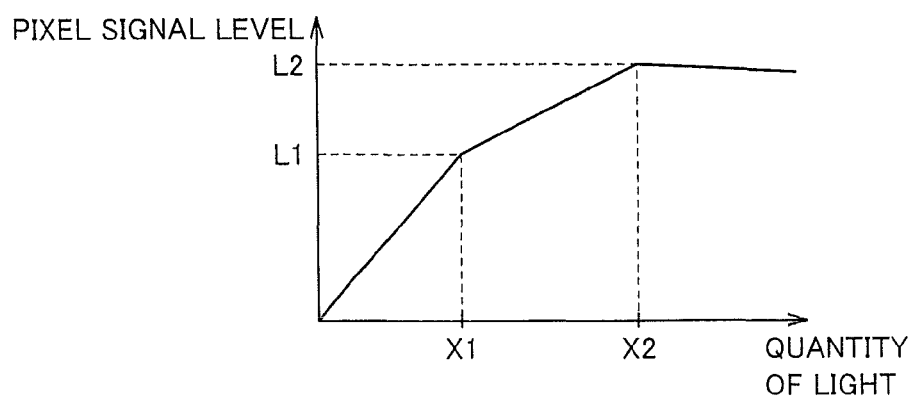
FIG. 57 is a graph showing other relation between a quantity of incident light and a pixel signal level in the photoelectric conversion device shown in FIG. 51.

FIG. 57 is a graph showing relation between a quantity of incident light and a pixel signal level in the photoelectric conversion device according to Embodiment 7 of the present invention.

Referring to FIG. 57, output portion 17 generates a pixel signal based on each read signal received from each read circuit G through each amplifier Q and a size of each pixel electrode. Namely, output portion 17 selectively performs an operation to select any one of the plurality of read signals and generate a pixel signal based on the selected read signal and an operation to select read signals of the plurality of read signals and combine the plurality of selected read signals to thereby generate a pixel signal.

For example, when the quantity of received light is less than X1, output portion 17 selects a read signal corresponding to pixel electrode ELA which is a large electrode and outputs a pixel signal having a level of the selected read signal.

Alternatively, when the quantity of received light is equal to or greater than X1, output portion 17 selects read signals corresponding to pixel electrode ELA and pixel electrode ELB and combines the selected read signals. Namely, output portion 17 outputs a pixel signal having a level calculated by adding a level of a read signal corresponding to pixel electrode ELA and a level of a read signal corresponding to pixel electrode ELB to each other.

As described above, in the photoelectric conversion device according to Embodiment 7 of the present invention, electrodes different in size are employed. For example, when a quantity of received light is small, an electric signal from a large electrode is selected, and when a quantity of received light is great, an electric signal from a small electrode is selected.

Alternatively, when a quantity of received light is small, an electric signal from a large electrode is selected, and when a quantity of received light is great, electric signals from a small electrode and a large electrode are combined.

According to such a configuration, when a quantity of received light is small, a large electrode is used to improve sensitivity, and when a quantity of received light is great, a small electrode is used to suppress saturation of a pixel signal. Therefore, the dynamic range can be broadened. In addition, charges generated in CIGS thin film 23 are stored in the large electrode and the small electrode for periods of time identical in length, and a pixel signal is generated based on each electric signal thus obtained. Therefore, even when an image of a subject moving fast is picked up, deviation of the image can be avoided and the dynamic range can be broadened also for a fast-moving image.

In addition, electric signals from a large electrode and a small electrode are selected or combined. Therefore, even though electrical isolation between the large electrode and the small electrode is not sufficient, deterioration in electric signal caused thereby can be prevented.

It is noted that output portion 17 may be configured to switch selection of a read signal in accordance with a quantity of received light for each pixel processing for one screen, that is, for the entire pixel array, or configured to switch selection during processing of one screen.

In addition, output portion 17 may be configured to output a pixel signal, which is an analog signal, based on a read signal which is an analog signal, or configured to output a pixel signal, which is a digital signal, by carrying out analog/digital conversion.

Figure 58:
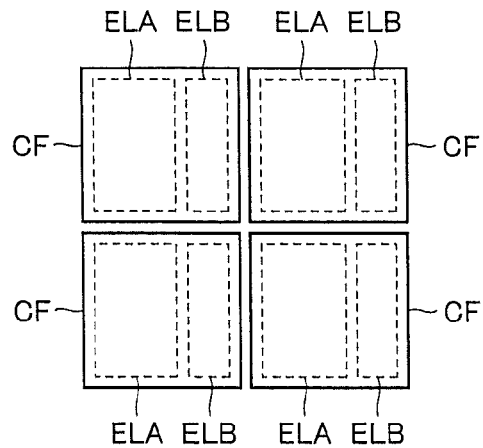
FIG. 58 is a diagram of the photoelectric conversion device shown in FIG. 51 when viewed from above.

FIG. 58 is a diagram of the photoelectric conversion device according to Embodiment 7 of the present invention when viewed from above.

Referring to FIG. 58, the photoelectric conversion device further includes color filters CF.

Color filters CF are provided on a side of CIGS thin film 23 opposite to pixel electrode EL and they are in Bayer arrangement. Namely, color filter CF includes a filter region of R (red), a filter region of B (blue), a filter region of Gr (green), and a filter region of Gb (green). It is noted that Gr and Gb represent green colors arranged in rows where R and B are arranged, respectively.

A plurality of sets of pixel electrodes ELA and ELB are provided for each region corresponding to the same pixel and the same color of color filter CF.

Here, in the conventional method of combining electric signals obtained during a plurality of periods different in time length for storing charges from the photoelectric conversion elements, in particular when a color image is to be displayed and an image of a moving subject is to be picked up, images of a subject at different time points are synthesized. Therefore, electric signals corresponding to filter regions different in color are synthesized, and what is called a false color signal may be generated.

According to the photoelectric conversion device according to Embodiment 7 of the present invention, however, electrodes different in size are brought in correspondence with the same pixel and the same color of the color filter. Then, charges generated in CIGS thin film 23 are stored for the same period of time in each electrode and a pixel signal is generated based on each electric signal thus obtained. Therefore, combination of electric signals different in color can be prevented. Thus, adaptation to a color image is facilitated and a good color image can be obtained. In addition, according to the conventional method, since images of a subject at different time points are synthesized, moire (interference fringes) may occur. In the photoelectric conversion device according to Embodiment 7 of the present invention, however, lengths of time for storing charges in the large electrode and the small electrode are the same, and hence occurrence of moire (interference fringes) can be prevented.

Figure 59:
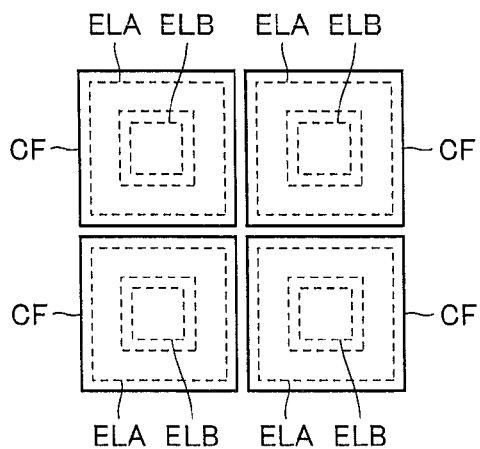
FIG. 59 is a diagram of a pixel electrode in a variation of the photoelectric conversion device according to Embodiment 7 when viewed from above.

FIG. 59 is a diagram of a pixel electrode in a variation of the photoelectric conversion device according to Embodiment 7 when viewed from above.

Referring to FIG. 59, pixel electrode ELA is in a rectangular shape. In addition, rectangular pixel electrode ELB is provided in a space formed by pixel electrode ELA.

Figure 60:
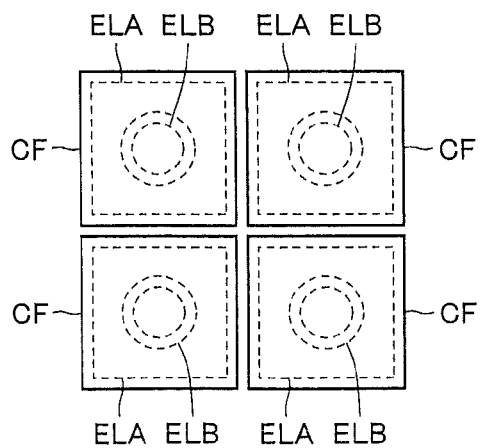
FIG. 60 is a diagram of a pixel electrode in another variation of the photoelectric conversion device according to Embodiment 7 when viewed from above.

FIG. 60 is a diagram of a pixel electrode in a variation of the photoelectric conversion device according to Embodiment 7 when viewed from above.

Referring to FIG. 60, pixel electrode ELA extends in a rectangular shape and it has a circular space inside. In addition, circular pixel electrode ELB is provided in a space formed by pixel electrode ELA.

Embodiment 8

Present Embodiment 8 relates to a photoelectric conversion device having pixel electrodes substantially the same in size, as compared with the photoelectric conversion device according to Embodiment 7. The photoelectric conversion device is the same as the photoelectric conversion device according to Embodiment 7, except for the description below.

Figure 61:
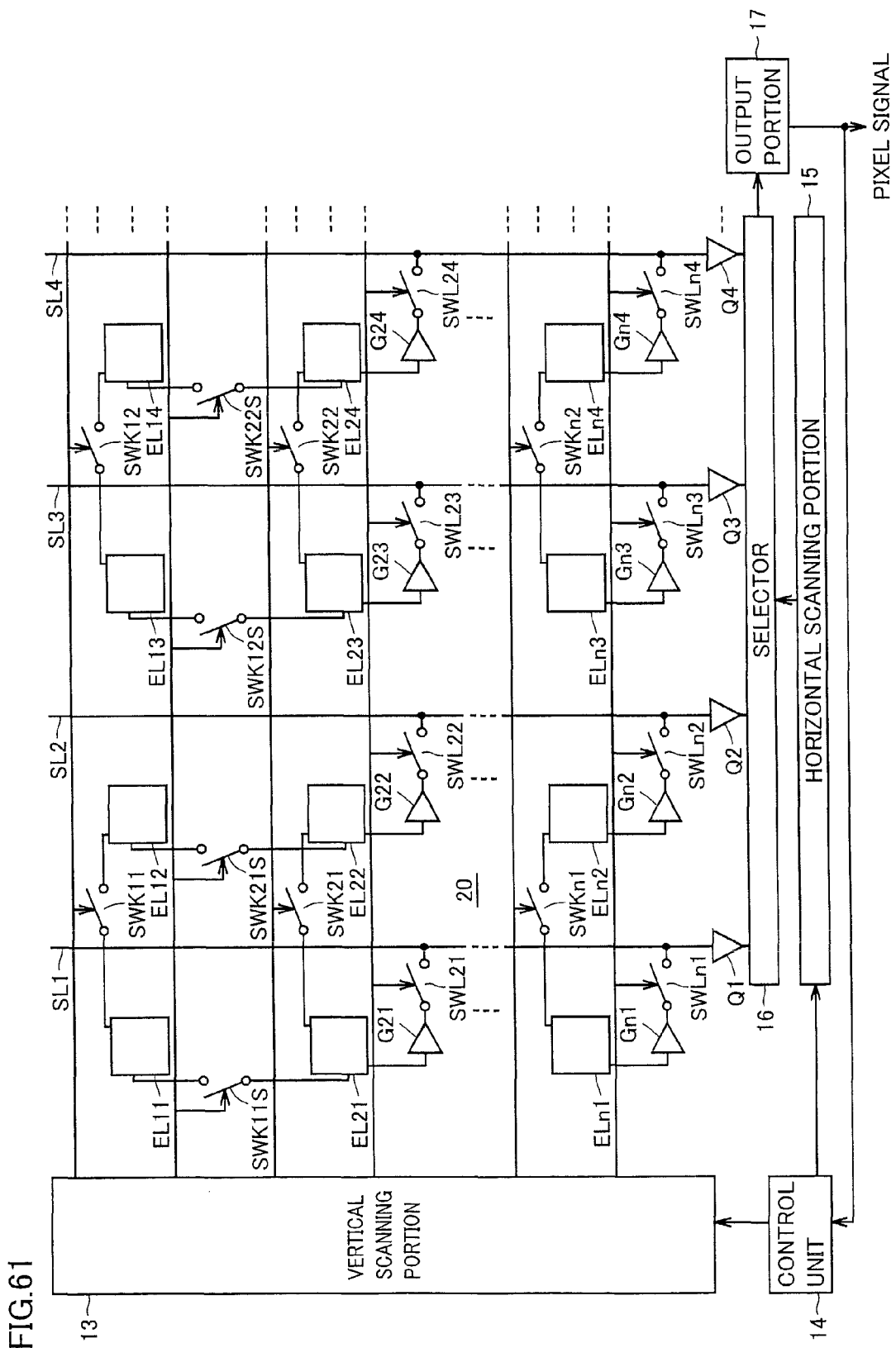
FIG. 61 is a diagram showing relation between a pixel electrode and a switch in a photoelectric conversion device according to Embodiment 8 of the present invention.

FIG. 61 is a diagram showing relation between a pixel electrode and a switch in the photoelectric conversion device according to Embodiment 8 of the present invention. FIG. 61 representatively shows some of circuits corresponding to pixels in a plurality of rows and a plurality of columns and mainly illustrates an operation of these circuits.

Referring to FIG. 61, the pixel array includes a plurality of pixel electrodes EL aligned in n rows and n columns. In the photoelectric conversion device as compared with the photoelectric conversion device according to Embodiment 7 of the present invention, the pixel array includes a plurality of pixel electrode groups each constituted of four pixel electrodes EL substantially the same in size in the direction of extension of CIGS thin film 23. Four pixel electrodes EL in each pixel electrode group are provided proximate to one another on the surface of CIGS thin film 23. In addition, the pixel electrode group is provided for each region corresponding to the same pixel and the same color of color filter CF. Moreover, the pixel array includes a plurality of switches SWK and a plurality of switches SWL.

Here, first, second, . . . , and nth pixel rows are referred to as pixel row 1, pixel row 2, . . . , and pixel row n respectively, and first, second, . . . , and nth pixel columns are referred to as pixel column 1, pixel column 2, . . . , and pixel column n respectively. In one example shown in FIG. 61, n is an even number not smaller than 4.

Namely, pixel electrodes EL11, EL12, EL13, EL14, and so on correspond to pixel row 1, pixel electrodes EL21, EL22, EL23, EL24, and so on correspond to pixel row 2, and pixel electrodes ELn1, ELn2, ELn3, ELn4, and so on correspond to pixel row n. In addition, pixel electrodes EL11, EL21, . . . , and ELn1 correspond to pixel column 1, pixel electrodes EL12, EL22, . . . , and ELn2 correspond to pixel column 2, pixel electrodes EL13, EL23, . . . , and ELn3 correspond to pixel column 3, and pixel electrodes EL14, EL24, . . . , and ELn4 correspond to pixel column 4 These pixel electrodes correspond to pixel electrode EL in the photoelectric conversion device according to Embodiment 7 of the present invention.

Read circuit G is provided every other pixel row. More specifically, read circuits G21, G22, G23, and G24 are connected to pixel electrodes EL21, EL22, EL23, and EL24, respectively. Read circuits Gn1, Gn2, Gn3, and Gn4 are connected to pixel electrodes ELn1, ELn2, ELn3, and ELn4, respectively. These read circuits correspond to read circuit G in the photoelectric conversion device according to Embodiment 7 of the present invention.

Switch SWL is provided in correspondence with read circuit G. In FIG. 61, switch SWL21, SWL22, SWL23, SWL24 switches whether to output a read signal received from read circuit G21, G22, G23, G24 to a corresponding read signal line or not. Switch SWLn1, SWLn2, SWLn3, SWLn4 switches whether to output a read signal received from read circuit Gn1, Gn2, Gn3, Gn4 to a corresponding read signal line. These switches SWL correspond to switch SWB in the photoelectric conversion device according to Embodiment 7 of the present invention.

In addition, read signal lines SL1, SL2, SL3, and SL4 are provided in correspondence with pixel columns 1 to 4 respectively. These signal lines correspond to read signal line SL in the photoelectric conversion device according to Embodiment 7 of the present invention.

Amplifiers Q1, Q2, Q3, and Q4 are connected to the other ends of read signal lines SL1, SL2, SL3, and SL4, respectively. These amplifiers correspond to amplifier Q in the photoelectric conversion device according to Embodiment 7 of the present invention.

Switch SWK is connected between pixel electrodes EL and provided such that pixel electrodes EL in the pixel electrode group can electrically be connected to each other through switch SWK. More specifically, a switch SWK11 is connected between pixel electrode EL11 and pixel electrode EL12, and a switch SWK12 is connected between pixel electrode EL13 and pixel electrode EL14. A switch SWK21 is connected between pixel electrode EL21 and pixel electrode EL22, and a switch SWK22 is connected between pixel electrode EL23 and pixel electrode EL24. A switch SWKn1 is connected between pixel electrode ELn1 and pixel electrode ELn2, and a switch SWKn2 is connected between pixel electrode ELn3 and pixel electrode ELn4.

Further, a switch SWK11S is connected between pixel electrode EL11 and pixel electrode EL21, a switch SWK21S is connected between pixel electrode EL12 and pixel electrode EL22, a switch SWK12S is connected between pixel electrode EL13 and pixel electrode EL23, and a switch SWK22S is connected between pixel electrode EL14 and pixel electrode EL24.

An operation of the photoelectric conversion device according to Embodiment 8 of the present invention for generating a pixel signal will now be described in detail. Initially, an operation of control unit 14 will be described in detail.

Vertical scanning portion 13 initially selects pixel rows 1 and 2 based on a vertical scanning signal provided from control unit 14 and turns on switches SWL21, SWL22, SWL23, and SWL24 in selected pixel rows 1 and 2. In addition, vertical scanning portion 13 turns off switches SWL corresponding to pixel rows that have not been selected.

In addition, by controlling ON/OFF of the plurality of switches SWK, control unit 14 makes up a plurality of sets of pixel electrodes EL different from one another in the number of included pixel electrodes EL connected to read circuit G, the sets not being electrically connected to one another through switch SWK. Then, in the set including a plurality of pixel electrodes EL, control unit 14 causes the plurality of pixel electrodes EL to electrically be connected to one another through switch SWK.

More specifically, based on a vertical scanning signal provided from control unit 14, vertical scanning portion 13 turns on switches SWK11 and SWK11S, turns off switches SWK21 and SWK21S, turns on switches SWK12 and SWK12S, and turns off switches SWK22 and SWK22S.

Figure 62:
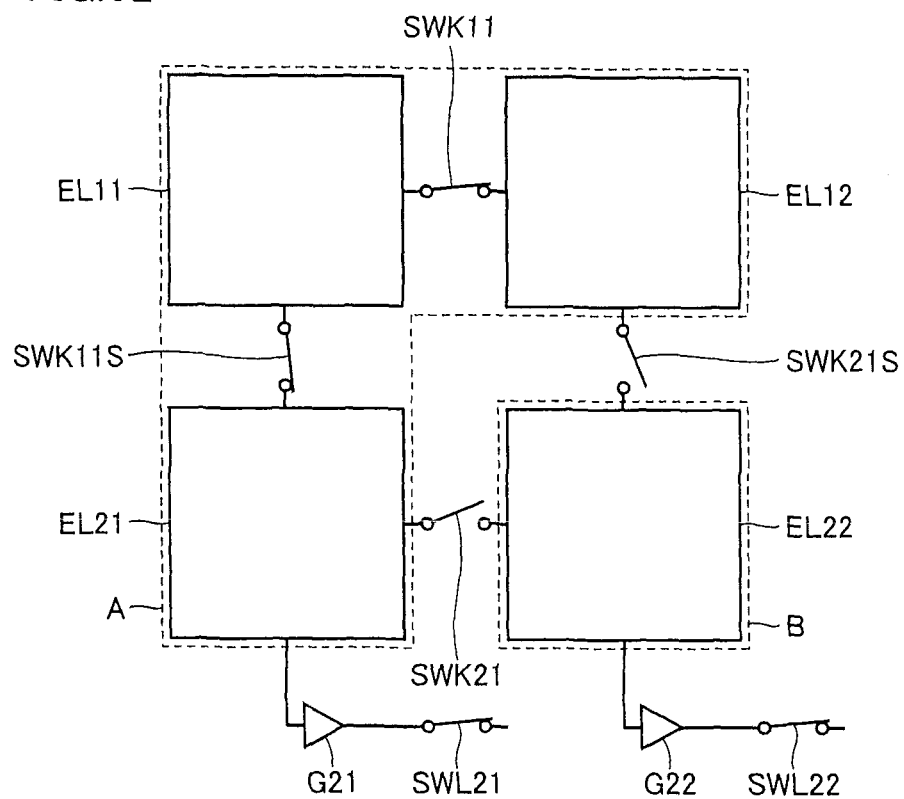
FIG. 62 is a diagram showing switch setting in one pixel electrode group.

FIG. 62 is a diagram showing switch setting in one pixel electrode group.

Referring to FIG. 62, by setting switches SWK as above, a group A of three pixel electrodes including pixel electrodes electrically connected to one another through switches SWK and connected to read circuit G and a group B including one pixel electrode connected to read circuit G are made. Groups A and B are not electrically connected to each other through switch SWK.

Referring again to FIG. 61, a current at a level in accordance with the total sum of quantities of light incident on photodiodes PD corresponding to pixel electrodes EL11, EL12 and EL21 is output from read circuit G21 in selected pixel rows 1 and 2 to read signal line SL1, and a current at a level in accordance with a quantity of light incident on photodiode PD corresponding to pixel electrode EL22 is output from read circuit G22 to read signal line SL2. In addition, a current at a level in accordance with the total sum of quantities of light incident on photodiodes PD corresponding to pixel electrodes EL13, EL14 and EL23 is output from read circuit G23 in selected pixel rows 1 and 2 to read signal line SL3, and a current at a level in accordance with a quantity of light incident on photodiode PD corresponding to pixel electrode EL24 is output from read circuit G24 to read signal line SL4. Then, read signal lines SL1, SL2, SL3, and SL4 are charged to voltages at levels in accordance with these quantities of incident light, respectively. Voltages of read signal lines SL1, SL2, SL3, and SL4 are amplified by amplifiers Q1 to Q4 respectively and provided to selector 16.

Then, while vertical scanning portion 13 selects pixel rows 1 and 2, horizontal scanning portion 15 successively selects one of pixel columns 1, 2, 3, 4, and so on one by one based on a horizontal scanning signal provided from control unit 14. Selector 16 selects output voltage VD from amplifier Q corresponding to the pixel column selected by horizontal scanning portion 15 and transmits the voltage to output portion 17.

Thereafter, vertical scanning portion 13 successively selects two of pixel rows 3 to pixel row n based on a vertical scanning signal provided from control unit 14, and horizontal scanning portion 15 successively selects one of pixel column 1 to pixel column n one by one based on a horizontal scanning signal provided from control unit 14. Thus, an operation similar to that for pixel rows 1 and 2 above is repeated, and read signals corresponding to all pixels in the pixel array are output to output portion 17.

An operation of output portion 17 for generating a pixel signal will now be described in detail. Output portion 17 detects a quantity of light incident on the photoelectric conversion device based on a read signal and switches between read signals to be used based on a result of detection. Namely, when a quantity of received light is less than X1, output portion 17 selects a read signal based on charges from the pixel electrodes in group A, and when a quantity of received light is equal to or greater than X1, output portion 17 selects a read signal based on charges from the pixel electrode in group B.

More specifically, when the quantity of received light is less than X1 and pixel rows 1 and 2 are selected, output portion 17 selects a read signal from read circuit G21 receiving charges from three pixel electrodes EL11, EL12 and EL21 and generates a pixel signal based on the selected read signal. Then, output portion 17 selects a read signal received from read circuit G23 receiving charges from three pixel electrodes EL13, EL14 and EL23 and generates a pixel signal based on the selected read signal. Thus, while vertical scanning portion 13 selects pixel rows 1 and 2, output portion 17 successively selects a read signal corresponding to the three pixel electrodes electrically connected to one another and generates a pixel signal.

On the other hand, when the quantity of received light is equal to or greater than X1 and pixel rows 1 and 2 are selected, output portion 17 selects a read signal from read circuit G22 receiving charges from one pixel electrode EL22 and generates a pixel signal based on the selected read signal. Then, output portion 17 selects a read signal from read circuit G24 receiving charges from one pixel electrode EL24 and generates a pixel signal based on the selected read signal. Thus, while vertical scanning portion 13 selects pixel rows 1 and 2, output portion 17 successively selects a read signal corresponding to one pixel electrode not electrically connected to another pixel electrode and generates a pixel signal.

Thereafter, two of pixel row 3 to pixel row n are successively selected, and output portion 17 successively selects each read signal corresponding to three pixel electrodes EL or one pixel electrode EL. Thus, an operation similar to that for pixel row 1 above is repeated.

Figure 63:
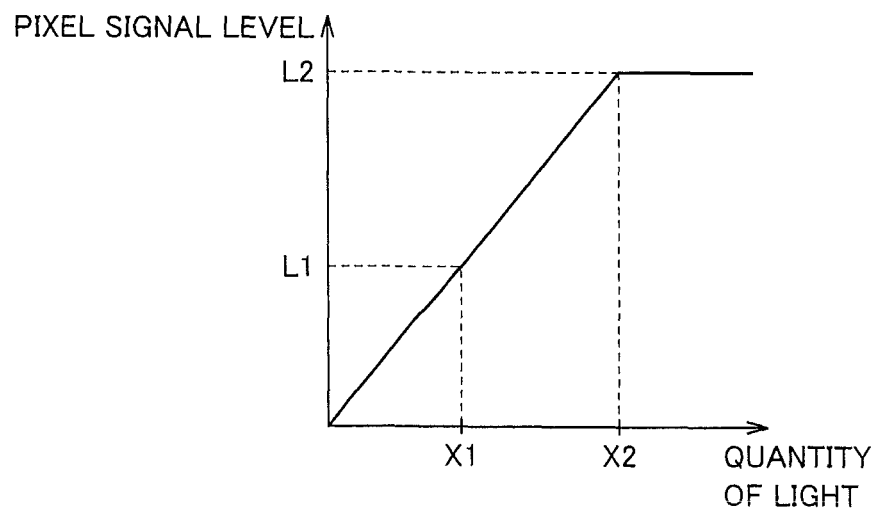
FIG. 63 is a graph showing relation between a quantity of incident light and a pixel signal level in the photoelectric conversion device shown in FIG. 61.

FIG. 63 is a graph showing relation between a quantity of incident light and a pixel signal level in the photoelectric conversion device according to Embodiment 8 of the present invention.

Referring to FIG. 63, output portion 17 generates a pixel signal based on each read signal received from each read circuit G through each amplifier Q and an ON/OFF state of each switch SWK. Namely, output portion 17 generates a pixel signal by correcting a read signal corresponding to a selected pixel electrode group based on the number of pixel electrodes belonging to the selected group.

For example, when the quantity of received light is less than X1 and a read signal corresponding to electrode group A is selected, output portion 17 outputs a pixel signal having a level of the selected read signal.

Alternatively, when the quantity of received light is equal to or greater than X1 and a read signal corresponding to electrode group B is selected, output portion 17 outputs a pixel signal having a level calculated by multiplying a level of the selected read signal by (the number of pixel electrodes EL belonging to electrode group A/the number of pixel electrodes EL belonging to electrode group B). In this example, output portion 17 outputs a pixel signal having a level calculated by multiplying a level of a read signal corresponding to selected group B by four.

Another example of an operation of the photoelectric conversion device according to Embodiment 8 of the present invention for generating a pixel signal will now be described in detail.

When a quantity of received light is less than X1, output portion 17 selects a read signal based on charges from group A, and when a quantity of received light is equal to or greater than X1, output portion 17 selects a read signal based on charges from group A and group B.

More specifically, when the quantity of received light is less than X1 and pixel rows 1 and 2 are selected, output portion 17 selects a read signal from read circuit G21 receiving charges from three pixel electrodes EL11, EL12 and EL21 and generates a pixel signal based on the selected read signal. Then, output portion 17 selects a read signal from read circuit G23 receiving charges from three pixel electrodes EL13, EL14 and EL23 and generates a pixel signal based on the selected read signal. Thus, while vertical scanning portion 13 selects pixel rows 1 and 2, output portion 17 successively selects a read signal corresponding to the three pixel electrodes electrically connected to one another and generates a pixel signal.

On the other hand, when the quantity of received light is equal to or greater than X1 and pixel row 1 is selected, output portion 17 selects a read signal from read circuit G21 receiving charges from three pixel electrodes EL11, EL12 and EL21 and a read signal from read circuit G22 receiving charges from one pixel electrode EL22 and generates a pixel signal based on the selected read signals. Then, output portion 17 selects a read signal from read circuit G23 receiving charges from three pixel electrodes EL13, EL14 and EL23 and a read signal from read circuit G24 receiving charges from one pixel electrode EL24 and generates a pixel signal based on the selected read signals. Thus, while vertical scanning portion 13 selects pixel rows 1 and 2, output portion 17 successively selects a read signal corresponding to three pixel electrodes electrically connected to one another and each read signal corresponding to one pixel electrode not electrically connected to another pixel electrode and generates a pixel signal.

Thereafter, two of pixel row 3 to pixel row n are successively selected, and output portion 17 successively selects read signals corresponding to three pixel electrodes EL and one pixel electrode EL and combines the read signals. Thus, an operation similar to that for pixel row 1 above is repeated.

Figure 64:
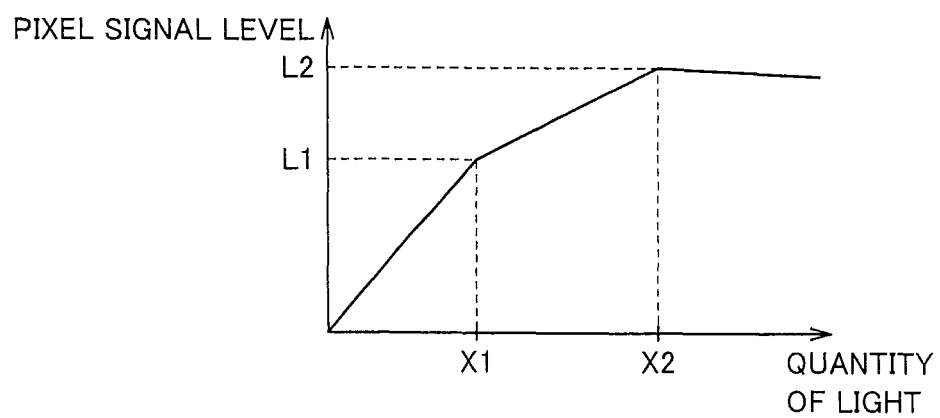
FIG. 64 is a graph showing other relation between a quantity of incident light and a pixel signal level in the photoelectric conversion device shown in FIG. 61.

FIG. 64 is a graph showing relation between a quantity of incident light and a pixel signal level in the photoelectric conversion device according to Embodiment 8 of the present invention.

Referring to FIG. 64, output portion 17 generates a pixel signal based on each read signal received from each read circuit G through each amplifier Q and an ON/OFF state of each switch SWK. Namely, output portion 17 selectively performs an operation to select any of the plurality of groups and generate a pixel signal based on the read signal corresponding to the selected group and an operation to select groups of the plurality of groups and combine the plurality of read signals corresponding to the plurality of selected groups to thereby generate a pixel signal.

For example, when the quantity of received light is less than X1, output portion 17 selects a read signal corresponding to group A greater in the number of pixel electrodes and outputs a pixel signal having a level of the selected read signal.

Alternatively, when the quantity of received light is equal to or greater than X1, output portion 17 selects a read signal corresponding to group A smaller in the number of pixel electrodes and group B greater in the number of pixel electrodes, and outputs a pixel signal having a level calculated by adding a level of the read signal corresponding to selected electrode group A and a level of the read signal corresponding to electrode group B to each other.

As described above, in the photoelectric conversion device according to Embodiment 8 of the present invention, when a quantity of received light is small, a read signal corresponding to a group greater in the number of electrodes can be used to improve sensitivity, and when a quantity of received light is great, a read signal corresponding to a group smaller in the number of electrodes can be used to suppress saturation of a pixel signal. Therefore, the dynamic range can be broadened. In addition, charges generated in CIGS thin film 23 are stored in the electrode(s) in group A and the electrode(s) in group B for the same period of time, and a pixel signal is generated based on each electric signal thus obtained. Therefore, even when an image of a subject moving fast is picked up, deviation of the image can be avoided and the dynamic range can be broadened also for a fast-moving image.

Therefore, likewise the photoelectric conversion device according to Embodiment 7 of the present invention, the photoelectric conversion device according to Embodiment 8 of the present invention can achieve a wider dynamic range and prevent deterioration of image quality.

In addition, electric signals from a large electrode and a small electrode are selected or combined. Therefore, even though electrical isolation between the large electrode and the small electrode is not sufficient, deterioration in electric signal caused thereby can be prevented.

Further, since electrodes substantially identical in size are employed in the pixel array, manufacturing can be simplified as compared with the photoelectric conversion device according to Embodiment 7 of the present invention. It is noted that the photoelectric conversion device according to Embodiment 7 of the present invention does not require switch SWK connected between pixel electrodes and hence the configuration can be simplified as compared with the photoelectric conversion device according to Embodiment 8 of the present invention.

Figure 65:
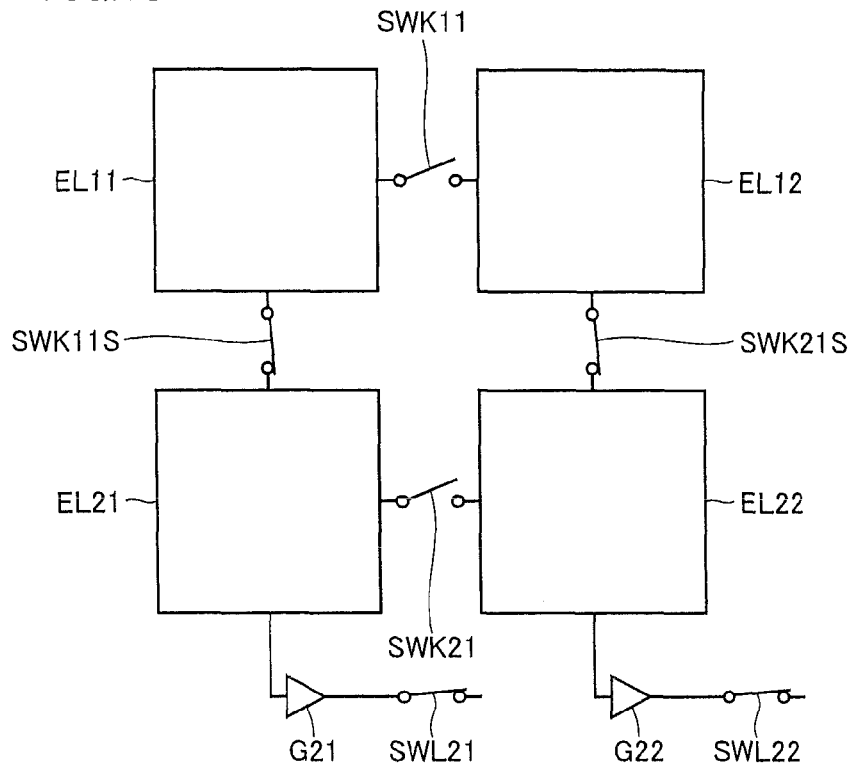
FIG. 65 is a diagram showing another example of switch setting in one pixel electrode group of the photoelectric conversion device shown in FIG. 61.

FIG. 65 is a diagram showing another example of switch setting in one pixel electrode group of the photoelectric conversion device according to Embodiment 8 of the present invention.

Referring to FIG. 65, pixel electrodes EL11 and EL21 adjacent in the pixel column are electrically connected to read circuit G21 through switch SWK, and pixel electrodes EL12 and EL22 adjacent in the pixel column are electrically connected to read circuit G22 through switch SWK. Here, switches SWL21 and SWL22 corresponding to read circuits G21 and G22 respectively are turned on.

Namely, a read signal based on charges received by two pixel electrodes and a read signal based on charges received by two other pixel electrodes can also be processed as separate signals. Thus, instead of broadening the dynamic range, resolution of a screen can be enhanced.

Figure 66:
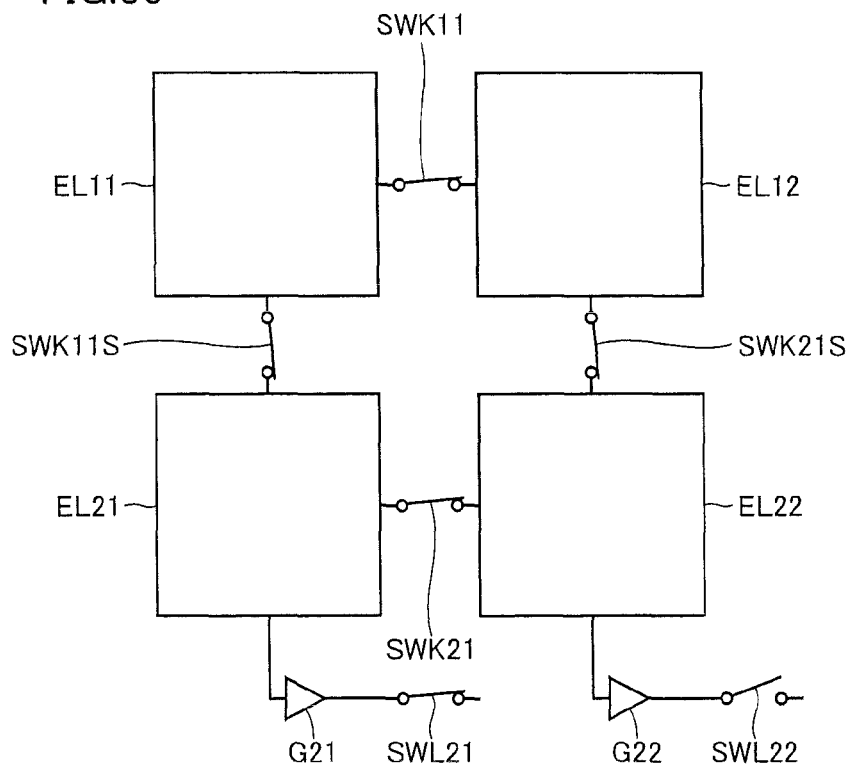
FIG. 66 is a diagram showing another example of switch setting in one pixel electrode group of the photoelectric conversion device shown in FIG. 61.

FIG. 66 is a diagram showing another example of switch setting in one pixel electrode group of the photoelectric conversion device according to Embodiment 8 of the present invention.

Referring to FIG. 66, pixel electrodes EL11, EL12, EL21, and EL22 are electrically connected to read circuit G21 through switches SWK. Here, switch SWL21 corresponding to read circuit G21 is turned on and switch SWL22 corresponding to read circuit G22 is turned off.

Namely, a read signal based on charges received by all pixel electrodes in one pixel electrode group can also be processed as one signal. Thus, instead of broadening the dynamic range, an area of pixel electrodes for reading charges generated in CIGS thin film 23 can be increased when illuminance is low, that is, when a quantity of light α is smaller than a normal level, and hence sensitivity of the photoelectric conversion device can be improved.

Further, in combining charges received by the pixel electrodes, only a read circuit corresponding to one pixel electrode among the pixel electrodes can be used. Namely, influence by noise in the read circuit corresponding to each pixel electrode can be suppressed to that in only a single read circuit. Thus, a voltage transmitted to output portion 17, that is, a signal component in the read signal, can be improved as many times as the number of pixel electrodes to be combined, and a noise component in the read signal transmitted to output portion 17 can be suppressed to noise only in a single read circuit. Therefore, an S/N (Signal to Noise) ratio of the read signal, that is, an S/N ratio of the pixel signal, can significantly be improved, and hence image quality can significantly be improved.

In the photoelectric conversion device according to Embodiment 8 of the present invention, simply by thus changing switch setting, a common circuit can address all of a case where improvement in the dynamic range is aimed, a case where improvement in resolution of a screen is aimed, and a case where improvement in image quality when illuminance is low is aimed.

Figure 67:
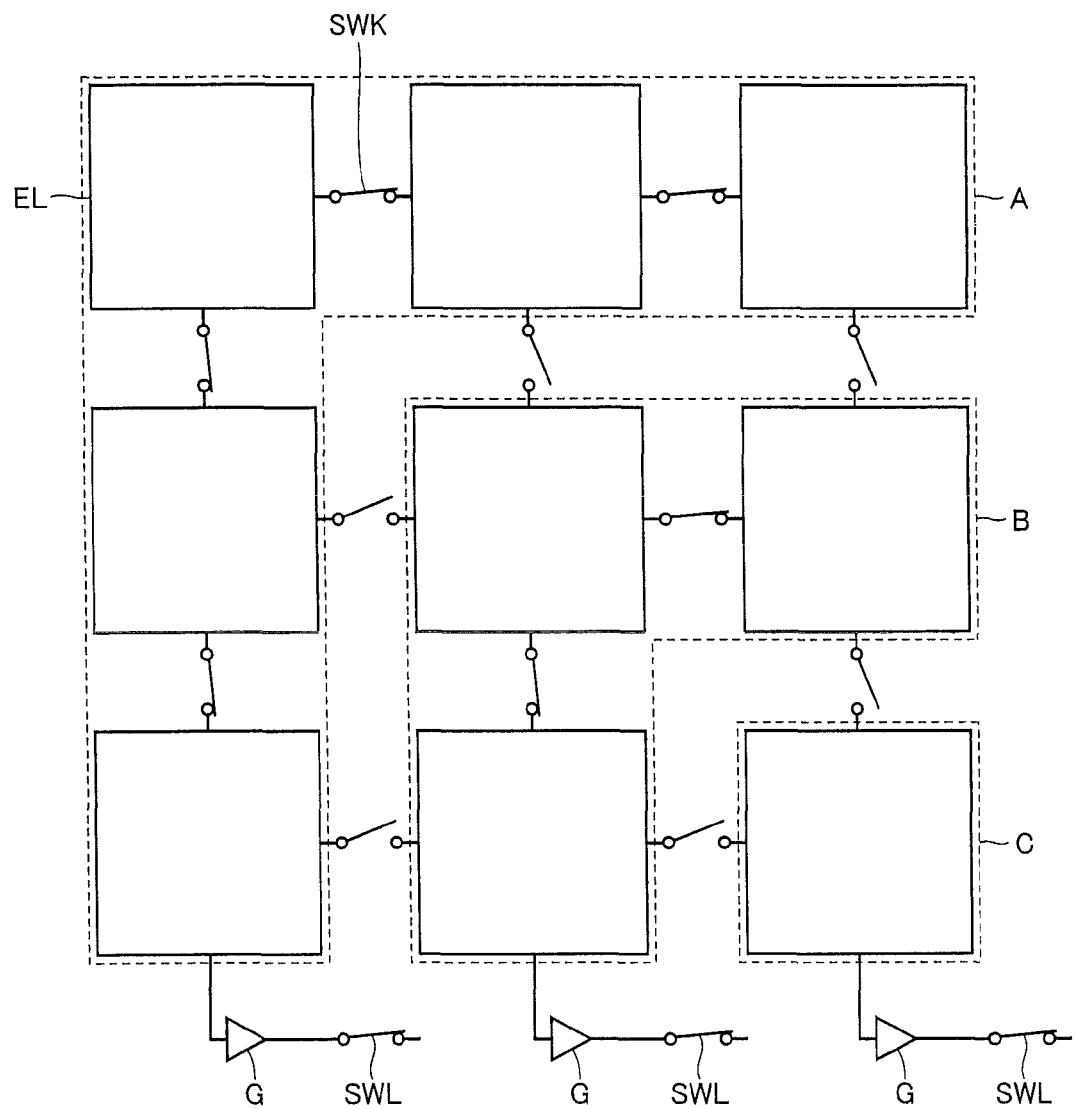
FIG. 67 is a diagram showing a variation of the photoelectric conversion device according to Embodiment 8.

FIG. 67 is a diagram showing a variation of the photoelectric conversion device according to Embodiment 8 of the present invention.

Referring to FIG. 67, a pixel array in the present variation includes a plurality of pixel electrode groups constituted of nine pixel electrodes EL substantially the same in size in the direction of extension of CIGS thin film 23. Nine pixel electrodes EL in each pixel electrode group are provided proximate to one another on the surface of CIGS thin film 23. In addition, the pixel electrode group is provided for each region corresponding to the same pixel and the same color of color filter CF. The pixel array includes a plurality of switches SWK.

Depending on setting of switches SWK by control unit 14, group A of five pixel electrodes including pixel electrodes electrically connected to one another through switches SWK and connected to read circuit G, group B including three pixel electrodes including pixel electrodes electrically connected to one another through switches SWK and connected to read circuit G, and a group C including one pixel electrode connected to read circuit G are made. Here, control unit 14 turns on each switch SWL corresponding to each read circuit corresponding to each of groups A, B and C.

When illuminance is low, output portion 17 selects a read signal corresponding to electrode group A, and as a quantity of received light becomes greater, output portion 17 selects a read signal corresponding to electrode group B and then a read signal corresponding to electrode group C in this order.

Alternatively, when illuminance is low, output portion 17 selects a read signal corresponding to electrode group A. As a quantity of received light becomes greater, output portion 17 combines the read signal corresponding to electrode group A and a read signal corresponding to electrode group B with each other. As a quantity of received light becomes further greater, output portion 17 combines read signals corresponding to electrode groups A, B and C together.

According to such a configuration, the dynamic range can further be broadened as compared with the photoelectric conversion device according to Embodiment 8 of the present invention.

Figure 68:
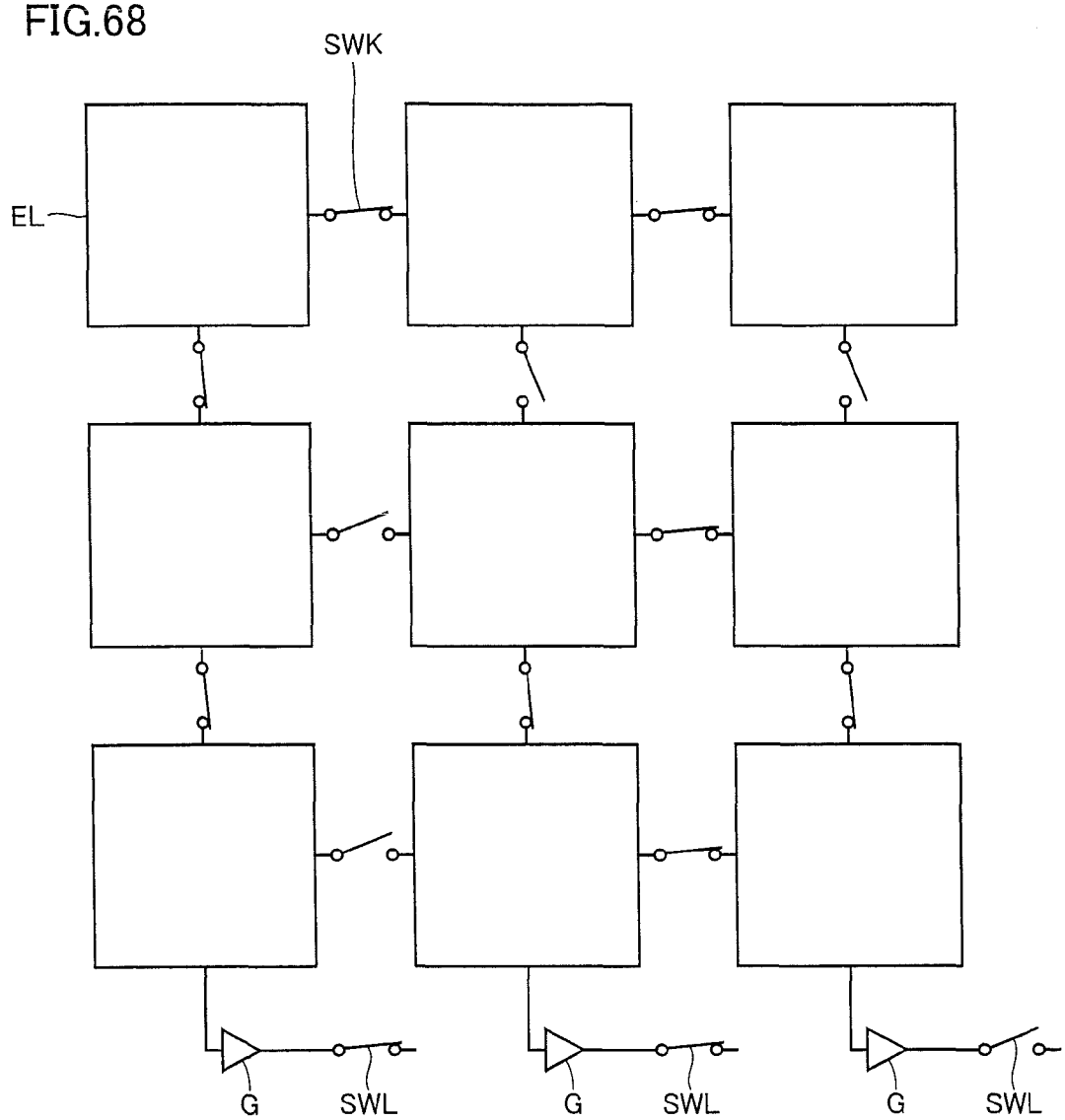
FIG. 68 is a diagram showing another example of setting of a switch SWK in a pixel electrode group in the variation of the photoelectric conversion device according to Embodiment 8.

FIG. 68 is a diagram showing another example of setting of switch SWK in a pixel electrode group in the variation of the photoelectric conversion device according to Embodiment 8 of the present invention.

Referring to FIG. 68, depending on setting of switches SWK by control unit 14, group A of five pixel electrodes including pixel electrodes electrically connected to one another through switches SWK and connected to read circuit G and group B including four pixel electrodes including pixel electrodes electrically connected to one another through switches SWK and connected to read circuit G are made. Here, control unit 14 turns on switch SWL connected to the read circuit corresponding to group A. In addition, since two pixel electrodes in group B are connected to read circuits G respectively, control unit 14 turns on any of two switches SWL connected to two read circuits G corresponding to group B.

Thus, influence by noise in the read circuit corresponding to each group can be suppressed to that in only a single read circuit. Therefore, an S/N ratio of the read signal, that is, an S/N ratio of the pixel signal, can significantly be improved and hence image quality can significantly be improved.

Since the configuration and the operation are otherwise the same as in the photoelectric conversion device according to Embodiment 8, detailed description will not be repeated here.

The photoelectric conversion device according to Embodiment 8 of the present invention is configured such that a pixel electrode group is constituted of four pixel electrodes. Even though the photoelectric conversion device is configured such that a pixel electrode group is constituted of three pixel electrodes, however, the dynamic range can be broadened by division into a group constituted of two pixel electrodes and a group consisting of a single pixel electrode.

In addition, output portion 17 may be configured to switch selection of a read signal in accordance with a quantity of received light for each pixel processing for one screen, that is, for the entire pixel array, or configured to switch selection during processing of one screen.

Moreover, output portion 17 may be configured to output a pixel signal, which is an analog signal, based on a read signal which is an analog signal, or configured to output a pixel signal, which is a digital signal, by carrying out analog/digital conversion.

Embodiment 9

In a conventional first image sensor, a transparent electrode is formed on a surface of a CIGS thin film and a plurality of pixel electrodes are formed on a back surface of the CIGS thin film. When the CIGS thin film is irradiated with light, electron-hole pairs in an amount in accordance with a quantity of light are produced. Holes, that is, positive charges, of the electron-hole pairs produced in the CIGS thin film flow to a read circuit through the pixel electrode.

In a conventional second image sensor, a CIGS thin film is etched and separated into a plurality of CIGS layers, a transparent electrode is formed on a surface of each CIGS layer, and a pixel electrode is formed on a back surface of each CIGS layer.

In the conventional first image sensor, however, since the CIGS thin film is not separated for each pixel, positive charges generated in the CIGS thin film do not necessarily flow to a pixel electrode directly under the CIGS thin film and image resolution has disadvantageously been low.

In the conventional second image sensor, since one CIGS thin film is etched and separated into a plurality of CIGS layers, an area or the like of the CIGS layer has varied and variation in sensitivity among pixels has been disadvantageously great.

Therefore, a primary object of the invention in present Embodiment 9 is to provide a photoelectric conversion device achieving high image resolution and less variation in sensitivity among pixels.

Figure 69:
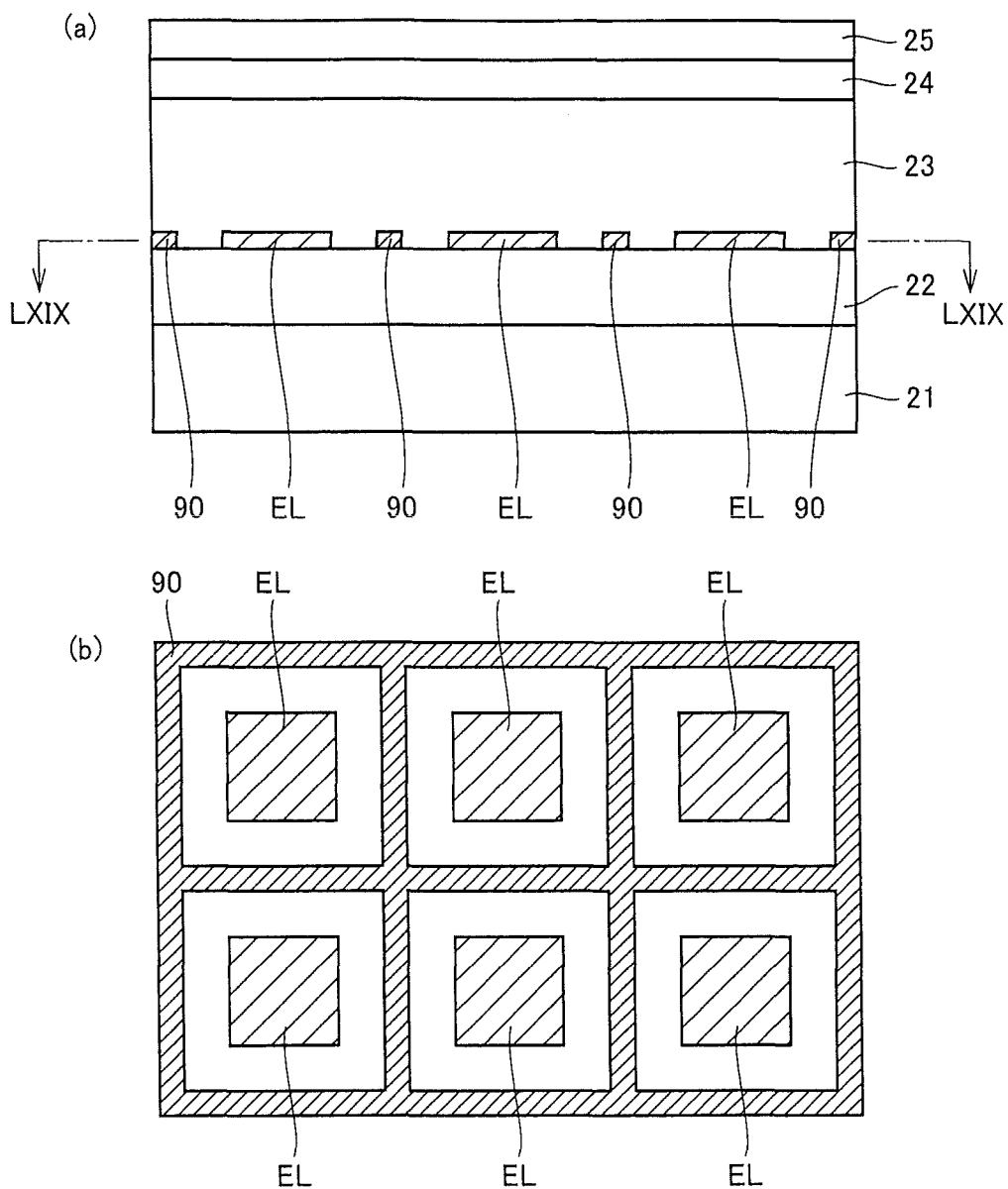
FIG. 69 is a cross-sectional view showing a main portion of a pixel array of an image sensor according to Embodiment 9 of the present invention.

FIG. 69($a$) is a cross-sectional view showing a main portion of a pixel array of the photoelectric conversion device according to Embodiment 9 of the present invention. FIG. 69($b$) is a cross-sectional view along the line LXIX-LXIX in FIG. 69($a$). In FIGS. 69($a$) and 69($b$), the pixel array includes semiconductor substrate 21. Read circuit layer 22 is formed on the surface of semiconductor substrate 21. Read circuit layer 22 is constituted of a MOS transistor, a capacitor, a line, an insulating layer, a via hole, and the like.

A plurality of pixel electrodes EL are arranged on a surface of read circuit layer 22 at prescribed intervals. The plurality of pixel electrodes EL are aligned in a plurality of rows and a plurality of columns. In addition, an isolation electrode 90 is formed to surround each pixel electrode EL on the surface of read circuit layer 22. In other words, isolation electrode 90 like a lattice is formed on the surface of read circuit layer 22, and quadrangular pixel electrode EL is formed in a central portion of each quadrangular region surrounded by isolation electrode 90. Each of electrodes EL and 90 is formed of Mo.

CIGS thin film 23 is formed to cover the plurality of pixel electrodes EL and isolation electrode 90, and CdS layer 24 and transparent electrode 25 are stacked on a surface of CIGS thin film 23. CIGS thin film 23 is a p-type compound semiconductor thin film and it has a thickness, for example, of 1.7 μm. CdS layer 24 is a buffer layer formed with an n-type compound semiconductor thin film and it has a thickness, for example, of 50 nm. Transparent electrode 25 is implemented, for example, by a ZnO film, and it has a thickness, for example, of 1 μm. Therefore, CIGS thin film 23 and transparent electrode 25 form a PN junction.

In other words, CIGS thin film 23 serving as a photoelectric conversion film is divided into a plurality of pixel regions, transparent electrode 25 is formed on a surface of CIGS thin film 23 with CdS layer 24 serving as a buffer layer being interposed, pixel electrode EL is formed in each pixel region on a back surface of CIGS thin film 23, and isolation electrode 90 is formed to surround each pixel electrode EL on the back surface of CIGS thin film 23.

Figure 70:
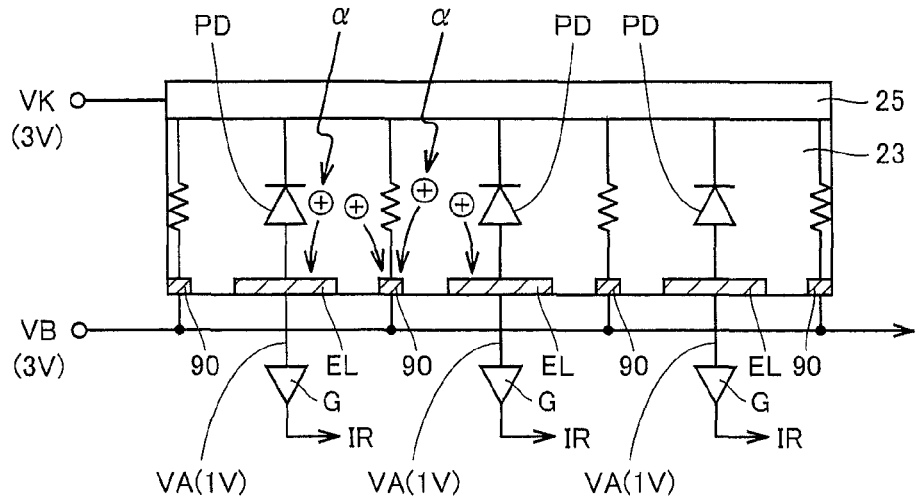
FIG. 70 is a diagram schematically showing a configuration and an operation of the pixel array shown in FIG. 69.

FIG. 70 is a diagram schematically showing a configuration and an operation of the pixel array shown in FIGS. 69(a) and 69(b). It is noted that CdS layer 24 serving as a buffer layer is not illustrated. In FIG. 70, read circuit G is provided in correspondence with each pixel electrode EL. Read circuit G is formed under corresponding pixel electrode EL in read circuit layer 22 in FIG. 69(a). During read operation, read circuit G applies anode voltage VA (for example, of 1 V) to corresponding pixel electrode EL and outputs current IR at a level in accordance with the amount of charges that flowed in corresponding pixel electrode EL.

In addition, cathode voltage VK (for example, of 3 V), which is higher than anode voltage VA, is applied to transparent electrode 25, and bias voltage VB (in this case, of 3 V) as high as cathode voltage VK is applied to isolation electrode 90. Thus, a depletion layer is formed between each electrode EL and transparent electrode 25, and a region between each electrode EL and transparent electrode 25 operates as photodiode PD. Each pixel electrode EL serves as the anode of photodiode PD and transparent electrode 25 serves as the cathode of photodiode PD. Meanwhile, a depletion layer is not formed between transparent electrode 25 and isolation electrode 90, and a region between transparent electrode 25 and isolation electrode 90 operates as a resistor element.

When light α is incident on CIGS thin film 23 from the outside through transparent electrode 25, electron-hole pairs in an amount in accordance with the quantity of light are produced in CIGS thin film 23. Since holes are majority carriers in CIGS thin film 23, holes, that is, positive charges, flow into pixel electrode EL in the vicinity. Since there is no electric field, positive charges generated between two adjacent pixel electrodes EL disappear or they are absorbed by isolation electrode 90.

Figure 71:
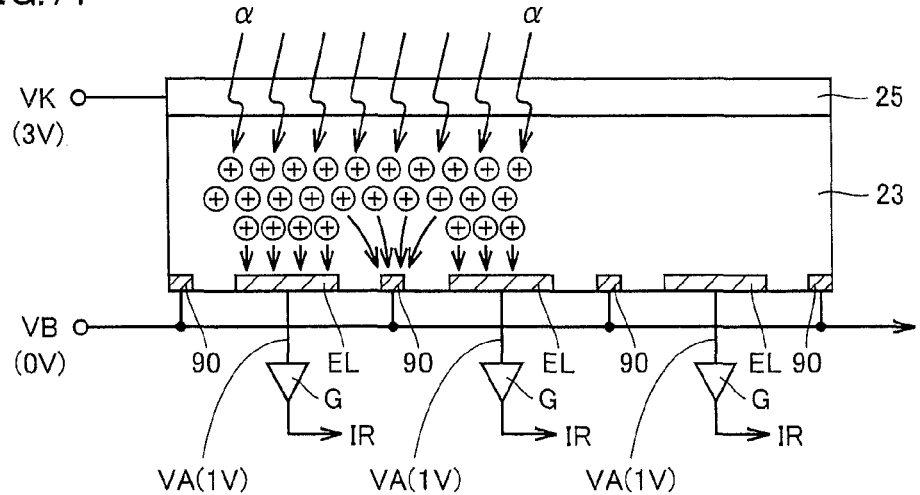
FIG. 71 is a diagram showing a comparative example of Embodiment 9.

As shown in FIG. 71, in a case where isolation electrode 90 is not provided, flow of positive charges generated in each pixel region into other pixel regions cannot be prevented, which results in lower image resolution.

In contrast, in present Embodiment 9, isolation electrode 90 is formed to surround each pixel electrode EL, so that positive charges generated in each pixel region can be prevented from flowing into other pixel regions and high image resolution can be achieved.

Figure 72:
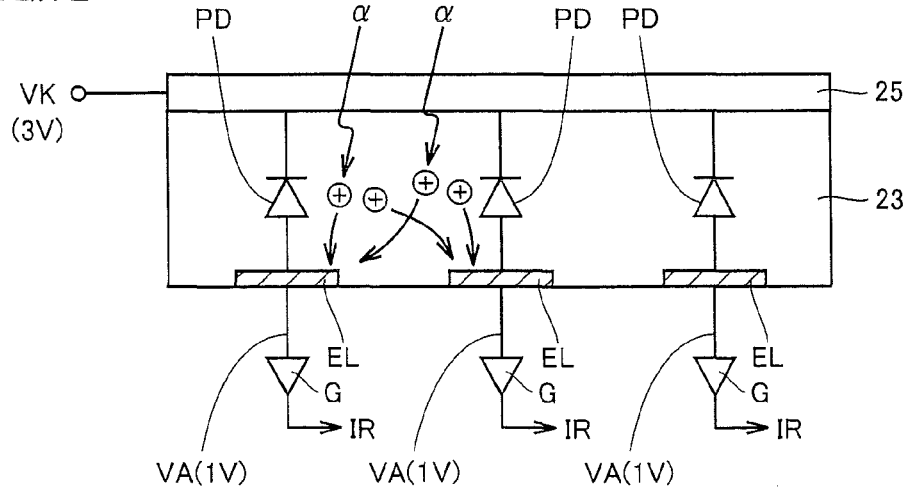
FIG. 72 is a diagram showing a variation of Embodiment 9.

If intense light α having a quantity of light exceeding a prescribed level is incident, a large amount of charges is generated in CIGS thin film 23 and a level of output current IR from read circuit G is saturated. In such a case, as shown in FIG. 72, bias voltage VB may be set to a voltage lower than anode voltage VA (for example, 0 V), so that isolation electrode 90 forcibly releases the charges. Thus, saturation of a level of output current IR from read circuit G can be prevented, and shooting is permitted even when a subject is bright.

Figure 73:
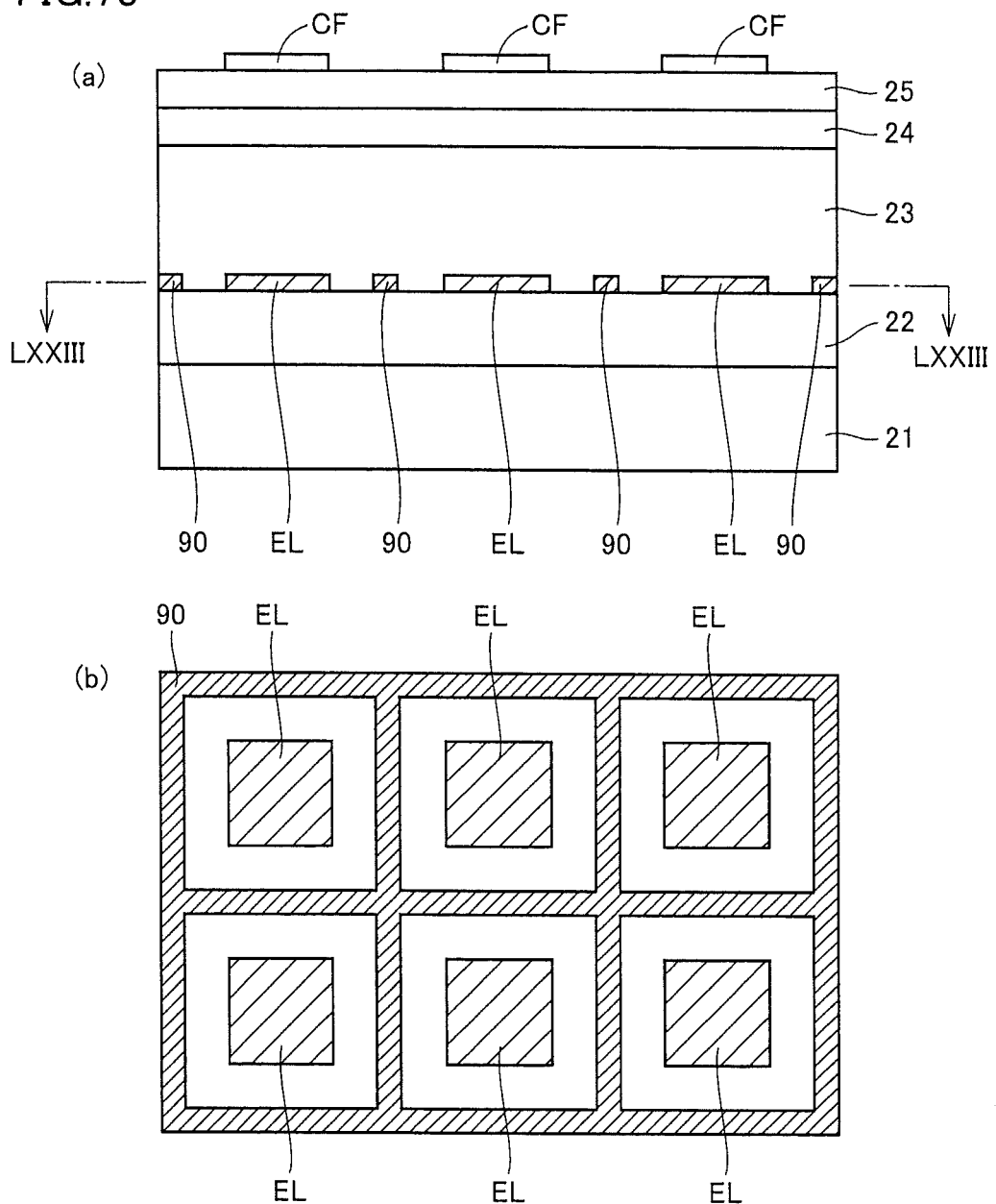
FIG. 73 is a cross-sectional view showing another variation of Embodiment 9.

FIG. 73(a) is a cross-sectional view showing a variation of this Embodiment 9 and FIG. 73(b) is a cross-sectional view along the line LXXIII-LXXIII in FIG. 73(a). In the present variation, a plurality of color filters CF are formed on the surface of transparent electrode 25. The plurality of color filters CF are provided above the plurality of pixel electrodes EL respectively. Each color filter CF is colored to any of red (R), green (G) and blue (B). R, G and B are arranged in a prescribed order. In the present variation, a color image sensor can be implemented.

Figure 74:
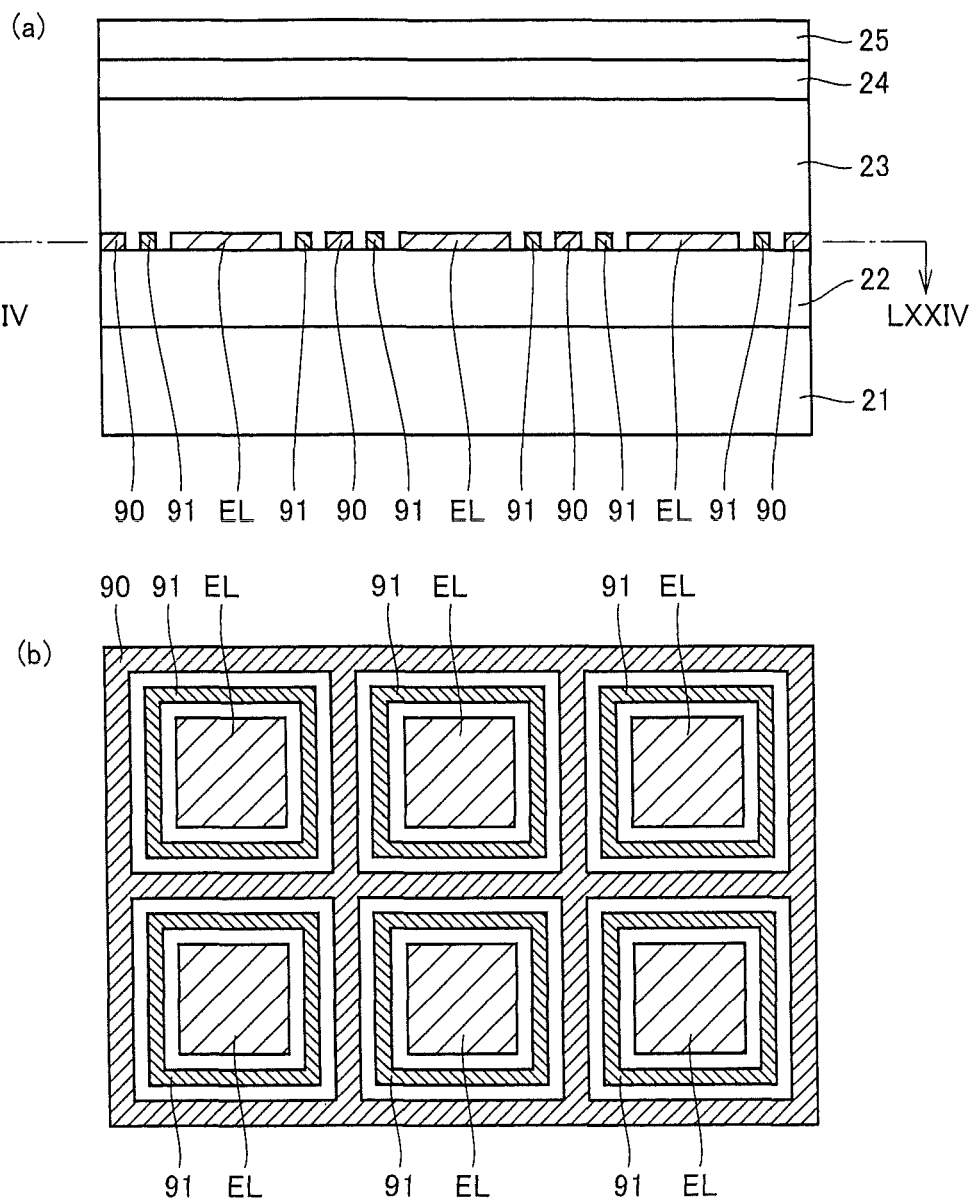
FIG. 74 is a cross-sectional view showing yet another variation of Embodiment 9.
Figure 75:
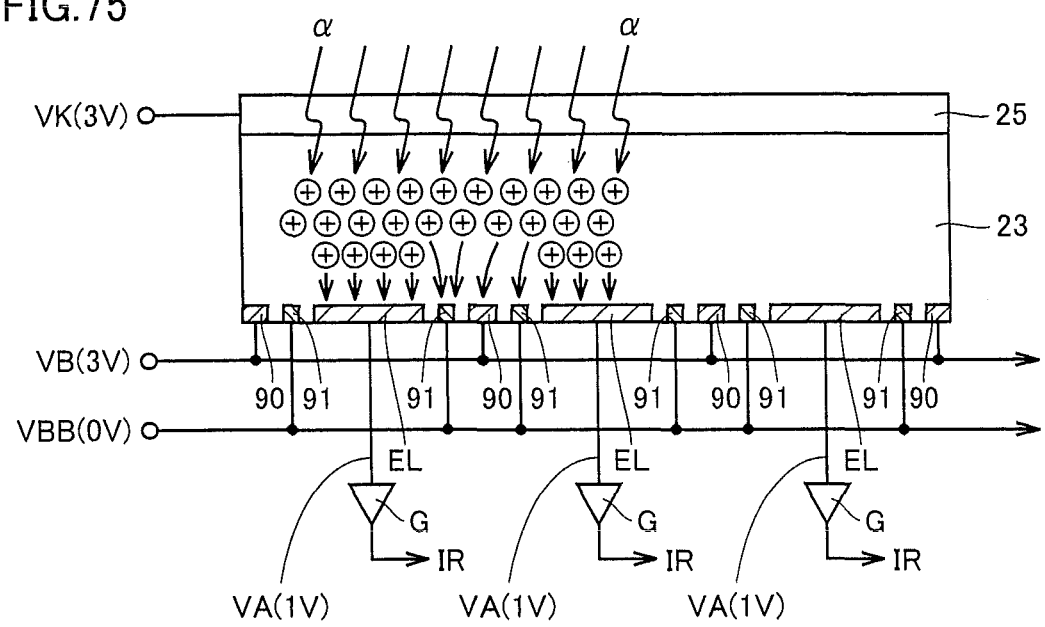
FIG. 75 is a diagram schematically showing a configuration and an operation of a pixel array shown in FIG. 74.

FIG. 74(a) is a cross-sectional view showing a variation of this Embodiment 9 and FIG. 73(b) is a cross-sectional view along the line LXXIVB-LXXIVB in FIG. 74(a). In the present variation, a surrounding auxiliary electrode 91 is provided to surround pixel electrode EL, in a region between each pixel electrode EL and isolation electrode 90. As shown in FIG. 75, a bias voltage VBB lower than anode voltage VA (for example, 0 V) is applied to auxiliary electrode 91. If intense light α having a quantity of light exceeding a prescribed level is incident, a large amount of charges is generated in CIGS thin film 23, however, excessive charges are forcibly released by auxiliary electrode 91. Thus, saturation of a level of output current IR from read circuit G can be prevented, and shooting is permitted even when a subject is bright.

The overall configuration of the photoelectric conversion device is as described with reference to FIG. 2. In addition, the configuration of pixel P is as described with reference to FIG. 3.

Though a case where the invention of the subject application is applied to an image sensor including the CIGS thin film has been described in present Embodiment 9, the invention of the subject application is also applicable to an image sensor including a compound semiconductor thin film, an organic semiconductor thin film, a photoelectric conversion thin film, or a photoelectric conversion thick film, other than the CIGS thin film. In addition, the invention of the subject application is also applicable to a photosensor or a line sensor, without limited to the image sensor.

Embodiment 10

A conventional image pick-up device for obtaining a color image and a near-infrared (NIR) image includes, for example, a prism having a spectral filter function for separating visible light and near-infrared rays from each other, a color image pick-up portion for generating a color image based on visible light that has passed through this prism, and a near-infrared image pick-up portion for generating a near-infrared image based on near-infrared rays that have passed through this prism. Such a configuration is called a two-plate-type image pick-up system.

In such a conventional image pick-up device, a prism of high performance, two image pick-up elements for a color image and a near-infrared image, and two image signal processing portions for generating pixel signals for a color image and a near-infrared image are required, which leads to increase in manufacturing cost and size. PTL 3 and NPLs 1 to 4, however, do not disclose a configuration for solving such a problem.

It is significant in the field of medical care, security and the like to simultaneously visually recognize a color image and a near-infrared image in one screen, however, PTL 3 and NPLs 1 to 4 do not disclose a configuration for enhancing visibility of an image in simultaneously displaying a color image and a near-infrared image in one screen.

Therefore, an object of present Embodiment 10 is to provide an image pick-up device capable of improving visibility of an image in simultaneously displaying a color image and a near-infrared image in one screen, preventing increase in manufacturing cost, and achieving reduction in size.

Figure 76:
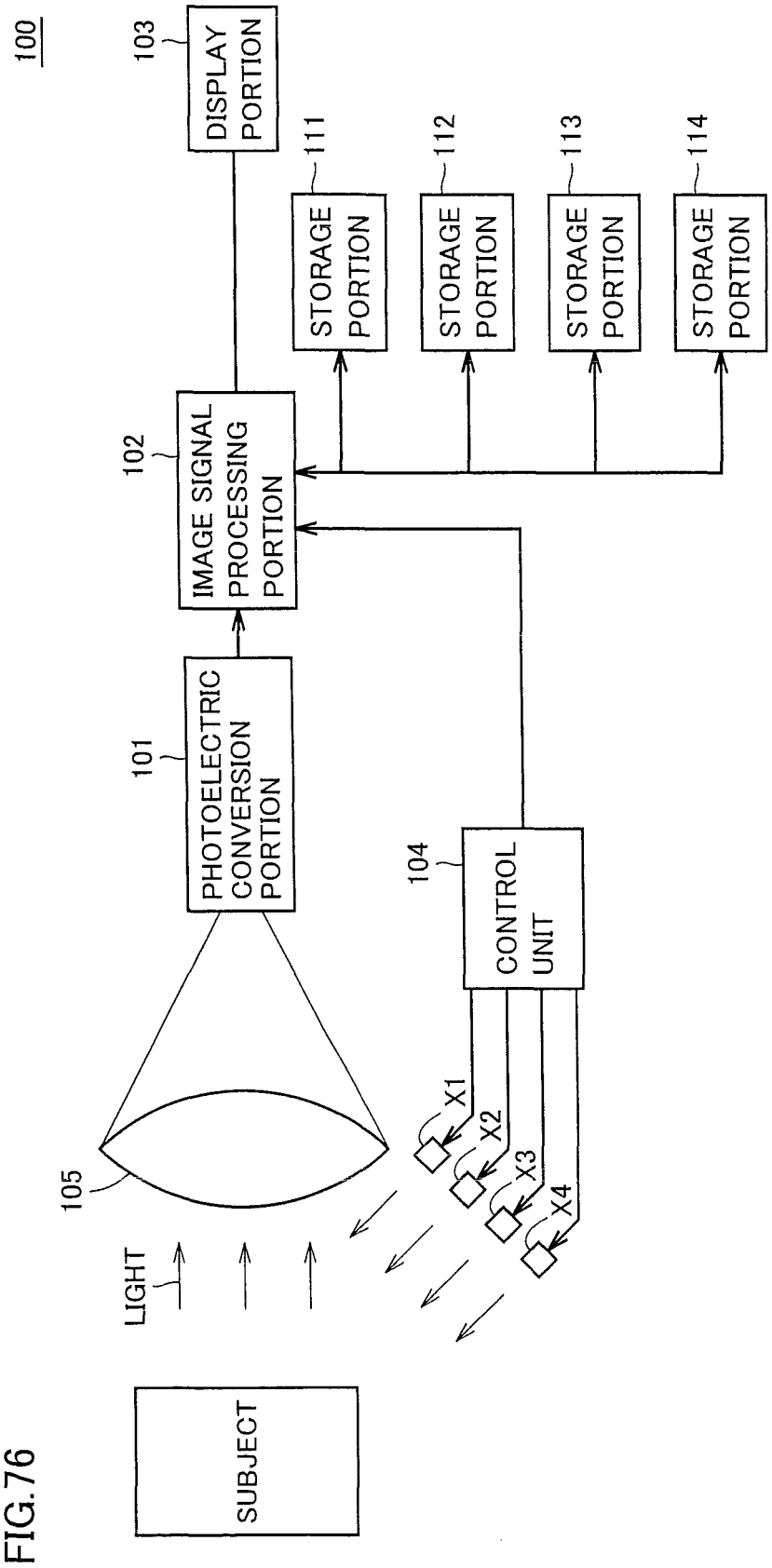
FIG. 76 is a diagram showing a configuration of an image pick-up device according to Embodiment 10 of the present invention.

FIG. 76 is a diagram showing a configuration of an image pick-up device 100 according to Embodiment 10 of the present invention.

Referring to FIG. 76, image pick-up device 100 includes a photoelectric conversion portion 101, an image signal processing portion 102, a display portion 103, a control unit 104, a lens 105, storage portions 111 to 114, and light emitting elements X1 to X4. Light emitting elements X1 to X4 are implemented, for example, by LEDs (Light Emitting Diodes).

Image pick-up device 100 picks up an image of a subject and displays the image on a screen. More specifically, light emitting elements X1 to X4 successively emit light having wavelengths different from one another to a subject under the control by control unit 104. Lens 105 condenses light from the subject on photoelectric conversion portion 101. Photoelectric conversion portion 101 converts light received from lens 105 to a pixel signal which is an electric signal and outputs the pixel signal to image signal processing portion 102. Image signal processing portion 102 generates an image signal by subjecting a pixel signal of each pixel received from photoelectric conversion portion 101 to various types of signal processing such as interpolation processing, color processing and correction processing. In addition, image signal processing portion 102 causes storage portions 111 to 114 to temporarily save image signals generated when the subject is irradiated with light from light emitting elements X1 to X4 respectively, generates a synthesized image signal based on these image signals, and outputs the signal to display portion 103. Display portion 103 displays an image based on the synthesized image signal received from image signal processing portion 102.

The configuration of photoelectric conversion portion 101 is as shown in FIG. 2. The configuration of pixel P is as shown in FIG. 3. The configuration and the operation of the pixel array are as shown in FIGS. 29 and 30.

Figure 77:
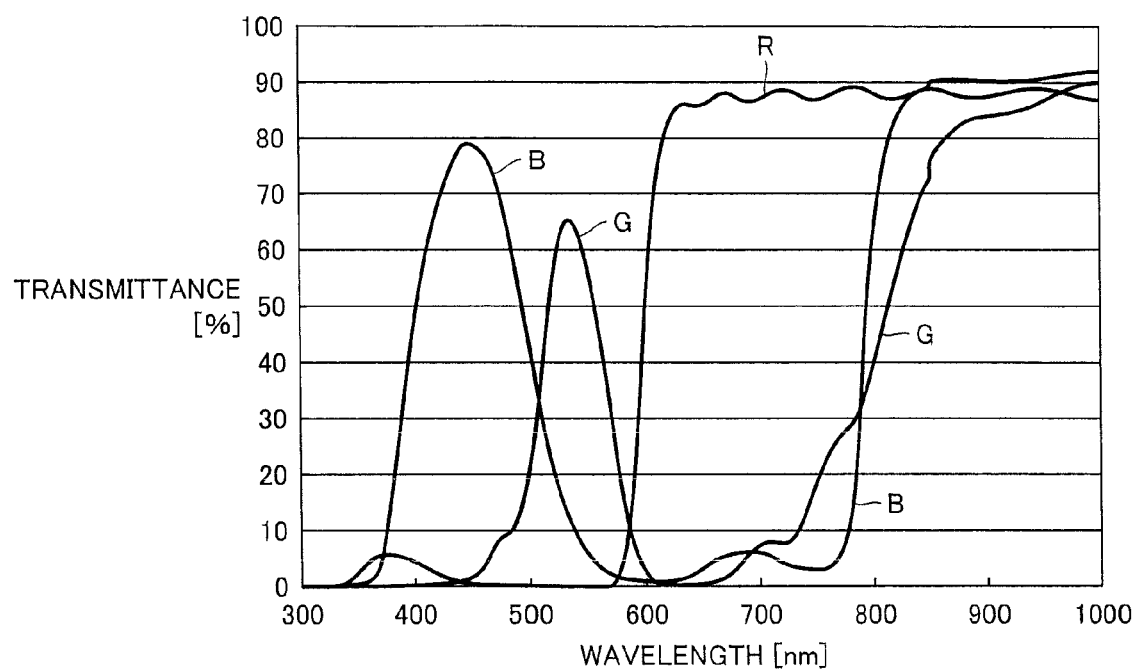
FIG. 77 is a diagram showing transmittance of a color filter in the image pick-up device shown in FIG. 76.

FIG. 77 is a diagram showing transmittance of a color filter in the image pick-up device according to Embodiment 10 of the present invention. FIG. 77 shows transmittance in a case where color filter CF is a primary color filter (RGB color filter).

Referring to FIG. 77, image pick-up device 100 can emit white light to a subject and obtain a color image from colors that have passed through color filters CF. In addition, since color filter CF has a characteristic in connection with near-infrared rays equivalent to that in a case where a filter is absent, image pick-up device 100 can operate as a near-infrared camera to thereby obtain a monochrome image.

Figure 78:
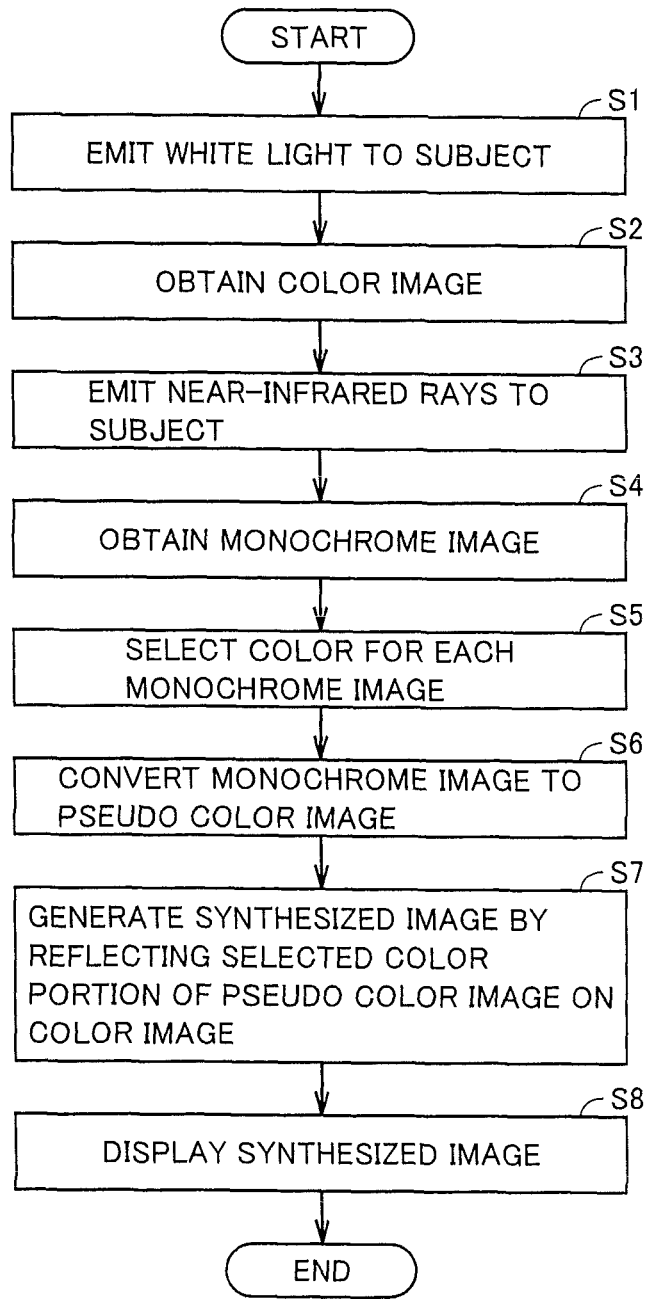
FIG. 78 is a flowchart defining an operation procedure when the image pick-up device shown in FIG. 76 shoots a subject.

FIG. 78 is a flowchart defining an operation procedure when the image pick-up device according to Embodiment 10 of the present invention shoots a subject.

Referring to FIG. 78, image pick-up device 100 emits white light from light emitting element X1 to a subject (step S1).

Then, image pick-up device 100 converts light from the subject to a pixel signal, that is, an electric signal, and obtains a color image (step S2).

Then, image pick-up device 100 emits near-infrared rays NIR1 from light emitting element X2 to the subject (step S3).

Then, image pick-up device 100 converts light from the subject to a pixel signal, that is, an electric signal, and obtains a monochrome image (step S4).

Image pick-up device 100 performs operations in steps S3 and S4 sequentially in connection with light emitting elements X3 (NIR2) and X4 (NIR3).

Then, image pick-up device 100 selects a color that can be displayed in a color image for each monochrome image obtained in step S4, that is, for each of near-infrared rays NIR1 to NIR3 (step S5).

Then, image pick-up device 100 converts three monochrome images corresponding to respective near-infrared rays NIR1 to NIR3 to a pseudo color image of a selected color (a color selected in step S5) and black (step S6).

Then, image pick-up device 100 generates a synthesized image by reflecting a selected color portion of each pseudo color image on the color image obtained in step S2 (step S7) and displays this synthesized image (step S8).

Figure 79:
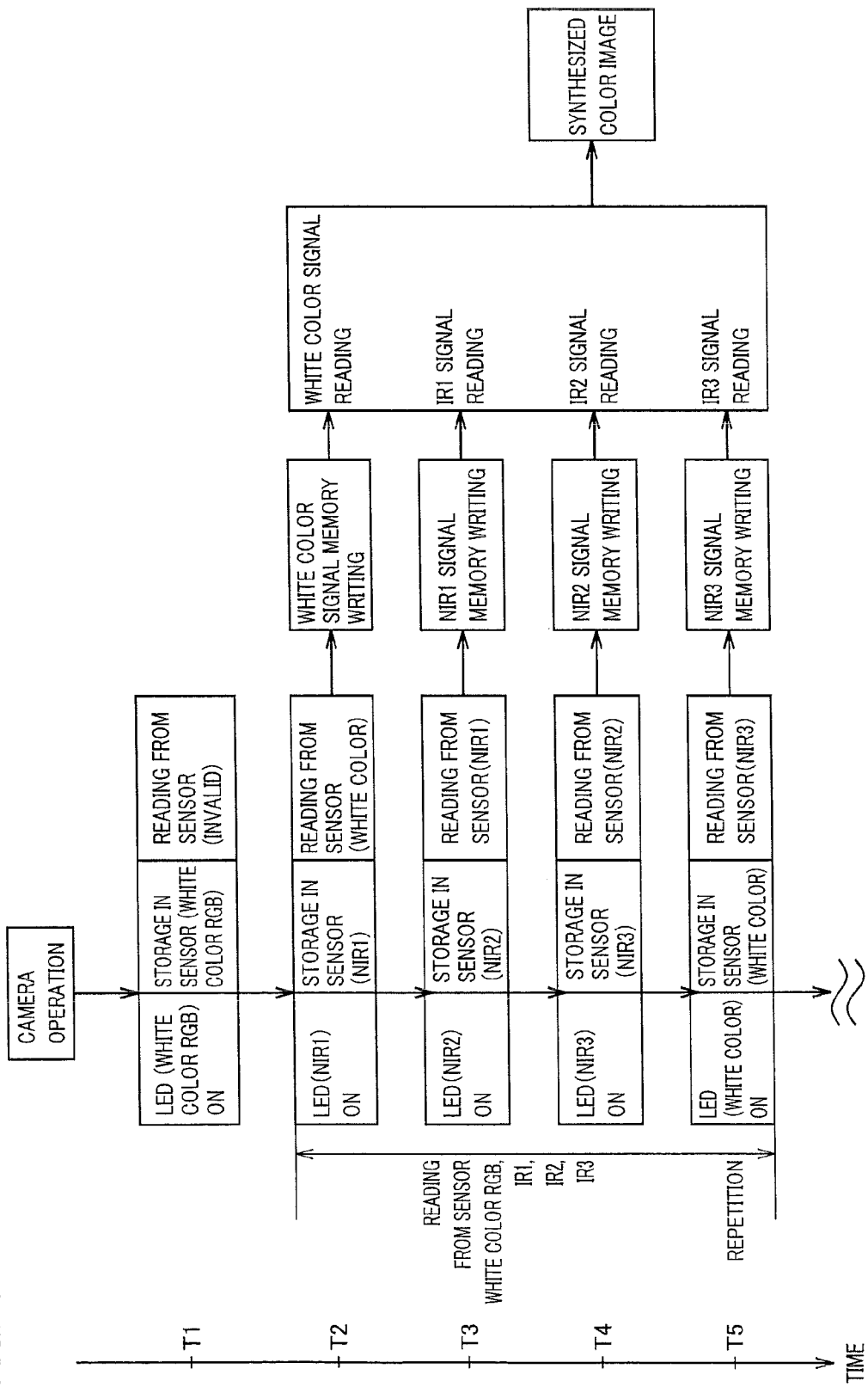
FIG. 79 is a diagram conceptually showing an operation procedure when the image pick-up device shown in FIG. 76 shoots a subject.
Figure 80:
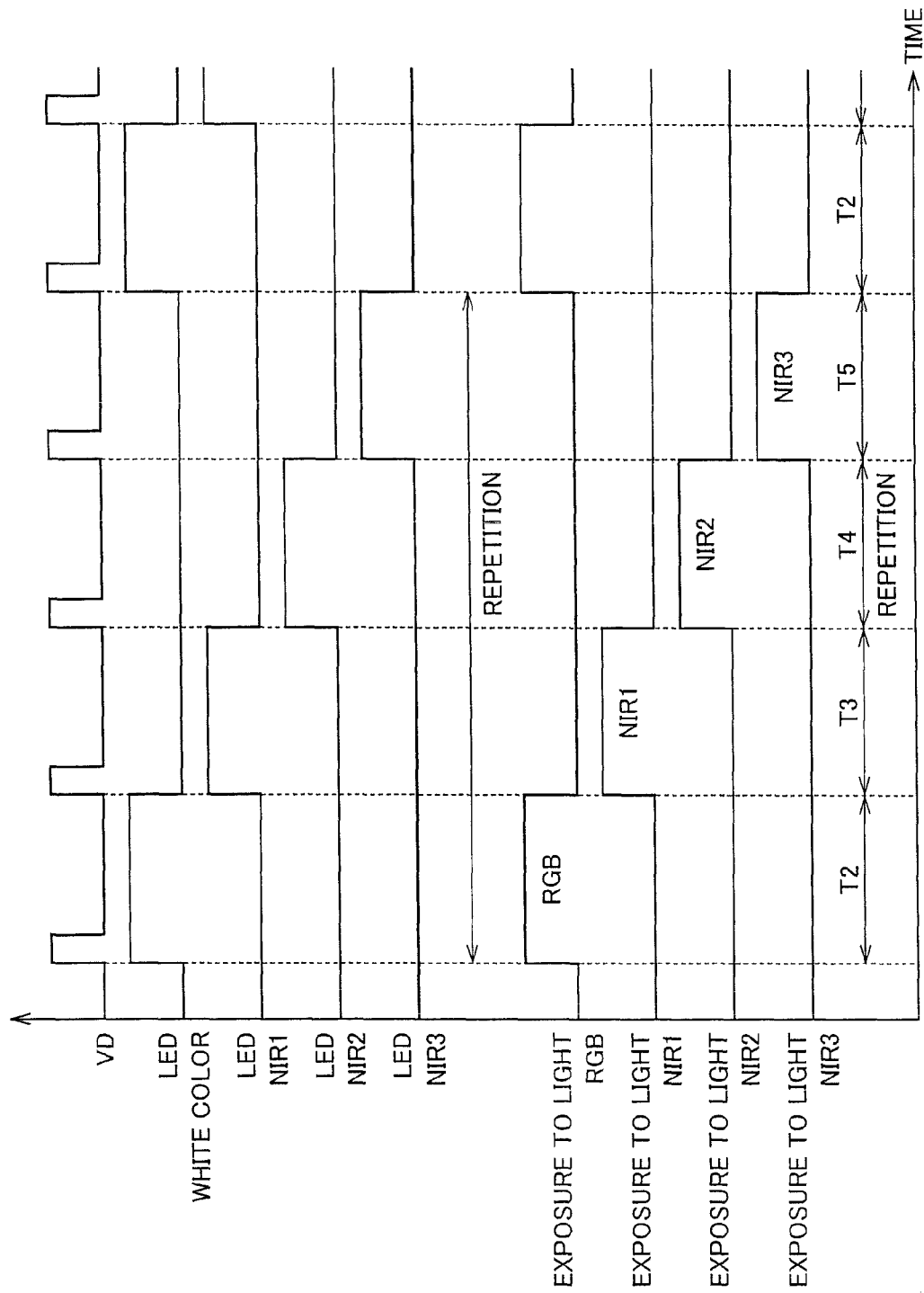
FIG. 80 is a time chart showing an operation procedure when the image pick-up device shown in FIG. 76 emits light to a subject.
Figure 81:
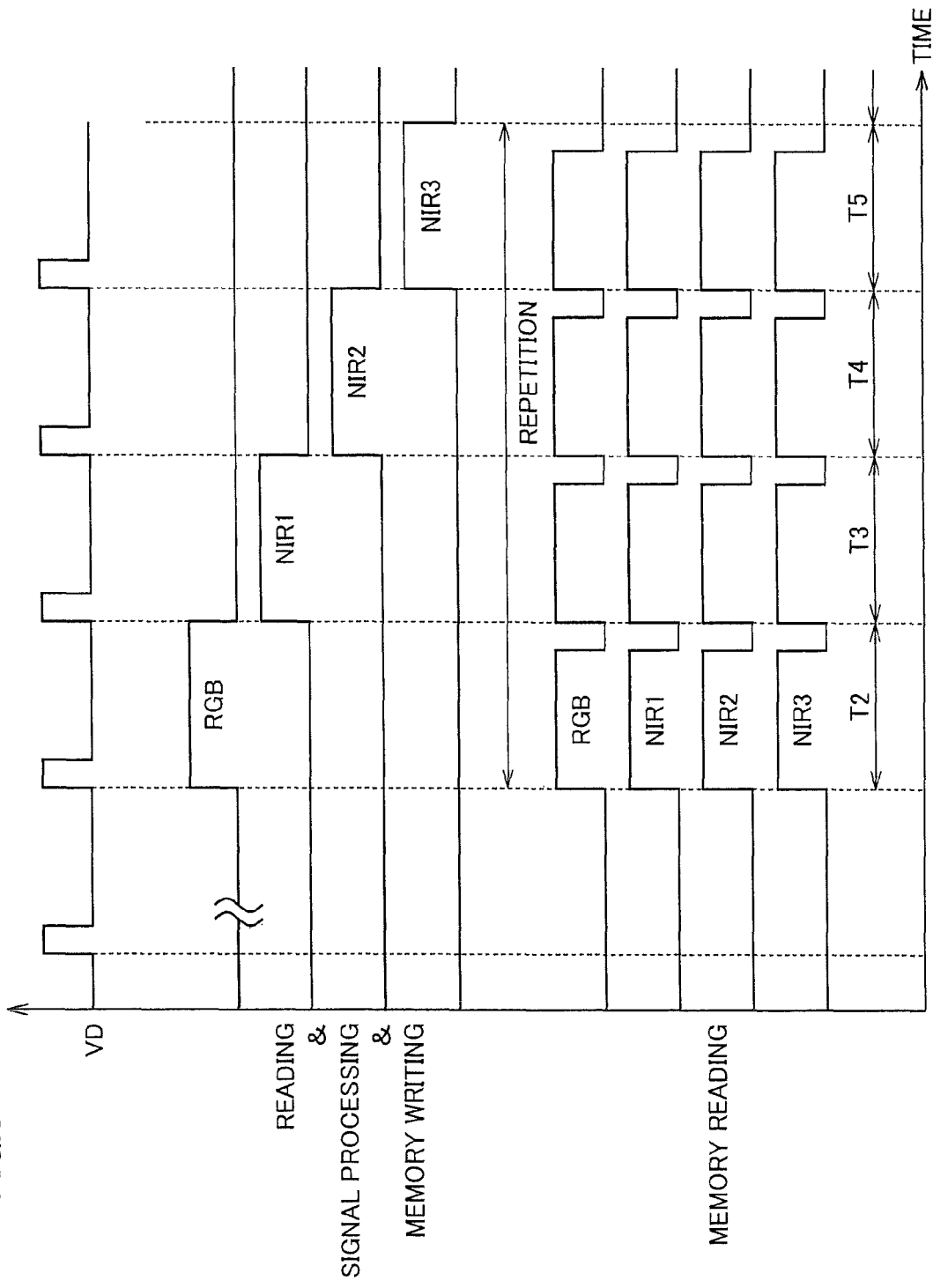
FIG. 81 is a time chart showing an operation procedure when the image pick-up device shown in FIG. 76 generates an image of a subject.

FIG. 79 is a diagram conceptually showing an operation procedure when the image pick-up device according to Embodiment 10 of the present invention shoots a subject. FIG. 80 is a time chart showing an operation procedure when the image pick-up device according to Embodiment 10 of the present invention emits light to a subject. FIG. 81 is a time chart showing an operation procedure when the image pick-up device according to Embodiment 10 of the present invention generates an image of a subject. VD shown in FIGS. 80 and 81 is, for example, a timing signal generated by control unit 104, and it is a signal having a processing time per one screen as one cycle.

Referring to FIGS. 79 to 81, image pick-up device 100 carries out in parallel for each light emitting element, turn-on of a light emitting element, storage of charges, reading of charges, generation of a pixel signal, writing in a storage portion, and reading from a storage portion.

More specifically, at first timing T1, image pick-up device 100 turns on white LED, that is, light emitting element X1. In addition, image pick-up device 100 causes charges to be stored in the sensor. Namely, converted charges are stored in photodiode PD of pixel P. Here, an operation for reading charges is performed as parallel processing, however, storage of charges corresponding to white light has not yet been completed and hence this read operation is invalid.

At next timing T2, image pick-up device 100 turns on an LED of near-infrared rays NIR1, that is, light emitting element X2. In addition, image pick-up device 100 causes charges to be stored in the sensor. Namely, converted charges are stored in photodiode PD of pixel P. Moreover, image pick-up device 100 reads charges corresponding to white light, of which storage has been completed, to generate a color image signal and writes the signal in storage portion 111.

At next timing T3, image pick-up device 100 turns on an LED of near-infrared rays NIR2, that is, light emitting element X3. In addition, image pick-up device 100 causes charges to be stored in the sensor. Namely, converted charges are stored in photodiode PD of pixel P. Moreover, image pick-up device 100 reads charges corresponding to near-infrared rays NIR1, of which storage has been completed, to generate a monochrome image signal (NIR1) and writes the signal in storage portion 112.

At next timing T4, image pick-up device 100 turns on an LED of near-infrared rays NIR3, that is, light emitting element X4. In addition, image pick-up device 100 causes charges to be stored in the sensor. Namely, converted charges are stored in photodiode PD of pixel P. Moreover, image pick-up device 100 reads charges corresponding to near-infrared rays NIR2, of which storage has been completed, to generate a monochrome image signal (NIR2) and writes the signal in storage portion 113.

At next timing T5, image pick-up device 100 turns on the white LED, that is, light emitting element X1. In addition, image pick-up device 100 causes charges to be stored in the sensor. Namely, converted charges are stored in photodiode PD of pixel P. Moreover, image pick-up device 100 reads charges corresponding to near-infrared rays NIR3, of which storage has been completed, to generate a monochrome image signal (NIR3) and writes the signal in storage portion 114.

Thereafter, image pick-up device 100 repeats the operations at timing T2 to T5. In addition, after first timing T5, image pick-up device 100 generates a synthesized color image. Namely, at timing T5, image pick-up device 100 reads a color image signal already saved in storage portion 111, a monochrome image signal (NIR1) already saved in storage portion 112, a monochrome image signal (NIR2) already saved in storage portion 113, and a monochrome image signal (NIR3) newly saved in storage portion 114, to generate a synthesized image signal. In addition, at timing T2, image pick-up device 100 reads a color image signal newly saved in storage portion 111, a monochrome image signal (NIR1) already saved in storage portion 112, a monochrome image signal (NIR2) already saved in storage portion 113, and a monochrome image signal (NIR3) already saved in storage portion 114, to generate a synthesized image signal. Moreover, at timing T3, image pick-up device 100 reads a color image signal already saved in storage portion 111, a monochrome image signal (NIR1) newly saved in storage portion 112, a monochrome image signal (NIR2) already saved in storage portion 113, and a monochrome image signal (NIR3) already saved in storage portion 114, to generate a synthesized image signal. Further, at timing T4, image pick-up device 100 reads a color image signal already saved in storage portion 111, a monochrome image signal (NIR1) already saved in storage portion 112, a monochrome image signal (NIR2) newly saved in storage portion 113, and a monochrome image signal (NIR3) already saved in storage portion 114, to generate a synthesized image signal.

Though light exposure time periods of light emitting elements X1 to X4 are equally set here, sensitivity to light of each wavelength can also be adjusted by adjusting the light exposure time periods of light emitting elements X1 to X4 respectively.

Figure 82:
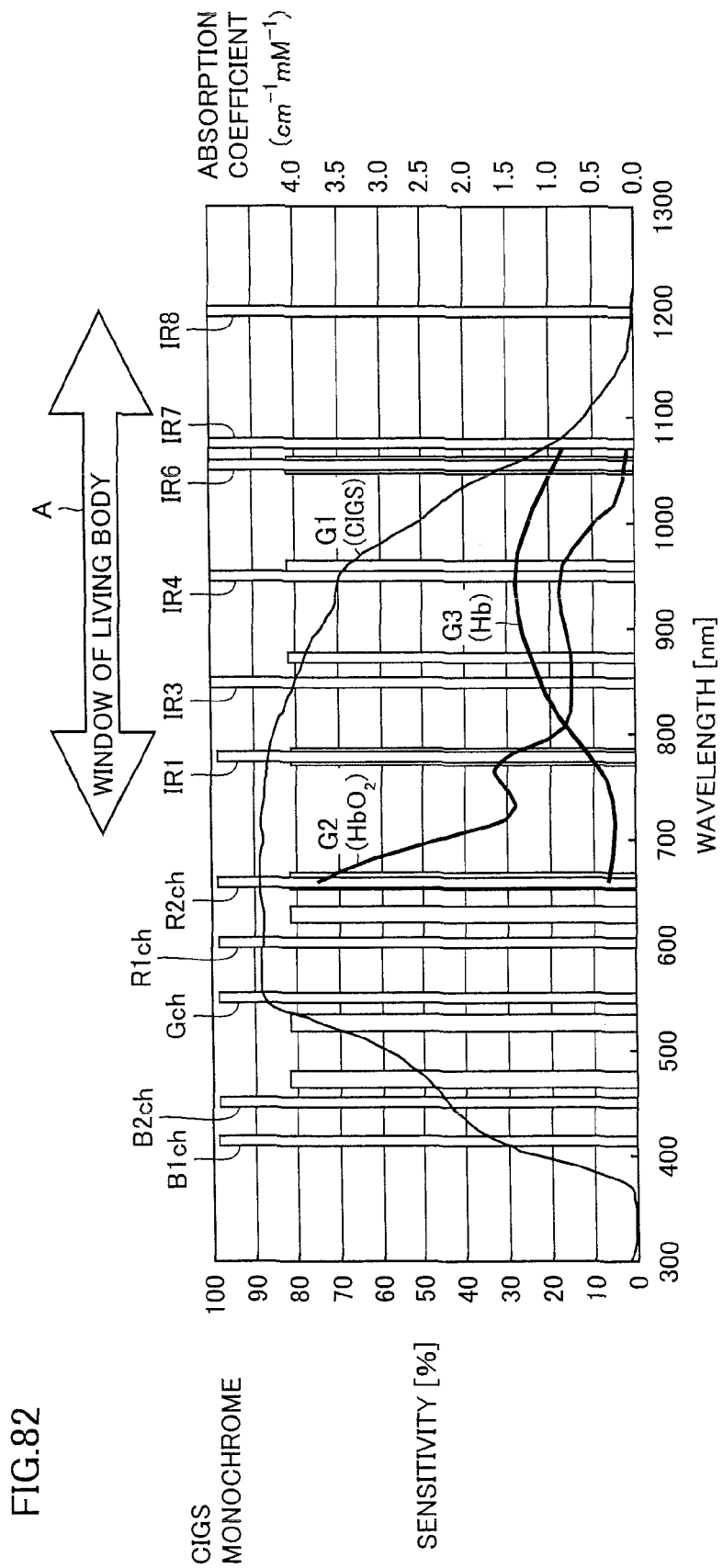
FIG. 82 is a diagram showing optical characteristics of the image pick-up device shown in FIG. 76.

FIG. 82 is a diagram showing optical characteristics of the image pick-up device according to Embodiment 10 of the present invention. In FIG. 82, G1 represents sensitivity of CIGS thin film 23, G2 represents an absorption coefficient of $HbO_2$, and G3 represents an absorption coefficient of Hb.

Referring to FIG. 82, image pick-up device 100 includes, for example, light emitting elements of 410 nm (B1ch) and 450 nm (B2ch) as wavelengths corresponding to blue, a light emitting element of 545 nm (Gch) as a wavelength corresponding to green, and light emitting elements of 600 nm (R1ch) and 660 nm (R2ch) as wavelengths corresponding to red, and these light emitting elements are used as light emitting element X1 emitting white light. In addition, image pick-up device 100 includes, for example, light emitting elements of 780 nm (IR1), 850 nm (IR3), 945 nm (IR4), 1050 nm (IR6), 1070 nm (IR7), and 1200 nm (IR8) as wavelengths in the near-infrared region, and three of these light emitting elements are selected as appropriate for use as light emitting elements X2, X3, and X4.

Image pick-up device 100 is used, for example, for shooting an artery and a vein in a human body. In this case, a light emitting element having a wavelength included in a range of a window A of a living body, that is, included in a range of wavelength passing through a living body, is selected as the light emitting element corresponding to the near-infrared region. Since $HbO_2$ is present in a large amount in an artery and Hb is present in a large amount in a vein, an artery and a vein can accurately be displayed as distinguished from each other by selecting such a wavelength as increasing a ratio between $HbO_2$ and Hb from graphs G2 and G3. For example, light emitting elements of 780 nm (IR1), 850 nm (IR3), and 945 nm (IR4) are selected as light emitting elements X2, X3, and X4.

Namely, since a large amount of $HbO_2$ is present in an artery, it can be considered that an image obtained when a subject is irradiated with light of IR3 and IR4 among IR1, IR3 and IR4 in graph G2 mainly shows arteries.

Alternatively, since a large amount of Hb is present in a vein, it can be considered that an image obtained when a subject is irradiated with light of IR1 among IR1, IR3 and IR4 in graph G3 mainly shows veins.

Image signal processing portion 102 in image pick-up device 100 converts each monochrome image signal corresponding to each of IR2 to IR4 into a plurality of pseudo color image signals each showing an image of a transmitted color of color filters CF different from one another and black. For example, image pick-up device 100 converts a monochrome image obtained when a subject is irradiated with light of IR1 into a pseudo color image of red and black, converts a monochrome image obtained when a subject is irradiated with light of IR3 into a pseudo color image of green and black, and converts a monochrome image obtained when a subject is irradiated with light of IR4 into a pseudo color image of blue and black. It is noted that difference in luminance in a monochrome image can also be reflected on difference in luminance of red, blue and green.

Then, image signal processing portion 102 in image pick-up device 100 generates a synthesized image signal showing an image having as a selected color, a portion in an image shown by a color image signal corresponding to a portion of a selected color (a color selected in step S5) in an image shown by a pseudo color image signal. Namely, a synthesized image in which a red portion, a green portion and a blue portion in these pseudo color images overwrite a color image obtained when the subject is irradiated with white light is generated. Here, when portions of the selected colors are superimposed on one another in the image shown by each pseudo color image signal, image signal processing portion 102 generates a synthesized image signal showing an image in which a portion in an image shown by a color image signal is set to a synthesized color of each selected color. Thus, a synthesized image in which arteries are displayed in red and veins are displayed in blue-green in a human body can be displayed.

In addition, a color to be selected by image signal processing portion 102 can be changed by the user by making register setting or the like. Thus, depending on applications of the image pick-up device, an appropriate image can be displayed.

Figure 83:
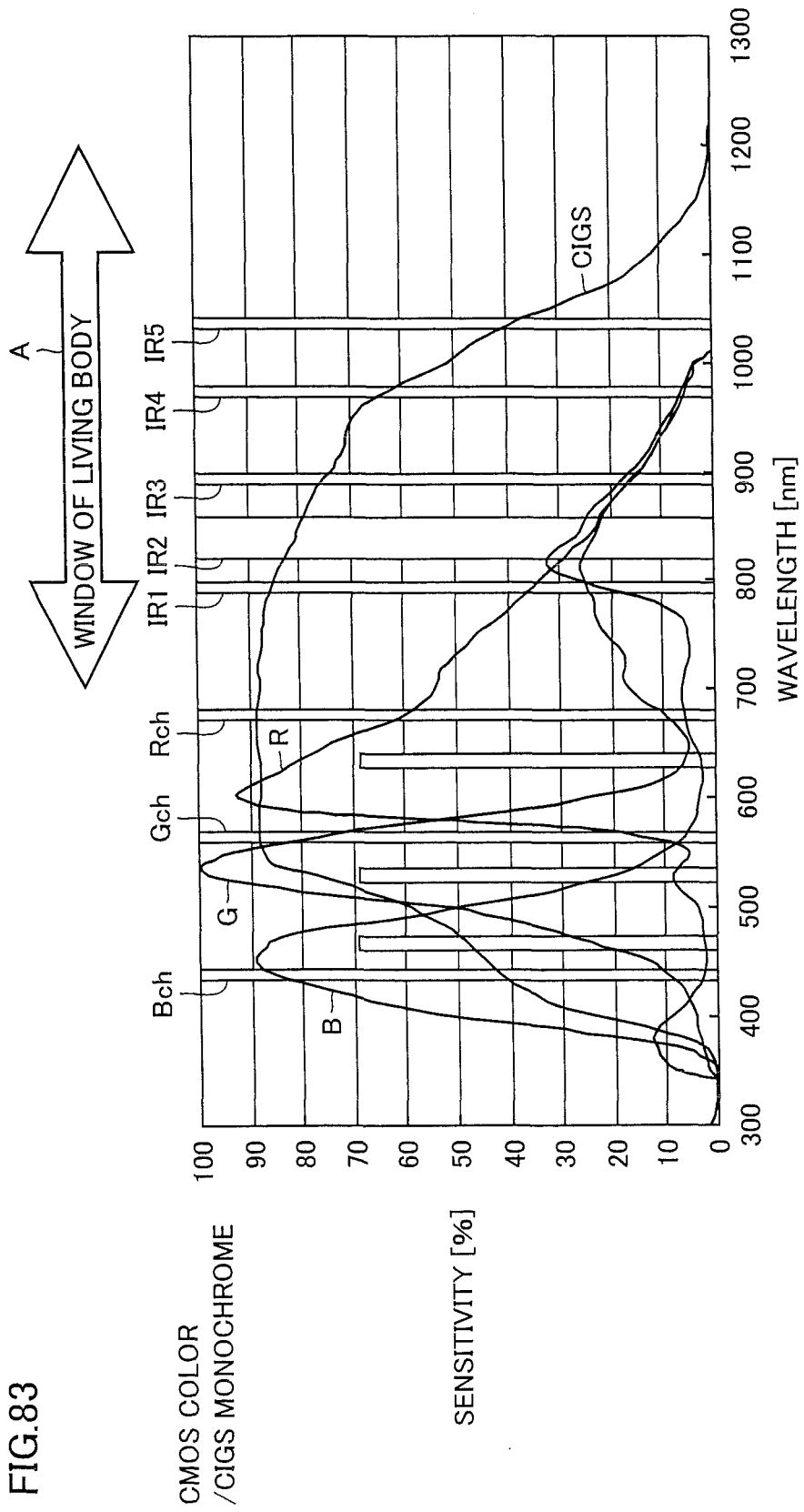
FIG. 83 is a diagram showing an application wavelength for medical use.

FIG. 83 is a diagram showing an application wavelength for medical use. In FIG. 83, Bch at 415 nm (390 nm to 445 nm) is for applications for narrow band imaging (NBI), Gch at 540 nm (530 nm to 550 nm) is for applications for narrow band imaging (NBI), Rch at 660 nm is for applications for measuring a ratio between $HbO_2$ and Hb, IR1 at 780 nm is for optical topography applications, IR2 at 805 nm is for applications for measuring a ratio between $HbO_2$ and Hb and sentinel lymph node fluoroscopy applications and IR2 at 840 nm is for optical topography applications, IR3 at 880 nm is for applications for measuring a ratio between $HbO_2$ and Hb, IR4 at 965 nm is for applications for measuring water, and IR5 at 1020 nm is for applications for measuring a ratio between $HbO_2$ and Hb and IR5 at 1025 nm is applications for measuring ice.

Image pick-up device 100 is provided with light emitting elements of various wavelengths as shown in FIG. 82, so that it can be adapted to application wavelengths for medical use as shown in FIG. 83. For example, image pick-up device 100 is applicable to multi-spectral measurement of a ratio between $HbO_2$ and Hb, skin measurement, blood vessel visualization camera, and blood sugar level measurement (glucose measurement) in which a range from 800 nm to 1100 nm is an image pick-up range.

The conventional image pick-up device, however, has employed, for example, a silicon image sensor. Therefore, since sensitivity in the near-infrared region has been low, a prism for separating visible light and near-infrared rays from each other, two image pick-up elements for a color image and a near-infrared image, and two image signal processing portions for generating image signals for a color image and near-infrared image have been required.

In contrast, the image pick-up device according to Embodiment 10 of the present invention includes, for example, a CIGS thin film having a range from visible light to near-infrared rays, that is, a sensitivity region in a wide range from 400 nm to 1300 nm. Namely, by employing a CIGS thin film having high sensitivity also to light in the near-infrared region, the need for a prism for separating visible light and near-infrared rays from each other is obviated, and an image pick-up element for a color image and a near-infrared image can be shared and an image signal processing portion for generating an image signal for a color image and a near-infrared image can be shared.

In NPL 1, a monochrome image at 1025 nm in the near-infrared region is used to visualize ice crystal. The obtained image, however, is a monochrome image and it does not necessarily have sufficient image quality as a composition image.

In a conventional image pick-up device, a spectral sensitivity region of a CCD (Charge Coupled Device) ranges from 700 nm to 1100 nm, and brief characteristics are such that sensitivity starts to deteriorate from 700 nm or longer and 1100 nm is a limit value. Therefore, it is difficult to obtain a good image signal of 1025 nm with the conventional image pick-up device. Though 390 nm to 445 nm is used as Bch and 530 nm to 550 nm is used as Gch in NBI, light in these wavelengths is visible light.

As shown in NPL 3, as compared with a sensor including a CIGS thin film, it is difficult for a CCD CMOS sensor to select two significant wavelengths of near-infrared rays. This is because the CCD CMOS sensor has a spectral sensitivity region from 700 nm to 1100 nm and sensitivity only of approximately 60% at 700 nm with respect to relative sensitivity 100%. In contrast, a CIGS sensor has good sensitivity in a range from 700 nm to 1300 nm and sensitivity of approximately 90% at 700 nm with respect to relative sensitivity 100%, which is almost twice as high as that of the CCD CMOS sensor. In addition, around 900 nm, the CIGS sensor has sensitivity almost four times as high as that of the CCD CMOS sensor.

For a surveillance camera, a medical camera or the like, a color image of visible light is important image information because an image similar to an image viewed with human's eyes is obtained. In the image pick-up device according to Embodiment 10 of the present invention, image signal processing portion 102 generates a color image signal based on read signals output from a plurality of read circuits G when a subject is irradiated with light from a white light emitting element and generates a monochrome image signal based on read signals output from a plurality of read circuits G when a subject is irradiated with light from near-infrared light emitting elements. Then, image signal processing portion 102 selects a color that can be displayed in a color image and converts the monochrome image signal to a pseudo color image signal showing an image of the selected color and black, to thereby generate a synthesized image signal showing one image based on the color image signal and the pseudo color image signal.

According to such a configuration, since the user can simultaneously visually recognize a color image and a pseudo color image showing useful information in one screen, an image of high visibility can be obtained and a large amount of information can be obtained without uncomfortable feeling. Then, since such an image can be realized by one optical system, an inexpensive and useful image pick-up device can be provided.

According to the conventional two-plate-type image pick-up system, as described previously, only an image corresponding to one wavelength in the near-infrared region is obtained. In contrast, the image pick-up device according to Embodiment 10 of the present invention includes white light emitting element X1, near-infrared light emitting elements X2 to X4, and storage portions 111 to 114, and time-division processing, that is, field sequential processing, is performed on each light emitting element. According to such a configuration, one image pick-up device can obtain an image corresponding to a plurality of wavelengths in the near-infrared region.

Though the image pick-up device according to Embodiment 10 of the present invention is configured to include a light emitting element emitting near-infrared rays, the image pick-up device is not limited thereto. In a case where a subject itself is a substance emitting near-infrared rays, the image pick-up device may be configured not to include light emitting elements X2 to X4 of near-infrared rays and image signal processing portion 102 may generate a monochrome image signal based on read signals output from a plurality of read circuits G when a subject is not irradiated with light from light emitting element X1. In addition, in a case where the image pick-up device includes a light emitting element emitting near-infrared rays as well, the number of light emitting elements emitting near-infrared rays is not limited to three and any number of light emitting elements may be provided.

Further, though the pixel array according to Embodiment 10 of the present invention is configured to include a CIGS thin film, the pixel array is not limited as such. The configuration should only be such that a compound semiconductor thin film or a compound semiconductor thick film having a sensitivity region as wide as the CIGS thin film is included.

Furthermore, the image pick-up device according to Embodiment 10 of the present invention may be configured such that image signal processing portion 102 searches for a color that can be displayed in a color image and not present in an image shown by a color image signal and converts a monochrome image signal into a pseudo color image signal showing an image of the searched for and found color and black.

For example, image signal processing portion 102 creates, in a color natural image, a coordinate system having B (blue)−Y (luminance) as the abscissa and R (red)−Y (luminance) as the ordinate, plots an image signal of each pixel P, and allocates a color corresponding to a coordinate not plotted in this coordinate system to a monochrome image corresponding to light emitting elements X2 to X4. In addition, image signal processing portion 102 operates and summarizes chromaticity in a color image obtained by light emitting element X1 and allocates colors distant in chromaticity distance on the color image to monochrome images corresponding to light emitting elements X2 to X4 respectively.

The present invention is applicable, for example, to an image pick-up device for FA (Factory Automation) inspection, a color/NIR multi-band image pick-up device for medical use such as a gastrocamera and a capsule endoscope, a security surveillance camera for vein authentication, a car-mount color/NIR multi-band image pick-up device for human skin monitoring, an agricultural image pick-up device for measuring sugar content or the like, and the like. In addition, the present invention is applicable to a color image pick-up device of food, living organism, biological substance, moisture, ice crystal, and the like.

A variation of Embodiment 10 will now be described. The present variation relates to an image pick-up device with a method of generating an image being varied, as compared with the image pick-up device according to Embodiment 10. The image pick-up device is the same as the image pick-up device according to Embodiment 10 except for the description below.

FIG. 84 is a flowchart defining an operation procedure when the image pick-up device according to the present variation shoots a subject.

Referring to FIG. 84, the image pick-up device according to the present variation emits white light to a subject from light emitting element X1 (step S11).

Then, the image pick-up device converts light from the subject into a pixel signal, that is, an electric signal. More specifically, the image pick-up device generates electric signals corresponding to wavelength components of red, green and blue, that is, an R signal, a G signal and a B signal. Then, the image pick-up device obtains a luminance component of a color image by calculating luminance signal Y from the R signal, the G signal and the B signal (step S12).

Then, the image pick-up device emits near-infrared rays NIR1 from light emitting element X2 to the subject (step S13).

Then, the image pick-up device converts light from the subject into a pixel signal, that is, an electric signal, to thereby obtain a monochrome image. Namely, the image pick-up device calculates a monochrome image signal (NIR1) corresponding to near-infrared rays NIR1 (step S14).

Then, the image pick-up device emits near-infrared rays NIR2 from light emitting element X3 to the subject (step S13).

Then, the image pick-up device converts light from the subject into a pixel signal, that is, an electric signal, to thereby obtain a monochrome image. Namely, the image pick-up device calculates a monochrome image signal (NIR2) corresponding to near-infrared rays NIR2 (step S14).

Then, the image pick-up device generates a synthesized image signal based on the luminance signal and two monochrome image signals corresponding to near-infrared rays NIR1 and NIR2. More specifically, denoting an inverted signal of the monochrome image signal (NIR1) as NIRINV1 and an inverted signal of the monochrome image signal (NIR2) as NIRINV2, the image pick-up device calculates NIRINV1−Y and NIRINV2−Y (step S15).

Then, the image pick-up device employs NIRINV1−Y, NIRINV2−Y, and Y as the synthesized image signal (step S16), and displays an image shown by this synthesized image signal (step S17). Namely, the image pick-up device carries out pseudo colorization by subjecting NIRINV1−Y, NIRINV2−Y, and Y to colorization processing with the use of a color-difference signal, that is, processing in which R−Y, B−Y, and Y signals are employed as image signals.

Display portion 103 provides, for example, a readily recognizable vector monitor indicated by a coordinate system having the ordinate of B−Y and the abscissa of R−Y. Thus, significant identification of a sample and conversion into numbers (vector being converted to a scalar quantity and phase) are carried out.

A MOS image pick-up element including a CIGS thin film has a spectral sensitivity region in a wide range from 400 nm to 1300 nm and it is a good image pick-up element as a near-infrared sensor. In addition, the near-infrared rays have a wavelength range from 700 nm to 1200 nm, they are high in transmittance through a living body, and they are referred to as a "window of light in a living body." Light in this near-infrared region passes through muscles, fat, bone, and the like, and it is absorbed by Hb and melanin. In particular, absorbance by Hb and melanin attains peak with respect to light at 890 nm. In addition, absorbances by water and ice attain peak with respect to light at 956 nm and 1025 nm, respectively.

The image pick-up device effectively converts visible light and near-infrared rays to a color image and achieves visualization also of near-infrared rays that cannot visually be recognized by a human. Namely, light emitting element X1 emitting white light obtains a luminance component Y and obtains a monochrome image of visible light. In picking up an image of water and ice, light emitting element X2 emitting light at 956 nm and light emitting element X3 emitting light at 1025 nm are used.

Here, in the image pick-up device, image signal processing portion 102 generates as a synthesized image signal, a signal indicating difference between an inverted signal of a monochrome image signal (NIR1) and a luminance signal, a signal indicating difference between an inverted signal of a monochrome image signal (NIR2) and a luminance signal, and a luminance signal. Namely, since an object to be observed is black in a monochrome image obtained when a subject is irradiated with light emitting element X2 and a monochrome image obtained when a subject is irradiated with light emitting element X3, inverted signals of these monochrome image signals are generated.

Then, pseudo colorization is carried out by subjecting the luminance signal and two inverted monochrome image signals to colorization processing using a color-difference signal, that is, processing in which R−Y, B−Y, and Y signals are employed as image signals. In this case, water and ice are displayed in black in the obtained monochrome image, however, for example, ice is displayed in red and water is displayed in blue by using the inverted signals as above.

It is noted that image signal processing portion 102 may be configured not to invert a monochrome image signal. Namely, even though image signal processing portion 102 is configured to generate a signal indicating difference between a monochrome image signal (NIR1) and a luminance signal, a signal indicating difference between a monochrome image signal (NIR2) and a luminance signal, and a luminance signal as a synthesized image signal showing one image, visibility of an image can be enhanced. The configuration in which a monochrome image signal is inverted, however, is more effective in that visibility can further be enhanced by providing a color to an object of observation.

Though the conventional image pick-up device has generated a monochrome image only with near-infrared rays of one wavelength as described previously, comparison and recognition is difficult with such a configuration.

In contrast, in the image pick-up device according to the present variation, two significant wavelength regions to be colored are selected and combined with a luminance signal of a normal color image, to thereby obtain a pseudo color image. Thus, comparison and recognition is facilitated and a significant pseudo color image can be obtained.

Though the image pick-up device according to the present variation is configured to generate monochrome image signals corresponding to two near-infrared rays, the image pick-up device is not limited as such. The configuration may be such that monochrome image signals corresponding to three or more near-infrared rays are generated and a synthesized image signal is obtained based on these monochrome image signals and the luminance signal. In this case, for example, a result of operation obtained by addition or the like of a plurality of monochrome image signals should only be employed as an R signal or a B signal.

NPL 2 achieves colorization with the use of a B signal and a G signal with regard to Hb absorption or the like, however, this colorization does not have significance.

In addition, as shown in NPL 4, Hb measurement using near-infrared rays has been put into practical use and venous oxygenation index (VOI) measurement has been conducted by making use of difference in light absorption characteristics between $HbO_2$ and Hb since the year 2000.

The image pick-up device according to the present variation can readily realize colorization and conversion into numbers of this index. In addition, though three wavelengths of 660 nm, 805 nm and 880 nm are employed in VOI measurement, significance of difference in light absorption characteristics between $HbO_2$ and Hb is found even at a wavelength of 1000 nm or longer.

For example, in the image pick-up device according to the present variation, an LED emitting light having a wavelength from 1010 nm to 1025 nm is employed as light emitting element X3. In this case, 805 nm and 880 nm correspond to light emitting element X1 which is a white LED, and an LED emitting light of 660 nm is used as light emitting element X2. At 660 nm, it is assumed that relation of $HbO_2<Hb$ is satisfied and that difference between an obtained image signal and a luminance signal is B−Y. At 1020 nm, it is assumed that relation of $HbO_2>Hb$ is satisfied and that difference between an obtained image signal and a luminance signal is R−Y. At 805 nm and 880 nm, since relation of $HbO_2-Hb$ is satisfied, an obtained image signal is converted to a white image signal. As described above, a significant pseudo color image can be obtained.

Since the configuration and the operation are otherwise the same as those of the image pick-up device according to Embodiment 10, detailed description will not be repeated here.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 image pick-up device; 2, 105 lens; 3 photoelectric conversion device; 4 image signal processing portion; 5 image display device; 10, 26, 60, 61, 71 pixel array; 11 load circuit; 13, 27 vertical scanning portion; 14 control unit; 15 horizontal scanning portion; 16 selector; 17 output portion; 21 semiconductor substrate; 22, 51 read circuit layer; 23, 53 CIGS thin film; 24, 54 CdS layer; 25, 55 transparent electrode; 30 to 38 N-channel MOS transistor; 30a n-type impurity diffusion region; 30g to 38g gate; 39 photodiode; 40, 41 capacitor; 49 photodiode; 50 p-type silicon substrate; 50a n-type impurity diffusion region; 52, 80, 82 pixel electrode; 72 effective image pick-up portion; 73 optically black portion; 74, 76 pixel region; 75 isolation region; 81 isolation electrode; 83 light cut-off layer; 84 insulating film; 85 differential amplifier; 86 output circuit; 87 differential amplifier; 90 isolation electrode; 91 auxiliary electrode; 100 image pick-up device; 101 photoelectric conversion portion; 102 image signal processing portion; 103 display portion; 104 control unit; 111 to 114 storage portion; CBM, CTM planar electrode; CF color filter; CFU color filter portion; CH contact hole; CL control signal line; EL pixel electrode; G read circuit; LN line; M, TR transistor; P pixel; PD photodiode; Q amplifier; SL signal line; SW switch; X light emitting element; and α light.

The invention claimed is:

1. An image pick-up device, comprising:
a white light emitting element for emitting white light to a subject;
a color filter portion including color filters, for receiving light from said subject;
a photoelectric conversion film formed from a compound semiconductor, for converting light which has passed through said color filter portion to charges;
a plurality of electrodes provided in correspondence with said color filters on a surface of said photoelectric conversion film opposite to said color filter portion, for receiving charges converted by said photoelectric conversion film;
a plurality of read circuits provided in correspondence with said electrodes, for outputting read signals based on charges received by corresponding electrodes; and
an image signal processing portion for generating a color image signal based on said read signals output from said plurality of read circuits when said white light emitting element emits light to said subject and generating a monochrome image signal based on said read signals output from said plurality of read circuits at least when said white light emitting element does not emit light to said subject,
said image signal processing portion selecting a color which can be displayed in a color image, converting said monochrome image signal to a pseudo color image signal showing an image of selected said color and black, and generating a synthesized image signal showing one image based on said color image signal and said pseudo color image signal.

2. The image pick-up device according to claim 1, further comprising a near-infrared light emitting element for emitting light having a wavelength in a near-infrared region to said subject, wherein
said image signal processing portion generates the color image signal based on said read signals output from said plurality of read circuits when said white light emitting element emits light to said subject and generates the monochrome image signal based on said read signals output from said plurality of read circuits when said white light emitting element does not emit light to said subject and when said near-infrared light emitting element emits light to said subject.

3. The image pick-up device according to claim 2, comprising a plurality of near-infrared light emitting elements for emitting light different in wavelength in the near-infrared region to said subject, wherein
said image signal processing portion generates a plurality of monochrome image signals based on said read signals output from said plurality of read circuits when each said near-infrared light emitting element emits light to said subject, and said image signal processing portion selects the color which can be displayed in the color image for each said monochrome image signal, converts each said monochrome image signal to a plurality of pseudo color image signals showing an image of corresponding selected said color and black, and generates an image signal showing one image based on said color image signal and said plurality of pseudo color image signals.

4. The image pick-up device according to claim 3, wherein said image signal processing portion converts each said monochrome image signal to the plurality of pseudo color image signals showing an image of transmitted colors of said color filters and black.

5. The image pick-up device according to claim 1, wherein said image signal processing portion generates the synthesized image signal showing an image having as said selected color, a portion in an image shown by said color image signal corresponding to a portion of said selected color in an image shown by said pseudo color image signal.

6. The image pick-up device according to claim 1, wherein the color selected by said image signal processing portion can be changed.

7. The image pick-up device according to claim 1, wherein said image signal processing portion converts said monochrome image signal to the pseudo color image signal showing an image of a transmitted color of said color filter and black.

8. The image pick-up device according to claim 1, wherein said image signal processing portion searches for a color that can be displayed in the color image and not present in the image shown by said color image signal and converts said monochrome image signal to the pseudo color image signal showing an image of the searched for and found color and black.

9. The image pick-up device according to claim 1, wherein said photoelectric conversion film is composed of $Cu(In_x, Ga_{(1-x)})Se_2 (0 \leq x \leq 1)$.

10. The image pick-up device according to claim 9, further comprising a transparent electrode provided on the surface of said photoelectric conversion film opposite to said plurality of electrodes.

11. The image pick-up device according to claim 10, wherein said transparent electrode contains ZnO.

12. The image pick-up device according to claim 9, wherein said plurality of electrodes contain Mo.

13. An image pick-up device, comprising:
a white light emitting element for emitting white light to a subject;
a first near-infrared light emitting element for emitting light having a first wavelength in a near-infrared region to said subject;
a second near-infrared light emitting element for emitting light having a second wavelength in the near-infrared region to said subject;
a color filter portion including color filters, for receiving light from said subject;
a photoelectric conversion film formed from a compound semiconductor, for converting light which has passed through said color filter portion to charges;
a plurality of electrodes provided in correspondence with said color filters on a surface of said photoelectric conversion film opposite to said color filter portion, for receiving charges converted by said photoelectric conversion film;
a plurality of read circuits provided in correspondence with said electrodes, for outputting read signals based on charges received by corresponding electrodes; and
an image signal processing portion for generating a luminance signal based on said read signals output from said plurality of read circuits when said white light emitting element emits light to said subject, generating a first monochrome image signal based on said read signals output from said plurality of read circuits when said first near-infrared light emitting element emits light to said subject, and generating a second monochrome image signal based on said read signals output from said plurality of read circuits when said second near-infrared light emitting element emits light to said subject, said image signal processing portion generating as a synthesized image signal showing one image, a signal indicating difference between said first monochrome image signal and said luminance signal, a signal indicating difference between said second monochrome image signal and said luminance signal, and said luminance signal.

14. The image pick-up device according to claim 13, wherein said image signal processing portion generates as said synthesized image signal, a signal indicating difference between an inverted signal of said first monochrome image signal and said luminance signal, a signal indicating difference between an inverted signal of said second monochrome image signal and said luminance signal, and said luminance signal.

15. The image pick-up device according to claim 13, wherein said photoelectric conversion film is composed of $Cu(In_x, Ga_{(1-x)})Se_2 (0 \leq x \leq 1)$.

16. The image pick-up device according to claim 15, further comprising a transparent electrode provided on the surface of said photoelectric conversion film opposite to said plurality of electrodes.

17. The image pick-up device according to claim 16, wherein said transparent electrode contains ZnO.

18. The image pick-up device according to claim 15, wherein said plurality of electrodes contain Mo.

* * * * *